United States Patent [19]
Jacobsmeyer

[11] Patent Number: 5,541,955
[45] Date of Patent: Jul. 30, 1996

[54] ADAPTIVE DATA RATE MODEM

[75] Inventor: Jay M. Jacobsmeyer, Colorado Springs, Colo.

[73] Assignee: Pericle Communications Company, Colorado Springs, Colo.

[21] Appl. No.: 430,268

[22] Filed: Apr. 28, 1995

Related U.S. Application Data

[63] Continuation of Ser. No. 973,816, Nov. 6, 1992, abandoned.
[51] Int. Cl.$^6$ ................................................. H04B 1/38
[52] U.S. Cl. ........................ 375/222; 375/265; 375/376; 375/377
[58] Field of Search ................................ 375/222, 219, 375/221, 261, 262, 265, 340, 341, 371–376, 377; 371/43

[56] References Cited

U.S. PATENT DOCUMENTS

| | | | |
|---|---|---|---|
| 4,277,845 | 7/1981 | Smith et al. ............................. | 455/52 |
| 4,545,054 | 10/1985 | Davis ...................................... | 371/43 |
| 4,630,314 | 12/1986 | Smith et al. ............................. | 455/52 |
| 4,641,327 | 2/1987 | Wei ........................................ | 375/114 |
| 4,660,214 | 4/1987 | Pahlavan et al. ....................... | 375/39 |
| 4,685,149 | 8/1987 | Smith et al. ............................. | 455/56 |
| 4,716,575 | 12/1987 | Douros et al. .......................... | 375/118 |
| 4,748,626 | 5/1988 | Wong ..................................... | 371/30 |
| 4,862,464 | 8/1989 | Betts et al. .............................. | 371/43 |
| 4,868,830 | 9/1989 | Pollara-Bozzola ..................... | 371/43 |
| 4,873,701 | 10/1989 | Tretter .................................... | 375/27 |
| 4,884,272 | 11/1989 | McConnell ............................. | 371/43 |
| 4,890,316 | 12/1989 | Walsh et al. ............................ | 375/8 |
| 4,891,788 | 1/1990 | Kreifels .................................. | 375/118 |
| 4,932,029 | 6/1990 | Heichler ................................. | 371/43 |
| 4,945,548 | 7/1990 | Iannarone et al. ..................... | 375/118 |
| 4,945,549 | 7/1990 | Simon et al. ........................... | 375/53 |
| 4,985,707 | 1/1991 | Schmidt et al. ........................ | 342/370 |
| 4,991,184 | 2/1991 | Hashimoto ............................. | 375/8 |

OTHER PUBLICATIONS

J. M. Jacobsmeyer, "Adaptive Trellis Coded Modulation for Bandlimited Meteor Burst Channels", IEEE Journal on Selected Areas in Communications, vol. 10, No. 3, pp. 550–561, Apr. 1992.

J. M. Jacobsmeyer, "Adaptive Trellis Coded Modulation for Bandlimited Meteor Burst Channels", 1989 IEEE Military Communications Conference (MILCOM '89), vol. 2, pp. 418–422 (Cat. No. 89CH2681-5).

J. H. Jacobsmeyer, "Adaptive Information Rate Performance on Bandlimited Meteor Burst Channels: Empirical Results", IEEE Ninth Annual International Phoenix Conference ... (Cat. No. 90CH2799-5), pp. 254–261.

(List continued on next page.)

*Primary Examiner*—Stephen Chin
*Assistant Examiner*—Hai H. Phan
*Attorney, Agent, or Firm*—Fish & Richardson P.C.

[57] ABSTRACT

An adaptive data rate modulator/demodulator (modem) (102), particularly useful for transmitting data over fading communications channels, uses an adaptive data rate technique which supports multiple data rates in the same device. The modem incorporates an adaptive data rate encoder (104) and an adaptive data rate decoder (105) using adaptive, parallel-branch decoding to translate received symbols into corresponding data bits. Significantly, the soft decision metrics of the decoder are also used to provide an estimate W of the signal-to-noise ratio. An optional predictor (232) receives W from the adaptive data rate decoder (105) and predicts the future signal-to-noise ratio to determine the desired data rate for the modem. The data rate is changed automatically and dynamically without interrupting the decoding process. A constant channel symbol rate and a single signal set simplify signal acquisition and synchronization. Incoming and outgoing data are buffered, and the transmission rate is changed dynamically by a memory controller (109) to avert buffer overflows and underflows. An optional adaptive phase-lock loop system (116) maintains synchronization of the decoder at all data rates.

46 Claims, 35 Drawing Sheets

OTHER PUBLICATIONS

J. M. Jacobsmeyer, "Adaptive Data Rate Communications for High Frequency Radio Channels", (MILCOM '91) (Cat No. CH22981–9/91), pp. 938–942, Nov. 7, 1991 in McLean, Virginia.

Abel, "Meteor Burst Communications, Bits Per Burst Performance Bounds", IEEE Transactions on Communications vol. COM–34, pp. 927–936, Sep. 1986.

Pursley et al., "Variable–Rate Coding for Meteor–Burst Communications", IEEE Transactions on Communications, vol. COM–37, No. 11, pp. 1105–1112, Nov. 1989.

Weitzen et al., "An Estimate of the Capacity of the Meteor–Burst Channel", IEEE Transactions on Communications, vol. COM–32, No. 8, pp. 972–974, Aug. 1984.

Davidovici et al., "Performance of a Meteor–Burst Communication System Using Packet Messages and Variable Data Rates", IEEE Transactions on Communications, vol. COM–37, No. 1, pp. 6–17, Jan. 1989.

J. K. Cavers, "Variable–rate transmission for Raleigh fading channels", IEEE Transactions on Communications, vol. COM–20, No. 1, pp. 15–20, Feb. 1972.

Smith et al., "Maximizing Throughput Under Changing Channel Conditions", Signal, vol. 43, No. 10, Jun. 1989.

B. Sklar, *Digital Communications Fundamentals and Applications,* Prentice–Hall, Englewood Cliffs, NJ, 1988.

G. D. Forneya, Jr. "The Viterbi Algorithm", Proceedings of the IEEE, vol. 61, pp. 268–278, Mar. 1973.

S. Lin et al., *Error Control Coding: Fundamentals and Applications,* Prentice–Hall, Englewood Cliffs, NJ 1983, pp. 315–322.

R. E. Blahut, *Theory and Practice of Error Control Codes,* Addison–Wesley, Reading, Massachusetts, 1983; pp. 377–382.

A. Viterbi and A. M. Viterbi, "Nonlinear Estimation of PSK Modulated Carrier Phase with Application to Burst Digital Transmission", IEEE Trans. on Information Theory, vol. IT–32, pp. 543–551, Jul. 1983.

Fitz, "Equivocation in Nonlinear Digital Carrier Synchronizers", IEEE Trans. on Communications, vol. 39, pp. 1672–1682, Nov. 1991.

"Q1875 Pragmatic Trellis Decoder Technical Data Sheet", May 1992, available from Qualcomm Inc., 10555 Sorrento Valley Road, San Diego, CA 92121–1617.

Campbell et al., "Bandwidth Considerations in a Janet System", Proceedings of the Inst. of Radio Engineers, vol. 45, pp. 1658–1660, Dec. 1957.

G. Ungerboeck, "Channel Coding with Multilevel/Phase Signals", IEEE Transactions on Information Theory, vol. IT–28, pp. 55–67, Jan. 1982.

CCITT Blue Book, Data Communications over the Telephone Channel, Melbourne, 14–15 Nov. 1988; pp. 215–228.

G. McClellan, "Frequency Multiplier for Your Counter", Radio Electronics, Nov. 1982; pp. 43–46.

R. Embree et al., *C. Language Algorithms for Digital Signal Processing,* Englewood Cliffs, NJ, Prentice Hall, 1991, pp. 342–344.

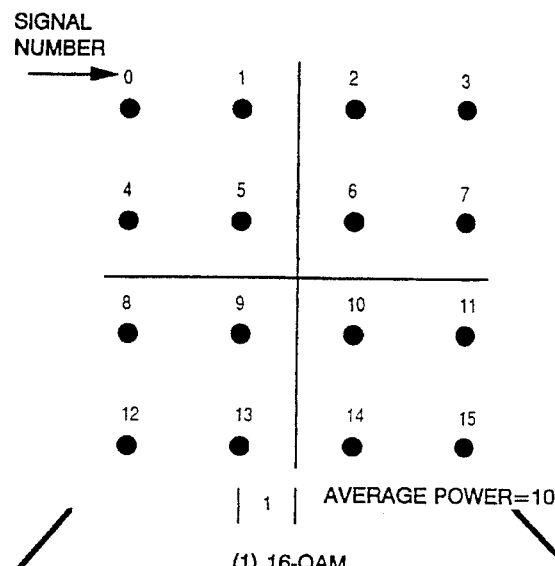
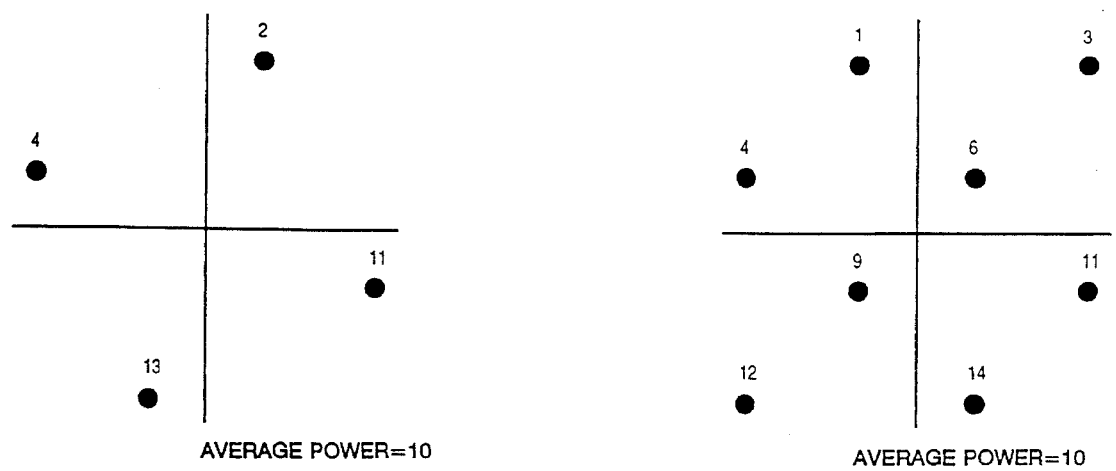
FIG. 10b

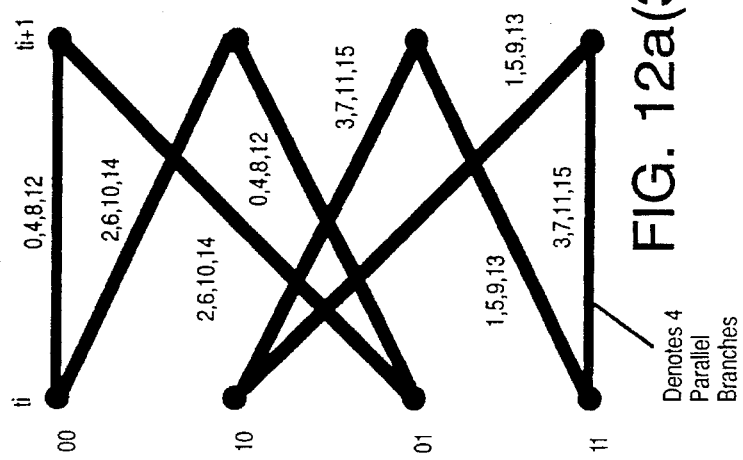
FIG. 12a(3)
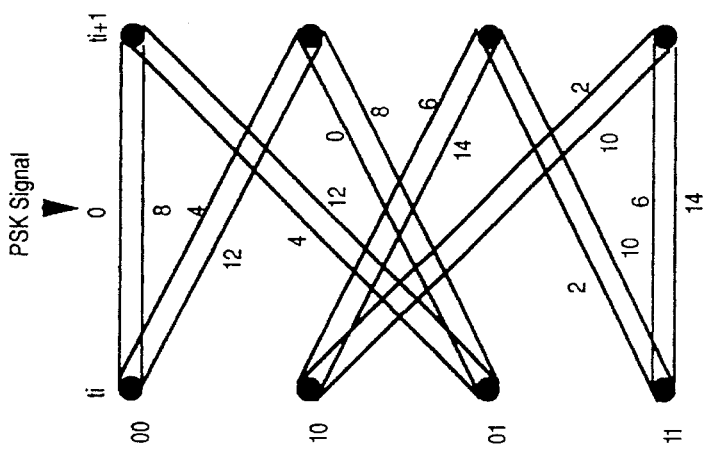
FIG. 12a(2)
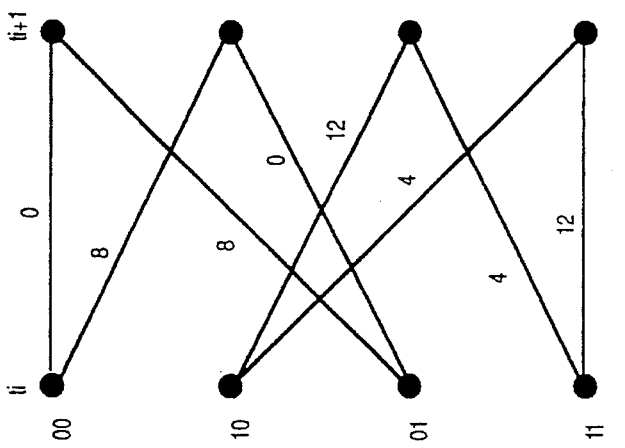
FIG. 12a(1)

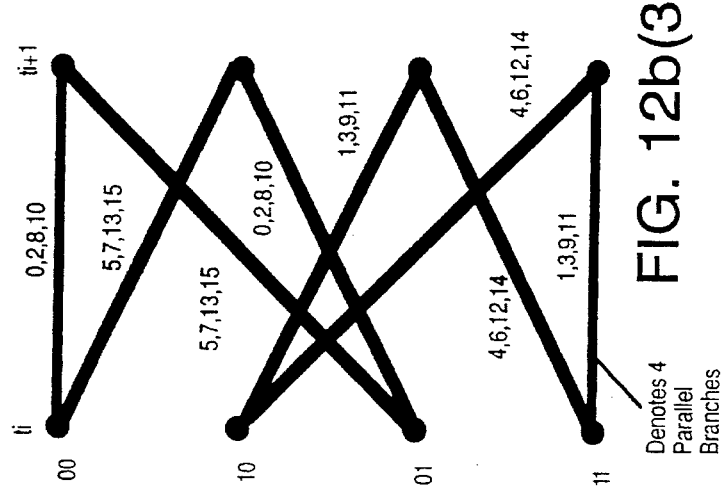
FIG. 12b(3)
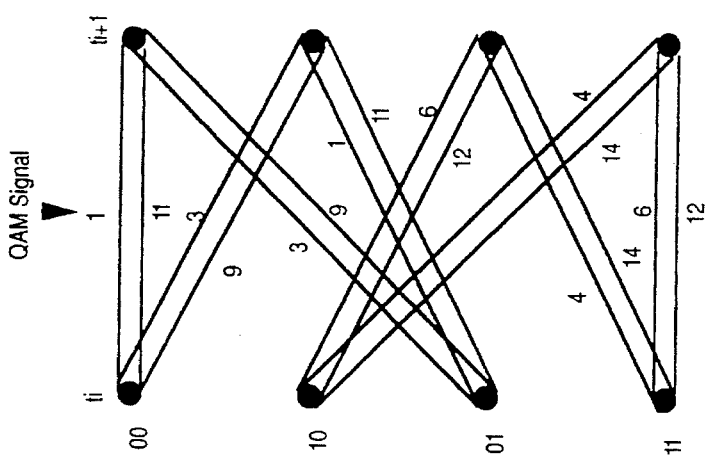
FIG. 12b(2)
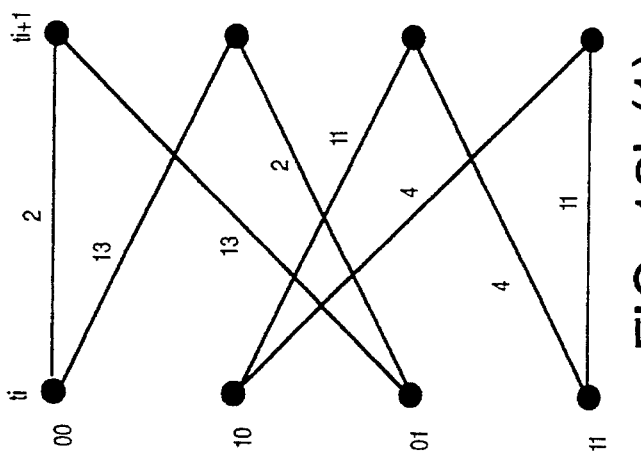
FIG. 12b(1)

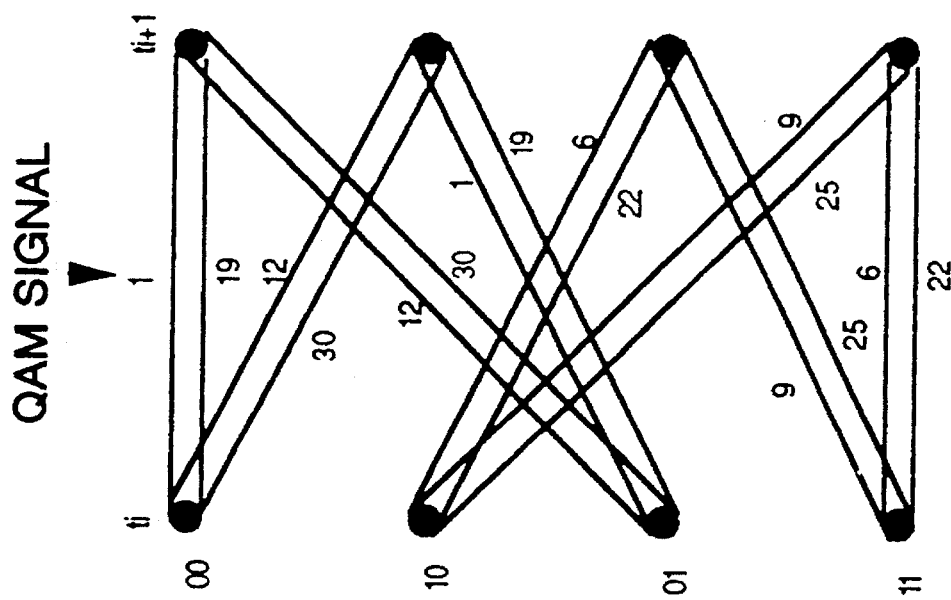
FIG. 12c(2)
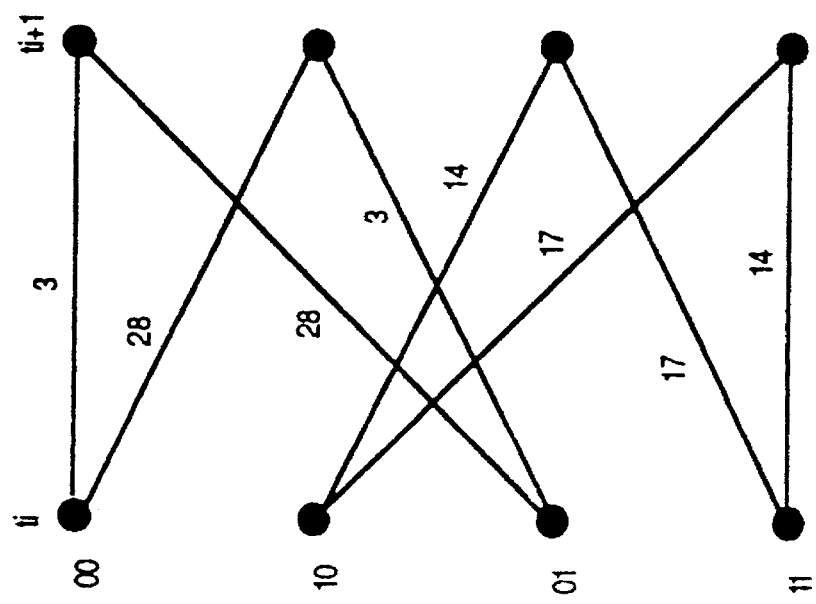
FIG. 12c(1)

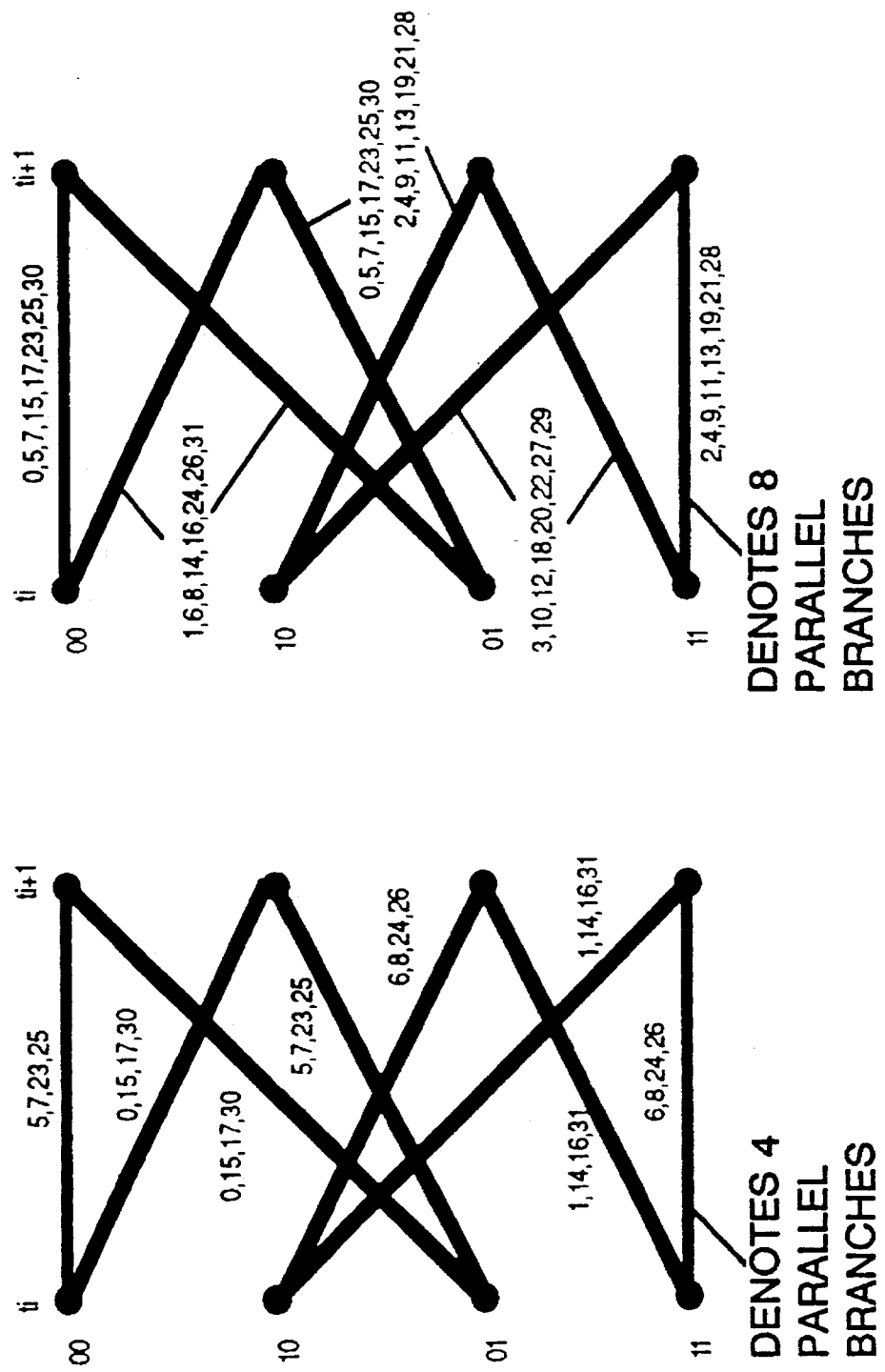
FIG. 12c(4)
FIG. 12c(3)

ADAPTIVE DATA RATE MODEM

This is a continuation of application Ser. No. 07/973,816, filed Nov. 6, 1992, now abandoned.

A portion of the disclosure of this patent document contains material which is subject to copyright protection. The copyright owner has no objection to the facsimile reproduction by anyone of the patent document or patent disclosure, as it appears in the Patent and Trademark Office file or records, but otherwise reserves all copyright rights whatsoever.

BACKGROUND

1. Field of the Invention

This invention relates to data modulators/demodulators (modems) and in particular to an improved data modem for use on communication channels.

2. Description of Prior Art

Time-varying or fading communications channels seriously hamper high speed digital communications. Examples of fading communications channels are high frequency (HF) ionospheric scatter, meteor-burst, two-way radio, cellular radio, microwave radio, mobile satellite, and underwater acoustic channels. The fading channel requires many orders of magnitude greater average receive power to achieve the same performance as the equivalent non-fading channel. Consequently, the common practice on fading channels is to operate with a large power margin or fade margin to ensure reliable communications. On microwave radio channels, it is common to design a 40 decibel (dB) (factor of 10,000) fade margin on each link. If additional power is not available, prior art systems must operate at extremely low data rates to ensure reliable communications.

Prior Art Techniques to Mitigate Fading Effects

Several general techniques have been employed in an effort to decrease the required fade margin, or equivalently, increase the effective data rate or throughput of the fading communications channel. Four noteworthy techniques are diversity, automatic repeat-request (ARQ), spread spectrum modulation, and forward error correction with interleaving.

Diversity. Diversity schemes operate on the principle that receive channels separated by space, frequency, polarization, or arrival angle exhibit independent fading statistics and thus can be combined to improve system performance.

A space diversity system samples the two or more independent paths and either selects the best quality signal, or combines the multiple signals to improve the overall channel performance. The chief disadvantages of space diversity are that multiple antennas and receivers are required and a large amount of space is needed to separate the antennas adequately. To equal non-fading performance, the number of diversity channels is impractical.

One can also realize some improvement through the use of frequency diversity. The chief disadvantage of frequency diversity is the need for multiple frequencies. Radio spectrum is a scarce resource and the number of separate channels required to equal non-fading performance is prohibitive.

Polarization and angle diversity are similar to space and frequency diversity, but with these techniques, one must use a number of polarizations or a number of arrival angles to get nearly independent fading statistics. There are only a small number of practical polarization options, thus limiting the effectiveness of this technique. And the main drawback of angle diversity is the need for directional antennas to isolate the separate arrivals. Directional antennas are not practical on small platforms such as a hand-held cellular radios.

Automatic Repeat Request (ARQ). ARQ is an error control technique that employs an error detection code and a feedback channel. At the receiver, each block of data is decoded using the error detection code. If the error detection code detects one or more errors in a block, the receiver sends a request on the feedback channel to re-transmit that particular block. ARQ schemes ensure that all data is eventually received error-free. But on a poor quality channel, a block of data may be re-transmitted many times, degrading throughput. For example, if errors occur randomly with a probability of bit error of 0.01 and the block size is 256 bits, the normalized throughput is $(1-0.01)^{256}$ or 0.08. In other words, if the ARQ system operates at a constant data rate of 2,400 bits per second (bps), the actual throughput is only (0.08) 2,400 or 192 bps.

Spread Spectrum Modulation. In a spread spectrum system, the transmitted signal is spread over a wide frequency band, much wider than the minimum bandwidth required to transmit the information being sent. Because the signal's energy is spread over a large bandwidth, the spread spectrum signal is highly resistant to narrowband jamming and interference. If the signal is spread wide enough on a fading channel, only a fraction of the occupied band will be affected by the fade. The spread spectrum receiver sees this fade as a narrowband jammer and can often recover the signal with little degradation. Despite this advantage, spread spectrum still has three main drawbacks. First, by its very nature, a spread spectrum system requires a very large allocated bandwidth. If the bandwidth is too narrow, the entire band will fade at once and the spread spectrum system will offer no improvement. At cellular radio frequencies, almost 100 MHz is needed to mitigate the effects of fading. Second, the spread spectrum system must operate at very high chip rates that severely challenge the capabilities of solid state devices. And third, the spread spectrum system requires a sophisticated synchronization scheme at the receiver to recover and "de-spread" the signal.

Forward Error Correction With Interleaving. During deep fades, the low instantaneous signal-to-noise ratios cause a much higher probability of bit error. Consequently, bit errors are clustered in groups (or "bursts") coinciding with the presence of a fade. Most forward error correction decoders, such as the Viterbi decoder, do not handle burst errors well. The Viterbi decoder cannot correct multiple errors if they occur close together in time and consequently errors propagate through the decoder. However, if the bit sequence is interleaved at the transmitter and deinterleaved at the receiver before decoding, burst errors are spread out in time such that the Viterbi decoder can correct them. The principal drawback of interleaving is the delay involved with the interleaver at the transmitter. If the interleaver comprises L rows and K columns then L×K bits must be stored in memory before the first bit can be transmitted over the channel. For example, if the interleaver comprises 100 rows of 256 bits each, and the data source is operating at 2,400 bps, the system will incur a 10.7 second delay at the start of each transmission. Interleavers must be designed for worst case conditions, so the user experiences worst case delays even when the channel happens to be non-fading. Interleaver delay is especially troublesome on packet switched networks where the delay can cause extreme congestion at the network nodes.

These four techniques and others have failed to solve the problem of achieving greater throughput on the fading communications channel. The present invention uses a new technique that adapts the system data rate to the time-varying signal-to-noise ratio at the communications receiver. By varying the data rate in this way, it is possible in theory to achieve average data rates approaching the theoretical capacity of the channel. (See J. M. Jacobsmeyer, "Adaptive data rate techniques for high frequency radio channels," IEEE Military Communications Conference, McLean, Va., November 1991.)

The prior art shows that the general technique of adapting the data rate to the channel conditions has been analyzed for use on the multipath fading channel and has actually been implemented on the meteor burst channel. Unfortunately, the prior art meteor-burst adaptive data rate system failed to solve the problem completely.

Prior Art Relating to Adaptive Data Rate Techniques on the Multipath Fading Channel A multipath channel exists whenever there is more than one path for the transmitted energy to travel between transmitter and receiver. For example, a cellular radio link may have a direct path between the cell site and the mobile user plus a reflected path from the ground. In general, the reflected path will arrive at the receiver out-of-phase with the direct path and the amplitude of the received signal will be attenuated by the multipath effect. As the mobile user travels, the phase difference will change, resulting in a time-varying amplitude at the receiver. Other examples of multipath fading channels are high frequency (HF) ionospheric scatter, tropospheric scatter, two-way radio, microwave radio, and undersea acoustic communications.

The most widely accepted mathematical models for multipath fading channels are the Rician channel (when the line-of-sight path is strong compared to the reflected paths), and the Rayleigh channel (when the line-of-sight path is weak or non-existent). The use of adaptive data rate techniques on Rayleigh fading channels was first investigated by Bello and Cowan in 1962 (P. A. Bello and W. M. Cowan, "Theoretical study of on/off transmission over Gaussian multiplicative circuits," *Proceedings of the IRE National Communications Symposium*, Utica, N.Y., Oct. 1962, incorporated herein by reference). They showed that theoretically, a system with two data rates (on/off) resulted in only 4.34 dB loss over the equivalent non-fading channel.

In 1972, Cavers (J. K. Cavers, "Variable-rate transmission for Rayleigh fading channels," *IEEE Transactions on Communications*, vol. COM-20, no. 1, pp. 15–22, Feb. 1972) investigated the problem further and discovered that in theory, all of the performance lost due to Rayleigh fading could be recovered by perfectly adapting the data rate to the received signal-to-noise ratio. Cavers also pointed out that HF and troposcatter channels faded slowly enough that tracking appeared to be feasible, but Cavers did not disclose a method for achieving this tracking.

An adaptive data rate technique such as that investigated by Cavers suffers from several drawbacks and consequently, the technique was never reduced to practice. First, Cavers investigated a binary frequency shift keyed (FSK) system that required bandwidth expansion to work effectively. Most fading communications channels are bandlimited and bandwidth expansion is not possible. Second, there was no technique disclosed for rapid and accurate estimation of the received signal-to-noise ratio. And third, Cavers' system did not employ forward error correction to ensure reliable communications.

Prior Art Relating to Adaptive Data Rate Techniques on the Meteor-burst Channel A second type of channel where adaptive data rate techniques offer substantial performance gains is the meteor-burst channel. A meteor-burst communications system reflects radio waves from the ionized trails left by meteors entering the Earth's atmosphere. Because of the transitory nature of these trails, communications must be accomplished in short bursts, hence the name. Meteor burst communications systems operate over path lengths from 400 to 2,000 kilometers and in the frequency band 40 to 100 MHz. Although billions of tiny meteors enter the Earth's atmosphere each day, only a small fraction have sufficient mass and proper entry geometry to be useful for point-to-point communications. The few trails that are useful for communications diffuse rapidly and typically last for less than one second. These short trail durations combined with trail arrival times on the order of ten seconds result in a channel characterized by long message wait times and low throughput.

The signal level received from a meteor trail usually starts at a relatively high level and then decays exponentially until the the signal is so weak that it is no longer useful. One way to increase throughput and shorten wait time is to adapt the data rate to the exponentially decaying signal-to-noise ratio at the communications receiver. The use of adaptive data rate techniques for meteor burst communications was first proposed by Campbell and Hines in "Bandwidth Considerations in a JANET System", *Proceedings of the Institute of Radio Engineers*, vol. 45 pp. 1658–1660, Dec. 1957. However, a practical system for doing so was not known at the time.

The only operable adaptive data rate system known to the inventor is the "Dynarate" system manufactured by Meteor Communications Corporation and described in Smith and Donich, "Maximizing Throughput Under Changing Channel Conditions," *Signal*, Vol. 43 No. 10, June 1989. The "Dynarate" system employs binary phase shift keyed (BPSK) signaling and varies the data rate by adapting the channel symbol rate to the channel conditions. The system uses six discrete data rates: 2 kbps, 4 kbps, 8 kbps, 16 kbps, 32 kbps, and 64 kbps. This system suffers from several drawbacks. First, using conventional pulse shapes (cosine roll-off with excess bandwidth factor of 0.5), the 16, 32 and 64 kbps rates will not meet FCC or NTIA bandwidth requirements for a standard 20 kHz wide channel. Second, symbol synchronization and filtering are more difficult when the symbol rate changes during the trail. Third, error-control coding must be added on as a separate component, rather than being fully integrated with the rate changing hardware and software. Fourth, because six rates are needed, much of the useful trail time is consumed by rate changing overhead bits. These overhead bits waste valuable trail time that could be better used for passing information bits. And finally, an entire processor must be devoted to the task of measuring signal-to-noise ratios.

Other Prior Art

Wireline telephone modems such as the CCITT V.29 and V.33 (CCITT Blue Book, *Data Communications over the Telephone Channel*, Melbourne, 14–25 Nov. 1988, incorporated herein by reference) employ circuits that allow the modem to fall back to a lower rate if the channel cannot support the highest data rate, but these circuits do not change data rate dynamically. Furthermore, when the rate is changed, a long training sequence (~10 seconds) is sent and an entirely different signal constellation is used. These modems change data rates too slowly to adapt to a rapidly fading channel.

Others have attempted to develop systems with various aspects contributing to high data throughput. U.S. Pat. No. 4,991,184 to Hashimoto (1991) discloses a data communications system with a variable speed setting determined from transmission quality factors, including signal to noise ratio, but Hashimoto does not disclose a technique for changing the data rate of the system dynamically and automatically.

None of these prior art systems operates entirely satisfactorily to maximize data throughput while minimizing complexity of circuits and minimize processing burden. Specifically, the prior art failed to solve the problem in these areas:

Prior art systems do not achieve high throughput.

Prior art systems do not approach the theoretical maximum throughput.

These systems are not optimized for the bandlimited fading communications channel.

Prior art systems use a large number of discrete data rates and only achieve meager performance gains.

These systems require complex hardware and extensive processing to control errors, vary the data rate and estimate the signal quality.

Pauses are required between data rates to re-synchronize.

The estimator and rate changer respond only to changes in average signal-to-noise ratio, thereby leaving the system vulnerable to spike noise, jitter, intersymbol interference, and other impairments.

Error control decoding, rate changing, and estimation are not integrated in one device.

Symbol rates do not remain constant, thereby complicating the synchronization problem.

Discrete data rates jump only by a factor of 2, so the modem cannot respond to small changes in channel quality.

Signal-to-noise ratio estimates are not predicted, thereby limiting the capability to respond to rapid fading.

Prior art systems do not employ efficient memory controllers to manage memory use and adjust data rate to prevent memory overflows and underflows.

And because prior art systems do not employ bandwidth efficient signal constellations and computationaly efficient Viterbi-type decoders, these systems also failed in these areas:

Prior art systems do not use a Viterbi-type decoder to estimate signal quality.

Prior art systems do not use an estimator that automatically recovers from loss of rate synchronization.

Prior art systems do not use a single convolutional encoder and decoder for all data rates.

Prior art systems do not use a single signal set for all data rates.

Prior art systems do not employ subsets of the highest order signal set that have substantially the same average power.

Prior art systems do not employ a multiple rate encoder/decoder where the trellis path memory requirements are constant, regardless of data rate.

Prior art systems do not employ an adaptive phase-locked loop that automatically adjusts loop parameters as a function of data rate without interrupting the demodulation and decoding process.

Thus, there is still a need for an improved system for modulating and demodulating data signals on time-varying communications channels that will maximize throughput while minimizing circuit complexity and processing.

OBJECTS AND ADVANTAGES

A general object of the present invention is to provide a novel adaptive data rate communications system for use with fading communications channels which has throughput performance greater than prior art systems.

Another general object of the present invention is to increase average data rate, or throughput, of a communications channel so that it approaches the theoretically possible average.

Another object of the present invention is to provide a modem which is optimized for a bandlimited channel.

Yet another object of the invention is to provide a modem that achieves high performance while using relatively few adaptive data rates.

A further object of the invention is to provide error-control coding, data rate changing and signal quality estimation in a device that minimizes circuit complexity and processing requirements.

A further important object of the present invention is to provide a novel and improved adaptive data rate modem which changes data rates automatically and dynamically without interrupting the decoding process.

A further object of the present invention is to provide an estimator that responds to any impairment that may result in higher bit-error rates.

It is also an object of the present invention to provide a modem wherein adaptive data rate, error-control coding, and channel estimation are combined in a single device.

A further object of the present invention is to provide a modem with a constant channel symbol rate having throughput performance superior to systems that vary channel symbol rate.

Another object of the present invention is to provide an adaptive data rate modem having fine increments in data rate increase/decrease.

It is a further object of the present invention to provide an adaptive data rate transmission system which varies the data rate depending on future estimates of signal quality, found by prediction.

A further object of the present invention is to provide a memory control system for a variable data rate communications system that prevents overflows and underflows by dynamically adjusting the data rate.

Another important object of the present invention is to provide a soft decision metric Viterbi decoder which provides as an output an estimate of the current signal quality of the channel.

It is also an object of the present invention to provide an channel quality estimator that automatically recovers from loss of rate synchronization.

Another object of the present invention is to provide an adaptive data rate modem which uses a single convolutional encoder and decoder for all data rates.

It is also an object of the present invention to provide a novel and improved modem which uses a single signal set for all data rates.

Another object of the present invention is to employ subsets of the highest order signal set that have substantially the same average power as the highest order signal set.

A further object of the present invention is to provide a multiple data rate encoder wherein the trellis path memory requirements are constant, regardless of the data rate.

Yet another object of the present invention is to provide an adaptive phase locked loop that automatically adjusts loop parameters as a function of data rate without interrupting the demodulation and decoding process.

Further objects and advantages of the invention will become apparent from a consideration of the drawings and the ensuing description.

SUMMARY OF THE INVENTION

These objects and others are achieved in the present invention which provides a novel adaptive data rate modem particularly useful for transmitting data over fading communications channels.

The invention is a device for encoding, mapping and trellis decoding symbol sequences at variable data rates. It is designed to be used on a two-way communications system with a forward channel and a return channel. Information bits are transmitted at a variable data rate over the forward channel. Data rate information is computed at the receiver and is transmitted over the return channel for use by the forward channel transmitter.

The present invention employs an adaptive trellis coded modulation technique which supports multiple data rates in the same modem. The modem includes a soft decision, multi-rate Viterbi-type trellis decoder using adaptive, parallel-branch decoding to translate received symbols into corresponding data. The trellis decoder performs several functions simultaneously, including error-correction decoding, rate changing, and signal quality estimation. The soft decision metrics of the Viterbi decoder are also used to provide an estimate of the received signal quality.

The trellis decoder dynamically and without interruption searches a dynamically changing trellis and varies the data rate automatically by selecting a trellis path according to a predetermined decoder metric. A constant channel symbol rate and a single signal constellation simplify signal acquisition and synchronization.

An optional predictor receives past estimates of signal quality from the Viterbi decoder and predicts the future signal-to-noise ratio to determine the desired data rate for the modem. Incoming and outgoing data are buffered, and the transmission rate is changed dynamically when necessary to avert memory overflows and underflows. An optional adaptive phase-lock loop maintains synchronization of the demodulator at all operating data rates. A novel adaptive data transfer circuit is employed to transfer data bits between memory and an encoder at a variable rate. The present invention also includes a method for constructing M-ary signal structures with power and distance properties that facilitate efficient operation at variable data rates.

BRIEF DESCRIPTION OF THE DRAWINGS

FIG. 10b is an alternative constellation using 16-ary quadrature amplitude modulation (QAM);

FIG. 12a shows the three trellis diagrams for the exemplary constraint length 3 trellis code for M-ary PSK modulation, M-ary differential phase shift keyed (DPSK) modulation, or M-ary pulse position modulation (PPM);

FIG. 12b shows the three trellis diagrams for the exemplary constraint length 3 trellis code for 16-ary QAM modulation;

FIG. 12c shows the three trellis diagrams for the exemplary constraint length 3 trellis code for 32-ary QAM modulation;

DESCRIPTION OF A PREFERRED EMBODIMENT OF THE INVENTION (FIG. 1)

The invention relates to a modulator/demodulator (modem) designed to send and receive digitized information over a variety of communications channels. The invention is preferably implemented in a two-way communications system shown generally at FIG. 1.

Figure 1:
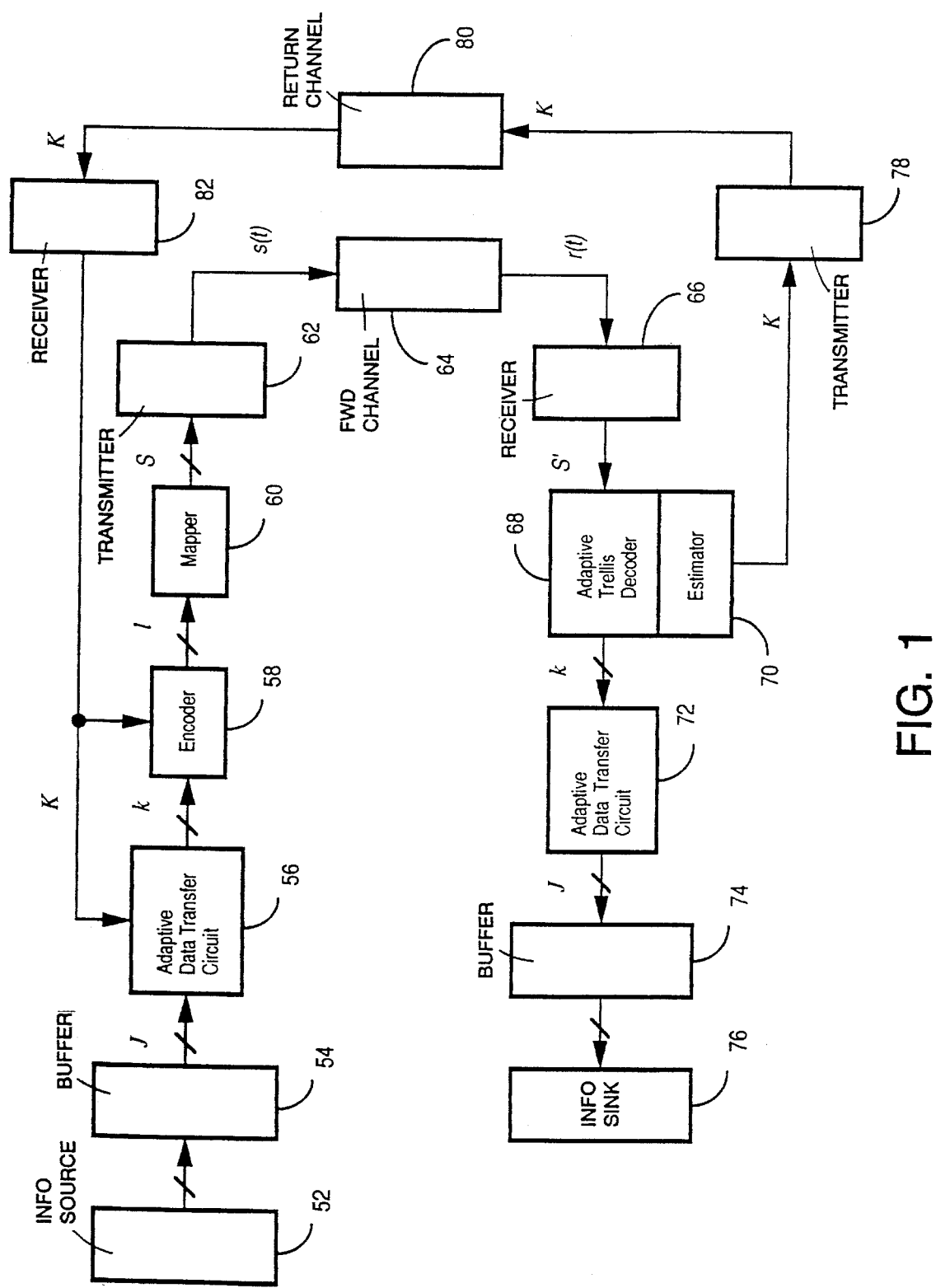
FIG. 1 is a system block diagram showing the main components of an adaptive data rate communications system according to a preferred embodiment of the invention.

Referring now to FIG. 1, an information source 52 is connected to a first buffer 54. First buffer 54 is connected to a first adaptive data transfer circuit 56 which is also connected to a return channel receiver 82 and an encoder 58. Encoder 58 is also connected to a mapper 60 and return channel receiver 82. Mapper 60 is also connected to a forward channel transmitter 62. Forward channel transmitter 62 is connected to a forward channel 64 which is, in turn, connected to a forward channel receiver 66. Forward channel receiver 66 is also connected to an adaptive trellis decoder 68 which includes a signal quality estimator 70. Estimator 70 is connected to a return channel transmitter 78. Adaptive trellis decoder 68 is connected to a second adaptive data transfer circuit 72. Second adaptive data transfer circuit 72 is also connected to a second buffer 74 which is in turn connected to an information sink 76. Return channel transmitter 78 is connected to a return channel 80 which is, in turn, connected to return channel receiver 82.

OPERATION OF THE INVENTION (FIGS. 1–26)

The present invention is an adaptive data rate modem particularly useful for transmitting and receiving data and digitized voice over time-varying communications channels. The modem employs a novel trellis decoding structure to automatically and dynamically adapt the data rate to the channel conditions.

Theory of Operation

The present invention is designed to improve throughput performance on time-varying channels and especially on multipath fading channels.

To maintain acceptable bit-error rates on multipath fading channels, prior art systems must operate with large fade margins or very low data rates. Large fade margins or low data rates are required because the probability of bit error on the fading channel is several orders of magnitude higher than on the non-fading channel even though the average signal energy is the same. For example, the probability of bit error for binary frequency shift-keyed (FSK) modulation on the non-fading Gaussian noise channel is $$P_b = \frac{1}{2} e^{-\frac{E_b/N_0}{2}} \qquad (\text{Eq. 1})$$

where $E_b/N_0$ is the ratio of energy per bit to noise power spectral density. But the probability of bit error for binary FSK on the Rayleigh fading channel is $$P_b = \frac{1}{2 + E_b/N_0} \qquad (\text{Eq. 2})$$

Equation 1 falls off much more rapidly than Equation 2. For example, at a bit-error rate of $P_b=10^{-5}$, the Rayleigh fading channel requires almost 37 dB (5,000 times) more power than the non-fading channel.

However, the average signal energy has not changed, so in theory one should be able to achieve non-fading performance on a fading channel. Unfortunately, no prior art communications device has matched non-fading performance on a fading channel without introducing long interleaver delay. The present invention represents a major breakthrough in fading channel radio technology because it is the first communications device to achieve performance nearly equal to theoretical capacity of the channel without interleaver delay.

The key to improving performance on fading channels is to overcome the error bursts that occur during deep fades. An interleaved error correction coding system overcomes error bursts by introducing a form of time diversity. Unfortunately, this time diversity introduces an undesirable delay at the start of each data transmission. The present invention takes a different approach. The invention avoids error bursts by adapting the data rate to the time-varying signal-to-noise ratio and halting transmission altogether if necessary. For example, on the Rayleigh fading channel, if the modem simply stops transmission during those fades that fall below the mean signal-to-noise ratio, the link will suffer only a small 4.3 dB loss (see Bello and Cowan, 1962). The infrequent pauses on an adaptive data rate system do introduce transmission delays but they are small compared to the delays on interleaved systems.

In practice, changing data rate dynamically is not an easy task. To work effectively, an adaptive data rate system must estimate the channel conditions in real time and adjust the data rate with a minimum of delay, overhead, and processing burden. The present invention solves these problems using several novel and unobvious techniques.

The present invention integrates error-correction coding, rate changing, and signal quality estimation in a single device. This device employs an improved method of trellis coding based on a technique called trellis coded modulation. Trellis coded modulation was first introduced by Ungerboeck in 1976. The technique combines error-control coding and modulation in a single modem and provides substantial coding gain over non-coded modulation. In the early 1980's the first trellis coded modulation schemes were fielded in high-speed wireline modems. Today, trellis coded modulation is used in virtually all wireline modems operating above 9600 bits per second.

Trellis coded modulation combines multilevel and/or multiphase signaling (such as M-ary PSK) with a finite state encoder to increase the Euclidean distance between signals without increasing average power. These codes are called trellis codes because they can be characterized by a trellis diagram. Controlled redundancy is achieved without bandwidth expansion by increasing the signaling alphabet. Typically, the signaling alphabet is increased from $2^k$ to $2^{k+1}$. For example, to encode 4-PSK to 8-PSK, the signaling alphabet increases from 4 to 8. Normally, an increase in the signaling alphabet requires a greater signal-to-noise ratio to maintain the same probability of bit error because the signal points are now spaced closer together. However, trellis coded modulation increases the distance between the signals that are most likely to be confused (e.g. adjacent signals) by separating them in the trellis structure. The result is that instead of requiring a greater signal-to-noise ratio, the trellis coded system actually decreases the required signal-to-noise ratio by 3 to 6 dB.

The present invention employs several novel techniques and elements for estimating channel signal quality and adapting the data rate automatically. These techniques and elements will be described in detail in the following sections.

Background information relating to the theoretical performance of the general adaptive data rate technique employed by the present invention is provided in the inventor's publications "Adaptive Trellis-Coded Modulation for Bandlimited Meteor Burst Channels," *IEEE Journal on Selected Areas in Communications*, vol. 10, pp. 550–561, April, 1992; "Adaptive Trellis-Coded Modulation for Bandlimited Meteor Burst Channels," 1989 IEEE Military Communications Conference (MILCOM '89), vol. 2, pp. 418–422 (Cat. No. 89CH2681-5); "Adaptive Information Rate Performance On Bandlimited Meteor Burst Channels: Empirical Results," IEEE Ninth Annual International Phoenix Conference on Computers and Communications (Cat. No. 90CH2799-5), pp. 254–261; and a paper entitled "Adaptive Data Rate Communications for High Frequency Radio Channels," presented at the 1991 IEEE Military Communications Conference (MILCOM '91) (Cat No. CH2981-9/91), pp. 938–942, Nov. 7, 1991. These four documents are incorporated herein by reference.

The Overall System

Figure 3:
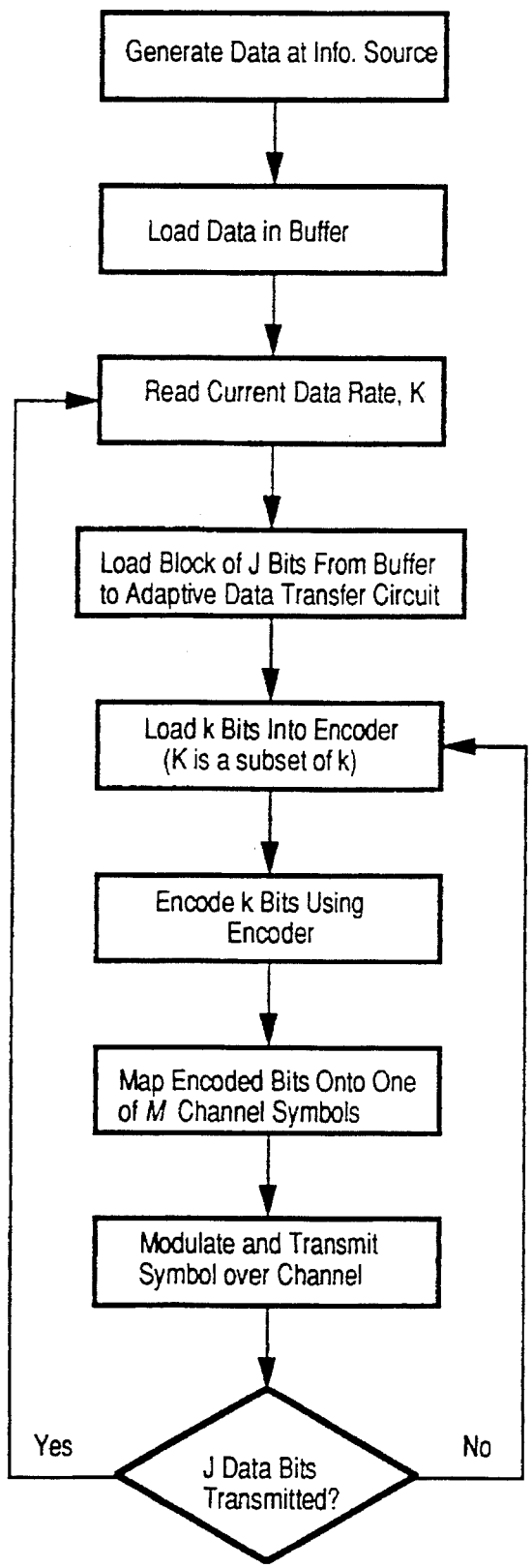
FIG. 3 is a flow chart showing the transmitting operations of a particular preferred embodiment of the present invention.
Figure 4:
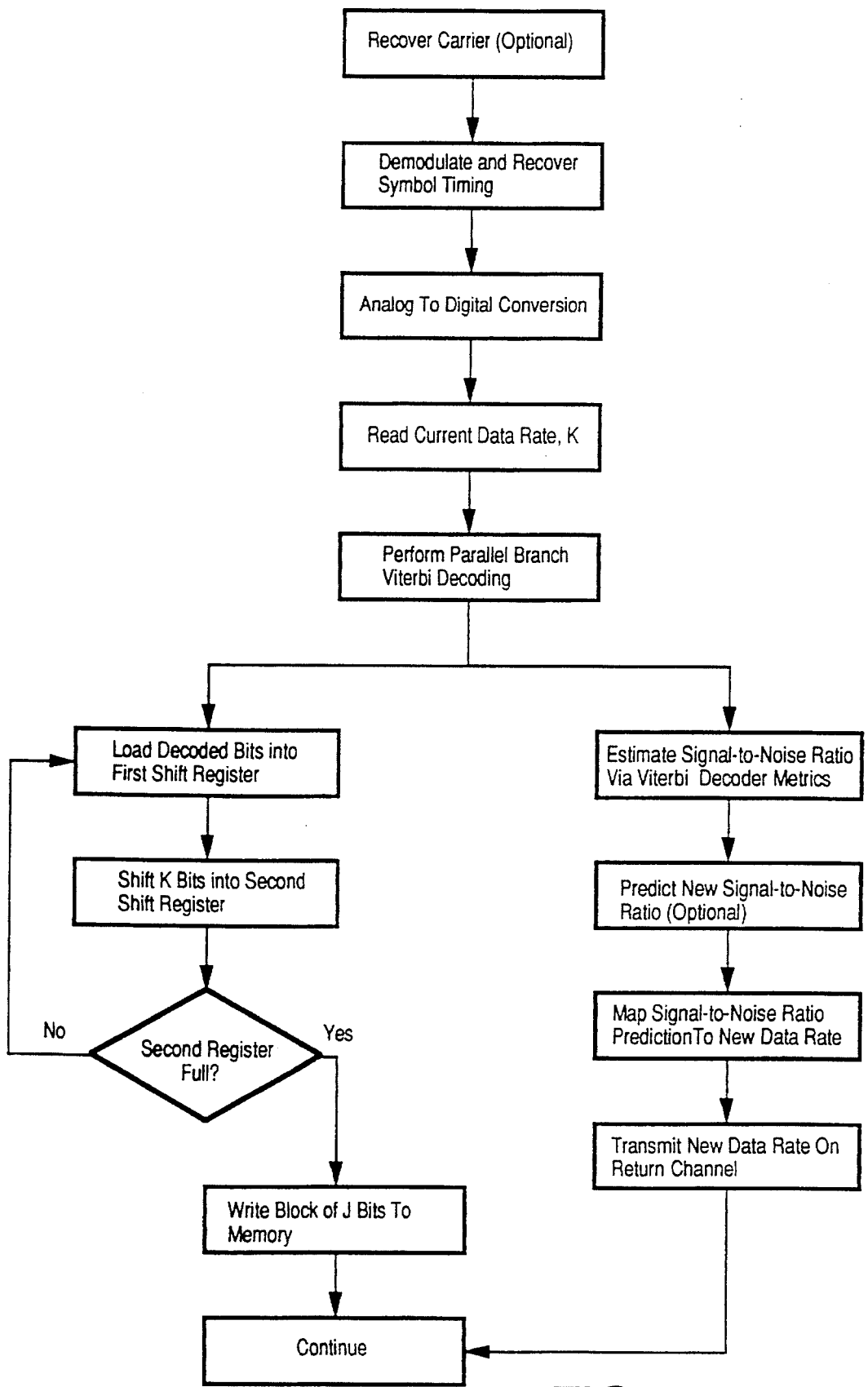
FIG. 4 is a flow chart showing the receiving operations of a particular preferred embodiment of the present invention.

The present invention is preferably implemented as part of a two-way communications system shown generally at FIG. 1. The two-way communications system dynamically and automatically adjusts the data rate as a function of the conditions on forward channel 64 by maintaining a constant symbol rate and varying the number of bits per channel symbol. Estimator 70 estimates the signal quality and selects a new data rate based on channel conditions. New data rate information, K, is transmitted on return channel 80 for use by encoder 58 to determine the next data rate. Digitized information originates at information source 52 which transfers digitized information to first buffer 54. First buffer 54 stores the digitized information until a block of J bits is requested by first adaptive data transfer circuit 56. The first adaptive data transfer circuit transfers k bits per symbol period to encoder 58 where k is the maximum data rate in bits per symbol. When the actual data rate, K, is less than k, the remaining k minus K bits are not information bits and are automatically ignored by the encoder. Encoder 58 encodes the k input bits onto an l-bit word, l>k. The l-bit word is mapped onto one of M signals by mapper 60. Forward channel transmitter 62 modulates each signal input to it, S, and transmits the modulated signal s(t) over forward channel 64. The forward channel introduces attenuation, noise, and other impairments such that a noisy replica of s(t), denoted r(t), is received at forward channel receiver 66. The forward channel receiver demodulates the received signal and transfers a replica of the original signal, S', to adaptive trellis decoder 68. The adaptive trellis decoder searches a trellis, selects a trellis path which most closely resembles the received symbol sequence in terms of a predetermined decoder metric, and provides a decoded bit sequence in response to the selected trellis path and the number of data bits per symbol in each branch of the selected trellis path. The decoded bit sequence of k bits per symbol period is output to second adaptive data transfer circuit 72. Again, if the actual data rate K is less than k, the remaining k minus K bits are not information bits and are automatically ignored by the second adaptive data transfer circuit. Data is buffered by second buffer 74 and is transferred to information sink 76. The communications process is further detailed in the flow charts of FIGS. 3 and 4.

Encoder 58, mapper 60, adaptive trellis decoder 68, and estimator 70 form the nucleus of the present invention in its general form. These elements are preferably implemented in a modulator/demodulator (modem) system shown generally at 102 in FIG. 2.

Figure 2:
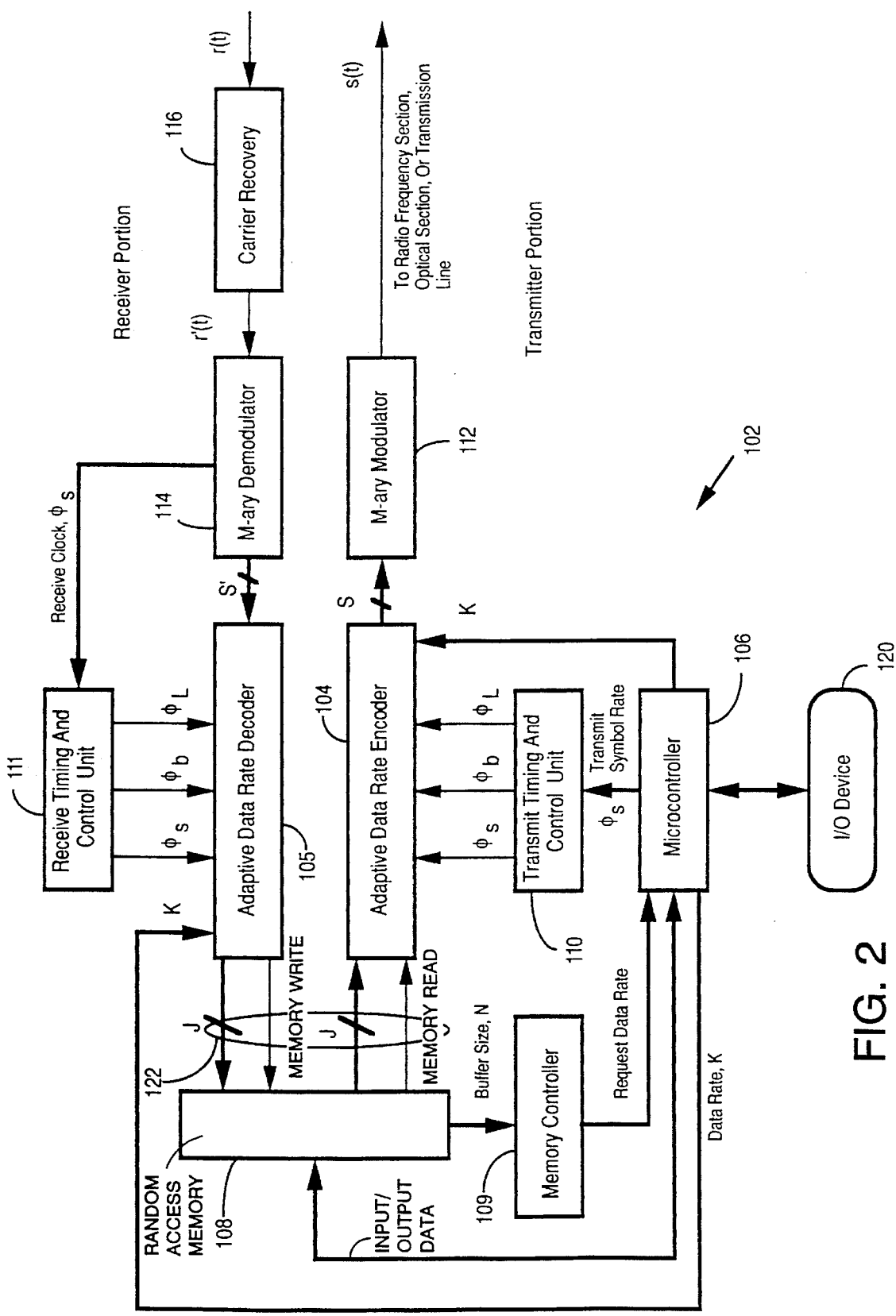
FIG. 2 is a block diagram schematic showing the main components of a particular preferred embodiment of the present invention.

Referring now to FIG. 2, modem 102 represents one end of a two-way communications system. In most applications, an identical device will be located at the distant end of a communications link to facilitate two-way communications. In FIG. 2, only those connections required for explanation of operation of the invention are shown. Other connections such as power supply lines, etc., will be readily apparent to one skilled in the art.

The preferred embodiment of modem 102 is a combination of hardware and software. This approach is preferred because it exploits the speed of hardware for functions that do not require frequent changes and it allows flexibility by programming functions that do require frequent changes in software. Alternatively, one could implement the entire modem on an application specific integrated circuit (ASIC) for high speed, or one could implement the entire modem in software. The optimal approach depends on the specific application, but the structure and operation of the invention are the same, regardless of the particular implementation. The preferred platform for the software portion of the invention is an off-the-shelf signal processor integrated circuit such as the Texas Instruments TMS320C30.

Modem 102 comprises an adaptive data rate encoder 104, an adaptive data rate decoder 105, a microcontroller 106, a random access memory (RAM) 108, a memory controller 109, a transmit timing and control unit 110, a receive timing and control unit 111, a M-ary modulator 112, a M-ary demodulator 114, a carrier recovery circuit 116, an input/output (I/O) device 120, and a data bus 122.

Microcontroller 106 is connected to input/output device 120. Input/output device 120 serves as a source for data to be transmitted by the modem and receives from microcontroller 106 the data received by modem 102. Microcontroller 106 is also connected to RAM 108 which serves as a buffer for input and output data of modem 102. Microcontroller 106 is further connected to transmit timing and control unit 110. The microcontroller directs the transmit symbol rate, $\phi_s$, and transmit timing and control unit 110 derives the bit clock $\phi_b$, and load pulse $\phi_L$ and outputs all three timing signals to adaptive encoder 104.

Transmit data are generated at I/O device 120 and flow through microcontroller 106 and RAM 108 before entering adaptive encoder 104 via the transmit portion of data bus 122 of size J bits. The adaptive encoder is also connected to transmit timing and control unit 110 where the transmit control signals $\phi_b$ and $\phi_L$ are generated. Adaptive data rate encoder 104 performs parallel to serial conversion, rate changing, error correction encoding, and bit-to-symbol mapping functions. The encoded signal leaves the adaptive encoder via a bus of size $\log_2 M$ bits and enters M-ary modulator 112. The M-ary modulator modulates the data bits using phase, frequency, amplitude, pulse position modulation, and/or some other modulation and sends the modulated signal to a transmission line, radio frequency (RF), or an optical transmitter section.

Received signals enter optional carrier recovery circuit 116 where a carrier reference is derived for those modulation schemes requiring a phase reference. The received signal leaves carrier recovery circuit 116 and enters M-ary demodulator 114 where the phase, frequency, and/or amplitude modulation is stripped from the signal and a noisy replica of the original signal, S' is sent to adaptive decoder 105. The M-ary demodulator also derives the symbol clock, $\phi_s$. The symbol clock is sent to receive timing and control unit 111 where a bit clock $\phi_b$ and a load pulse $\phi_L$ are derived from the symbol clock. The receive control signals $\phi_s$, $\phi_b$ and $\phi_L$ are independent of the transmit control signals, so the receive and transmit data sequences can operate at different symbol rates and data rates. This feature is useful on communications circuits where the forward and return channels experience independent fading statistics. Adaptive decoder 105 performs several key functions including symbol-to-bit mapping, error correction decoding, rate changing, signal quality estimation, signal-to-noise ratio prediction, and serial to parallel conversion. The adaptive decoder is connected to microcontroller 106 and to RAM 108 via the receive portion of data bus 122 of size J bits and a memory write line. The adaptive decoder receives the three receive control signals, $\phi_s$, $\phi_b$ and $\phi_L$, from receive timing and control unit 111.

RAM 108 is connected to adaptive encoder 104 and adaptive decoder 105 by bus 122 including memory read, memory write, address, and data lines. These lines may be distinct or the signals may be multiplexed, depending on the system components selected. RAM 108 is further connected to memory controller 109. The memory controller controls data flow by raising or lowering the transmit data rate to prevent overflows or underflows, respectively, or alternatively, directs the microcontroller to pause to prevent overflows in the RAM.

Now the operation of each component of the invention shall be described in detail. Referring again to FIG. 2, I/O device 120, microcontroller 106, and RAM 108 are of known design and will be familiar to one skilled in the art. Furthermore, M-ary modulator 112 and M-ary demodulator 114 are also of known design, but some description of the interfaces between these components and the adaptive encoder and adaptive decoder is necessary to facilitate an efficient construction of the invention. The eight components will be described in the following order: timing and control units 110 and 111, adaptive encoder 104, M-ary modulator 112, M-ary demodulator 114, adaptive decoder 105, memory controller 109, and carrier recovery circuit 116.

Figure 5:
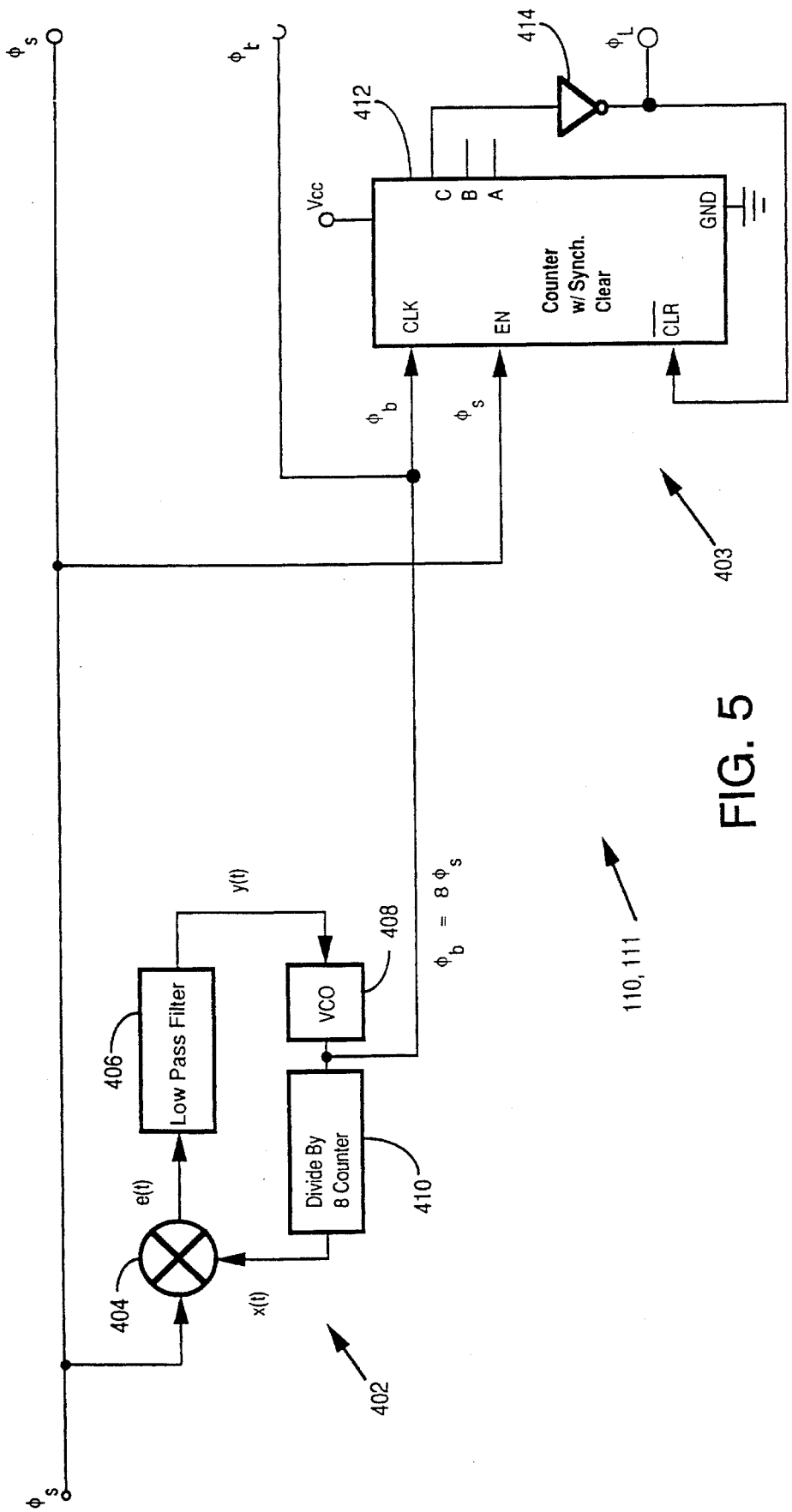
FIG. 5 is a schematic of timing and control unit 110, 111 according to a particular preferred embodiment of the present invention.

Timing and Control Units 110, 111 (FIG. 5)

Referring to FIG. 2, it is seen that in addition to conventional timing signals that can be generated by circuits of known design, adaptive encoder 104 and adaptive decoder 105 require a bit clock, $\phi_b$, operating at a multiple of the symbol clock (preferred rate is eight times symbol clock) and a load pulse $\phi_L$, designed to initiate the loading of new data bits in various registers. Transmit timing and control unit 110 and receive timing and control unit 111 are identical except for the origination of the symbol clock, $\phi_s$. The transmit symbol clock is generated by microcontroller 106 and an external oscillator circuit of known design. The receive symbol clock is recovered from the received signal r(t) by M-ary demodulator 114 via circuits of known design. The timing and control signals, $\phi_b$, and $\phi_L$, can be derived from the symbol clock, $\phi_s$, in a variety of devices and methods.

FIG. 5 shows the preferred embodiment of timing and control unit 110, 111. The timing and control unit as presented in FIG. 5 comprises a times-8 rate multiplier 402, and a load pulse generator 403.

The rate multiplier 402 is realized by a phase locked loop with a divide-by 8 counter 410 inserted between a voltage controlled oscillator (VCO) 408 and a phase detector 404. To achieve phase lock, the output of the VCO must be exactly 8 times the frequency of the signal x(t) which is in turn exactly in phase and frequency with the symbol clock, $\phi_s$. Thus, the clock signal, $\phi_b$, is in phase with the symbol clock, $\phi_s$, and operates at a frequency exactly 8 times the symbol clock frequency. The components of the rate multiplier are readily available off-the-shelf. For example, phase detector 404 and VCO are contained in National Semiconductor's CD4046 integrated circuit and the divide-by-8 counter can be implemented with the 74HC163 counter in a modulo-8 configuration. The low pass filter is easily realized with an elementary resistor-capacitor (R-C) network. An example configuration for the rate multiplier is found in *Radio Electronics*, November, 1982 incorporated herein by reference.

Figure 8:
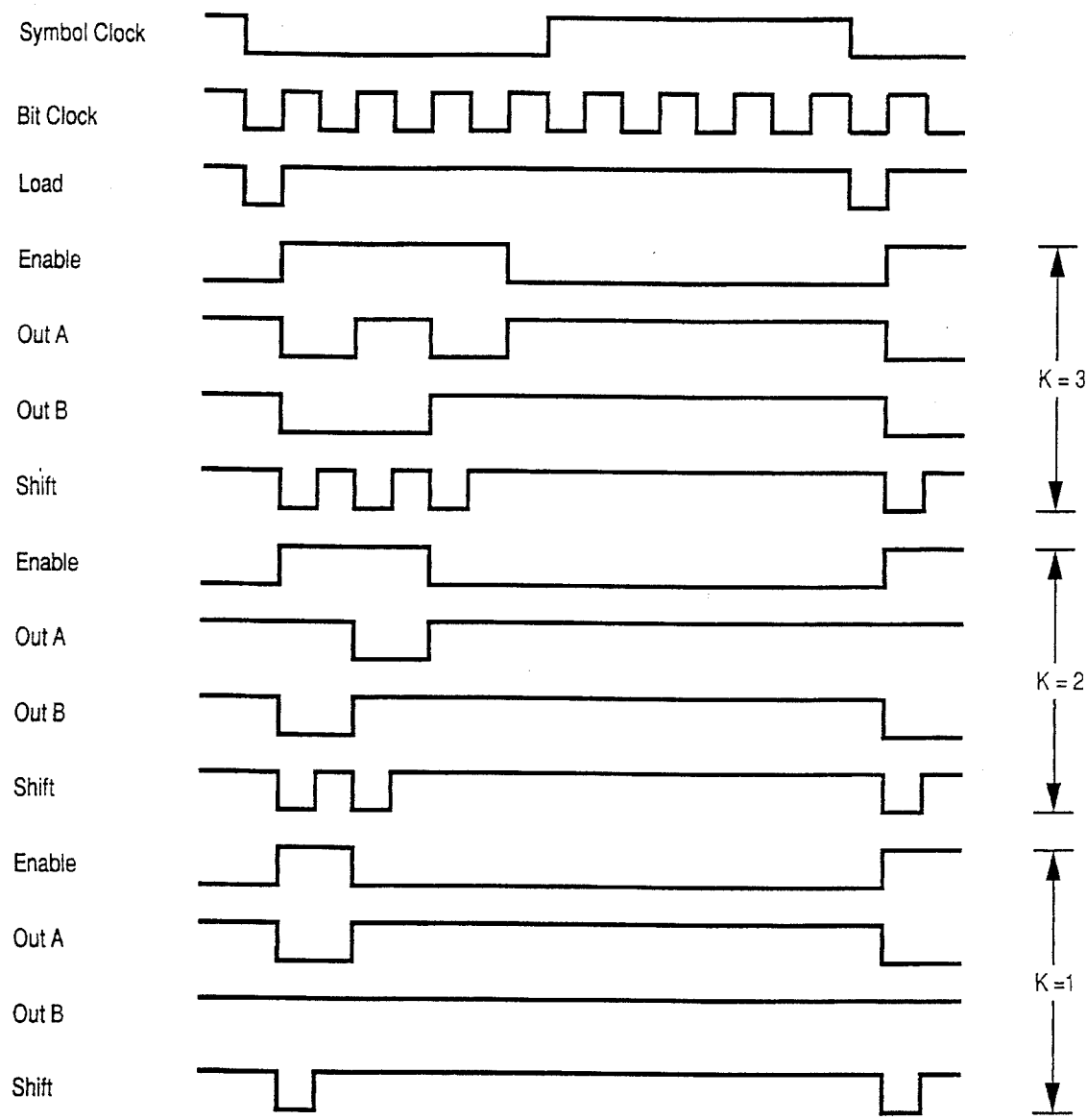
FIG. 8 is the timing diagram for first encoder counter 208 and first decoder counter 224.

Load pulse generator 403 comprises a modulo-8 counter 412 and an inverter 414. The modulo-8 counter is available off-the-shelf in 16 pin integrated circuit packages. One notable example is the 74HC163 counter manufactured by National Semiconductor and others. The load pulse, $\phi_L$, is derived from the symbol clock, $\phi_s$, and the newly generated bit clock, $\phi_b$ with the help of the modulo-8 counter and the inverter. At this time it will be helpful to refer to the top three timing diagrams of FIG. 8 as well as FIG. 5. When the symbol clock transitions from low to high, counter 412 is enabled and begins counting on the next positive transition of the bit clock. On the fourth positive edge of the bit clock the count is 4 (binary 100) and the output "C" goes high. This forces the load line, $\phi_L$, to go low. Simultaneously, the clear input of the counter is activated by the the same line and the counter is cleared to the all zero output state at the next positive edge of the bit clock, $\phi_b$. Thus, the load pulse has duration of exactly one-half of the bit clock period. The resulting timing signals are shown in FIG. 8. The use of the timing signals is described in greater detail in the following sections.

Figure 6:
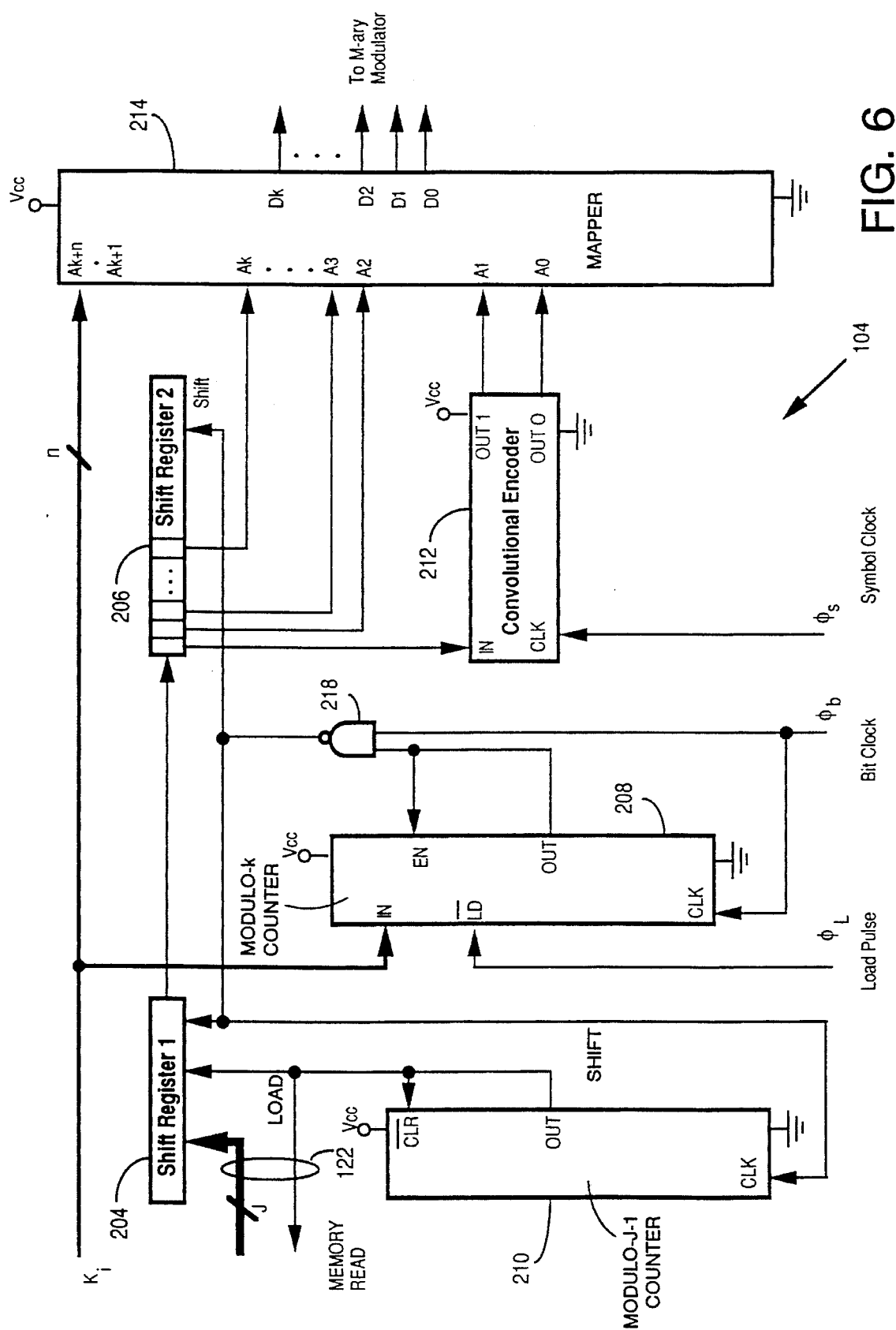
FIG. 6 is a schematic of a generalized adaptive data rate encoder 104.

Generalized Adaptive Encoder 104 (FIG. 6)

Before describing the elements and operation of the preferred embodiment adaptive encoder 104, a generalized version of adaptive encoder 104, shown in FIG. 6, will be described. Referring now to FIG. 6, adaptive encoder 104 comprises a variable start, modulo-k up counter (Counter 1) 208; a modulo-J-1 up counter (Counter 2) 210; a J-bit, parallel in, serial out, shift register (Shift Register 1) 204; a k-bit (or larger) serial in, parallel out, shift register (Shift Register 2) 206; a convolutional encoder 212; a two input NAND gate 218; and a mapper 214.

The main functions of the adaptive encoder are parallel to serial conversion, rate changing, error correction encoding, and bit-to-symbol mapping. The adaptive encoder inputs are the following: incoming parallel bit sequence of J bits (transmit portion of data bus 122); current data rate information, $K_i$, from the microcontroller; symbol clock, $\phi_s$; bit clock, $\phi_b$ (at a multiple of the symbol clock rate); and load pulse, $\phi_L$. The adaptive encoder outputs are the following: a memory read line (transmit portion of data bus 122) and a k+1-bit word ($D_0$–$D_k$) to M-ary modulator 112.

Adaptive encoder 104 reads data from RAM 108 (shown in FIG. 2) in blocks of J bits where J is a common multiple of the ensemble of data rates, $K_i$=1, 2, 3, ... k. Each block of J bits is first loaded into first shift register 204. Each symbol period, $K_i$ bits are shifted from first shift register 204 into second shift register 206 where $K_i$ is the current data rate in bits per symbol.

First counter 208 controls the number of bits shifted from first shift register 204 into second shift register 206 by counting up from a starting point determined by $K_i$. For example, if the highest data rate is k=3, first counter 208 will start from 0, 1, or 2 and count to three before resetting. In the case of k=3, if the current data rate is $K_i$=3, the first counter starts the count at 0, if the current data rate is $K_i$=2, the first counter starts the count at 1, and if the current data rate is $K_i$=1, the first counter starts the count at 2.

Second counter 210 monitors the status of first shift register 204 and when all J bits have been shifted out, second counter 210 resets and activates the MEMORY READ line to request a new block of J bits. At this time, the data rate is updated to $K_{i+1}$ and the cycle continues.

At the end of each symbol period, one of the $K_i$ bits in register 206 are input to convolutional encoder 212 and the remaining $K_i$–1 bits are input directly to mapper 214. Mapper 214 produces output bits $D_0$ through $D_k$ by operating in a predetermined manner on input bits $A_0$ through $A_{k+n}$.

First counter 208 has as inputs signals $K_i$ from microcontroller 106 and load pulse, $\phi_L$, from timing and control unit 110. Load pulse $\phi_L$ provides the load control input to first counter 208, and the clock input signal of first counter 208 is $\phi_b$ from timing and control unit 110. The output of modulo-k first counter 208 indicating the completion of the $k^{th}$ count is used as the enable signal for the modulo-k first counter 208 and is also connected as an input of NAND gate 218.

NAND gate 218 has as its other input the clock signal $\phi_b$. The output of NAND gate 218 is the shift control input of both first shift register 204 and second shift register 206, and is also the clock input of the modulo J-1 second counter 210.

The output of second counter 210 indicating the completion of the J-1th count is used as the clear signal for second counter 210 and is also used as the load signal for shift register 204 and the memory read control signal of bus 122 for controlling RAM 108.

The J-bit transmit data line of bus 122 forms the input to shift register 204, and the serial output of first shift register 204 is the serial input to second shift register 206. The first parallel output bit of second shift register 206 is the data input to convolutional encoder 212, and $\phi_s$ is the clock input to convolutional encoder 212.

The outputs OUT0 and OUT1 of convolutional encoder 212 are connected to inputs $A_0$ and $A_1$, respectively, of mapper 214. The third through $k+1^{th}$ parallel output bits of shift register 206 are inputs $A_2$ through $A_k$, respectively, of the mapper 214. Data rate information $K_i$, comprising n bits, is the input to the modulo-k counter 208 and also provides the $A_{k+1}^{th}$ through $A_{k+n}^{th}$ input bits to mapper 214. Next, a preferred embodiment of adaptive encoder 104 shall be described.

Preferred Embodiment of Adaptive Encoder 104 (FIGS. 7, 8, 9, 10, 11, 12)

Figure 7:
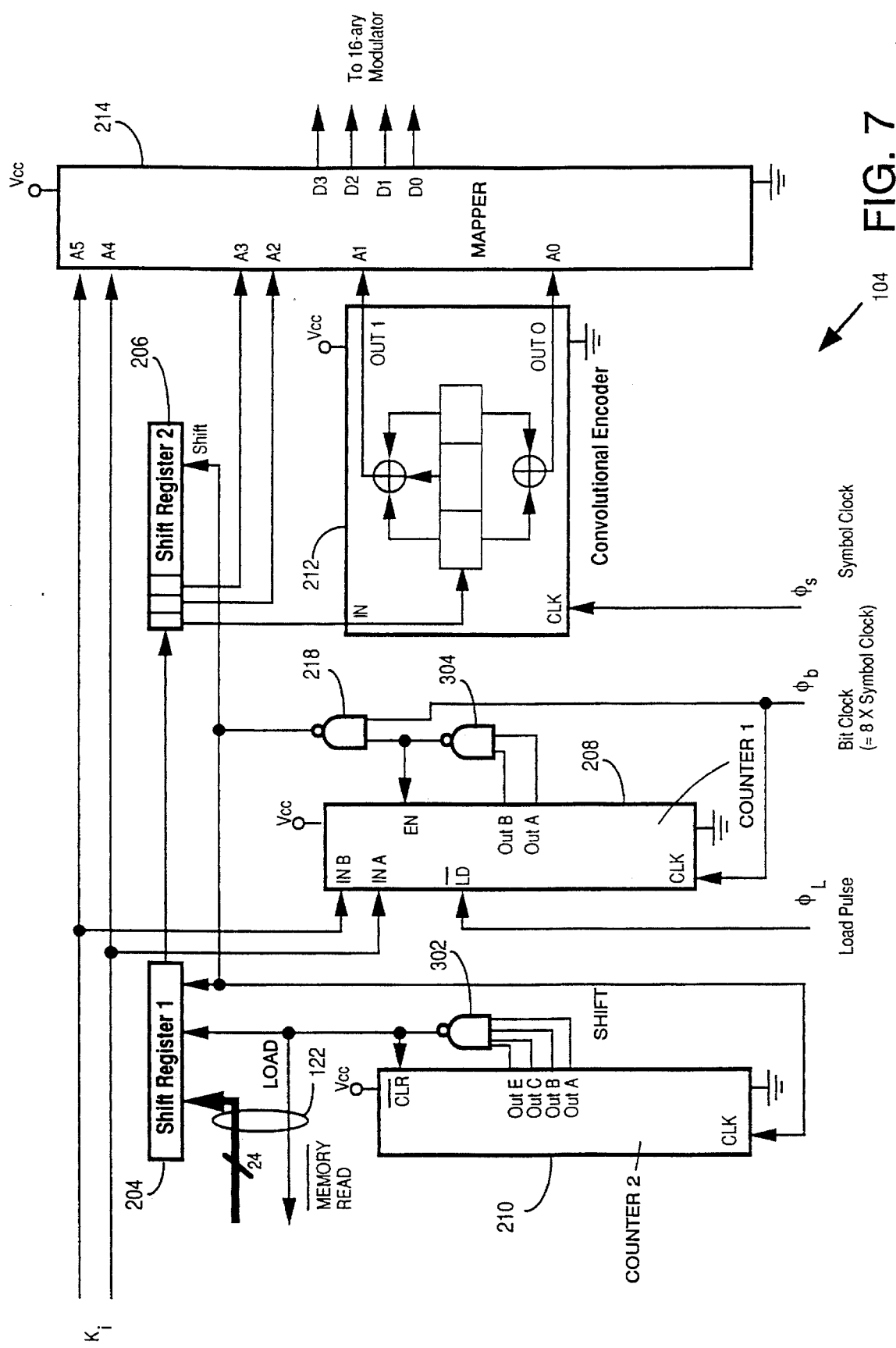
FIG. 7 is a schematic of a preferred embodiment of adaptive data rate encoder 104.

A particularly preferred embodiment of the adaptive encoder is shown in schematic form in FIG. 7. For purposes of clarity in FIG. 7, only those connections required for explanation of the system operation are shown. Those skilled in the art will appreciate that connections must be made to power supplies, clock signals, and commonly used control signals depending upon the configuration of the components selected. In this preferred embodiment, variables of FIG. 6 take on the values listed in Table 1.

Referring now to the particular illustrated embodiment of FIG. 7, adaptive encoder 104 comprises first and second shift registers 204 and 206; first and second counters 208 and 210; convolutional encoder 212; mapper 214; and NAND gates 302, 218, and 304.

First counter 208 is a variable start, modulo-3 up counter. Second counter 210 is a modulo-23 up counter. First shift register 204 is a 24-bit, parallel in, serial out, shift register, and second shift register 206 is a 3-bit (or larger) serial in, parallel out shift register. Convolutional encoder 212 is a constraint length three, rate 1/2, convolutional encoder.

Mapper 214 may be implemented using a RAM, ROM, PROM, EPROM, EEPROM, programmable logic controller, or any other digital device or circuit which can be connected to implement a look up table function, i.e. to produce output signals $D_0$–$D_3$ in response to the state of a plurality of input signals. When a memory device is used for the look up function of mapper 214, its input signals are connected to six address lines $A_0$–$A_5$ of the mapper.

TABLE 1

Selected Parameters for Preferred Embodiment Adaptive Encoder 104

| Description | Values |
| --- | --- |
| Maximum number of data rates, k | 3 |
| Data rates, $K_i$ | 1, 2, 3 bits/symbol |
| Size of data rate word, n | 2 bits |
| Maximum number of channel symbols, M | 16 |
| Frame Size, J | 24 bits |
| First shift register 204 size | 24 bits |
| Second shift register 206 size | 3 bits (or larger) |
| Convolutional encoder 212 code rate | ½ |
| Convolutional encoder 212 constraint length | 3 |
| Convolutional encoder taps (binary representation) | 111, 101 |
| Symbol clock rate, $\phi_s$ | User selectable |
| Bit clock rate, $\phi_b$ | 8 times symbol clock |
| Number of data lines input to mapper 214 | 6 |
| Minimum memory size of mapper 214 | 64 6-bit words |
| Number of data lines input to modulator 112 | 4 |
| Counter 1 208 | Modulo-23 |
| Counter 2 210 | Variable start, modulo-3 |

First counter 208 has as inputs signals $K_i$ (represented by "A" and "B") from microcontroller 106. Load pulse $\phi_L$ from timing and control unit 110 provides the load control input to counter 208, and the clock input signal of first counter 208 is $\phi_b$, from timing and control unit 110. The output of NAND gate 304 is used as the enable signal for counter 208. The outputs A and B of counter 208 are connected as the inputs of NAND gate 304.

NAND gate 218 has as inputs the output of NAND gate 304 and the clock signal $\phi_b$. The output of NAND gate 218 is the shift control input of both shift registers 204 and 206, and is also the clock input of counter 210.

The outputs "A", "B", "C", and "E" of counter 210 are the inputs of NAND gate 302. The output of NAND gate 302 is used as the clear signal for counter 210 and is also used as the load signal for shift register 204 and the memory read control signal of bus 122 for controlling RAM 108.

The 24-bit data line of the transmit portion of bus 122 forms the input to shift register 204, and the serial output of shift register 204 is the serial input to shift register 206. The first parallel output bit of shift register 206 is the input to convolutional encoder 212. The second and third parallel output bits of shift register 206 are inputs $A_2$ and $A_3$, respectively, of mapper 214.

The adaptive encoder shown in FIG. 7 receives input data in J=24 bit frames. These frames include information and overhead (including rate information, $K_i$, for full duplex systems). These frames are previously formatted by microcontroller 106 (shown in FIG. 2). The 24-bit frames are loaded into first shift register 204 upon request from the adaptive encoder via the MEMORY READ line.

When the channel used by modem 102 is available for message traffic, 1, 2, or 3 bits at a time are shifted from first shift register 204 to second shift register 206. The number of bits shifted is determined by the data rate word, $K_i$. When the signal-to-noise ratio is high, 3 bits are shifted during each symbol clock ($\phi_s$) cycle. Otherwise, either two bits or a single bit are shifted during each symbol clock cycle, depending on the estimated signal-to-noise ratio. Modulo-3 counter 208 controls the number of bits shifted from first shift register 204 to second shift register 206.

Modulo-23 counter 210 counts the total number of bits shifted and after the 24$^{th}$ bit is shifted, it requests a new frame of 24 bits via the MEMORY READ line. The adaptive encoder in the preferred embodiment can change rates every 24 bits, if required, but it cannot change rates in the middle of a 24-bit frame. All bits are shifted into second shift register 206 while the symbol clock $\phi_s$ is low. Upon the rising edge of the symbol clock, $\phi_s$, a new bit is shifted into convolutional encoder 212, and the outputs of convolutional encoder 212 ($A_0$ and $A_1$) appear at the address ports of mapper 214, along with the other address bits, $A_2$ through $A_5$. Mapper 214 maps the six-bit input address to a four-bit output word. This four-bit output word corresponds to the proper channel symbol and is fed to M-ary modulator 112.

The functions of the timing signals and the six major components of adaptive encoder 104 will now be explained in greater detail.

Timing Signals. The timing signals $\phi_s$, $\phi_b$, and $\phi_L$ are generated outside the adaptive encoder by timing and control unit 110 (shown in FIG. 2) and are inputs to the adaptive encoder. The symbol clock, $\phi_s$, operates at the user selected symbol rate, $\phi_s$ symbols/second. The bit clock, $\phi_b$, operates at a rate of 8 times the symbol clock, $\phi_s$ and must be in phase with the symbol clock, $\phi_s$ as shown in the timing diagrams of FIGS. 8 and 9. The load pulse, $\phi_L$, occurs over one-half cycle of the bit clock, $\phi_b$ at each cycle of symbol clock, $\phi_s$ and is triggered by the falling edge of the symbol clock, $\phi_s$ (see FIGS. 8 and 9).

First Counter 208. In this illustrated embodiment, first counter 208 is a variable-start, modulo-3 up-counter. Counter 208 controls the data rate by initiating the shift of 1, 2 or 3 bits at a time from shift register 204 to shift register 206. The proper operating data rate (1, 2, or 3 bits per symbol) is estimated by the distant end adaptive decoder 105, transmitted over the return channel 80 (shown in FIG. 1), and input to adaptive encoder 104 as a 2-bit binary word, $K_i$. The mapping of Table 2 is used to determine the rate word $K_i$. The 2-bit binary word, $K_i$, is loaded into the counter by the load pulse, $\phi_L$. The timing diagram of FIG. 8 shows the relationship between the input and outputs of counter 208. Information bits are shifted into second shift register 206 while the symbol clock $\phi_s$ is low.

TABLE 2

| | Rate Word Mapping | | |
|---|---|---|---|
| K (bits/symbol) | Code Rate | Modulation | Rate Word |
| 1 | ½ | 4-ary | 10 |
| 2 | ⅔ | 8-ary | 01 |
| 3 | ¾ | 16-ary | 00 |
| STOP | — | — | 11 |

The STOP command instructs the adaptive encoder to halt communications until further notice. The STOP command will be transmitted when the estimated signal-to-noise ratio has fallen below the minimum threshold required for reliable communications. The STOP command also instructs microcontroller 106 to switch from a communications mode to a probing mode until the channel again becomes available for message traffic. The microcontroller may also use the STOP command to halt the adaptive encoder when the message transmission is complete, or for other control purposes.

Figure 9:
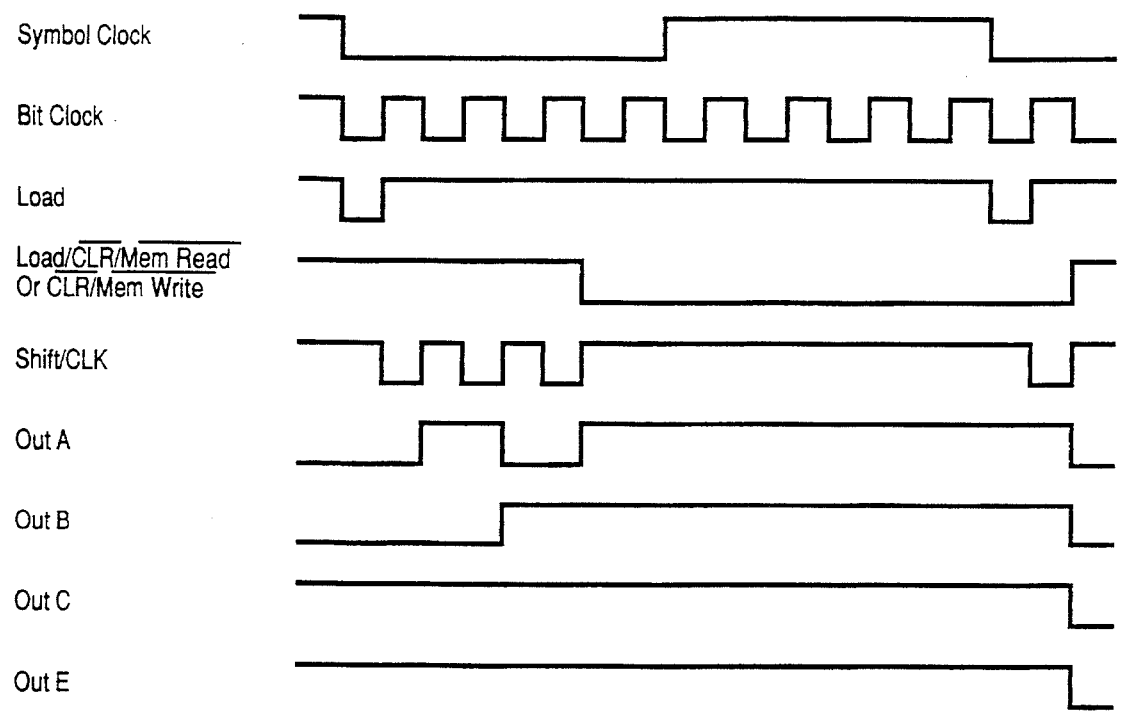
FIG. 9 is the timing diagram for second encoder counter 210 and second decoder counter 226 when the data rate is K=3 bits per symbol.

Second Counter 210. Counter 210 is a modulo-23 up counter with synchronous clear. Counter 210 activates the memory read line to load a new 24-bit frame into first shift register 228 after the previous 24 bits have been transmitted. The timing diagram for counter 210 is shown in FIG. 9 for the case K=3. Note that because counter 210 employs a synchronous clear, the first bit shift coincides with counter 210 resetting to all 0's. Therefore, to shift precisely 24 bits, counter 210 must be configured as a modulo-23 counter. Counter 210 counts from 00000 binary to 10111 binary and then resets to 00000 binary. The output "A", in FIG. 7, corresponds to the least significant bit of the binary output ports of counter 210. The clock input for counter 210 is simply the shift signal line for shift registers 204 and 206. This configuration ensures that shift registers 204 and 206 are synchronized.

First Shift Register 204. Shift register 204 is a 24-bit wide, parallel in, serial out shift register. Shift register 204 can be realized by cascading three 8-bit shift registers. Although a register width of 24 bits is preferred, other sizes are also feasible. The register width should be a multiple of the least common multiple of all possible bit per symbol rates. For the design shown, register width should be a multiple of six since six is the least common multiple of 1, 2 and 3. J=24 is chosen because it is both a multiple of six and eight and therefore facilitates the transmission of eight-bit bytes. When higher order schemes (e.g. 32-ary, 64-ary, etc.) are used, the minimum and preferred register lengths shown in Table 3 apply.

TABLE 3

First Shift Register Length (Adaptive Encoder 104)

| Highest Order Signal Set | Minimum Length in Bits | Preferred Length in Bits |
|---|---|---|
| 4 | 1 | 8 (1 byte) |
| 8 | 2 | 8 (1 byte) |
| 16 | 6 | 24 (3 bytes) |
| 32 | 12 | 24 (3 bytes) |
| 64 | 60 | 120 (15 bytes) |
| 128 | 60 | 120 (15 bytes) |
| 256 | 420 | 840 (30 bytes) |
| 512 | 840 | 840 (30 bytes) |

The shift command is controlled by second counter 210. One, two or three bits are shifted at a time from first shift register 204 to second shift register 206, according to the bit per symbol rate specified by the value of $K_f$. When the register is emptied, the MEMORY READ line goes low and a new 24-bit frame (in the illustrated embodiment) is loaded in the register.

On full duplex systems, rate changing information must be included in each frame as overhead. There is a trade-off between minimizing overhead and minimizing rate changing intervals. Large frames result in small overhead as a percentage of total channel traffic. However, since rate changing cannot occur practically during the transmission of a frame, smaller frames are preferred to allow maximum rate-changing flexibility. The optimal frame size is a function of the channel conditions. Very slowly fading channels can accommodate larger frames.

On the other hand, a one-way channel does not require rate change information on the forward channel provided the communications process is synchronous. The return channel (shown in FIG. 1) can be dedicated to rate changing information and very small frame sizes can be used on the forward channel without rate information overhead. This type of communications system is especially desirable on rapidly fading channels where small frame sizes are needed. An alternative embodiment uses a frame size equal to the current data rate $K_f$, and fetches bits from RAM 108 at the beginning of each symbol period. This approach requires more memory read operations but allows maximum flexibility. Such an alternative embodiment might use a 1-bit per word memory architecture to allow data rates as low as 1 bit per symbol.

Second Shift Register 206. Second shift register 206 is a 3-bit (or larger) serial in, parallel out shift register. It can be realized by using the first (left most) three bits of an 8-bit shift register. Regardless of the value of $K_f$, shift register 206 always outputs three bits to the convolutional encoder 212 and mapper 214. When $K_f=1$, the two most significant bits are designated "don't care;" meaning that they are ignored by mapper 214. When K=2, only the most significant bit is a "don't care." Because convolutional encoder 212 is rate 1/2, four coded bits are always fed to the mapper 214 and to M-ary modulator 112. Consequently, rate changing is transparent to M-ary modulator 112 and prior art 16-ary modulators can be used to realize this preferred embodiment.

Convolutional Encoder 212. Referring again to FIG. 7, convolutional encoder 212 is a conventional rate 1/2, constraint length 3 device commonly used in wireline data modems. The generator polynomials are chosen to be $g_1(x)=x^2+x+1$ and $g_2(x)=x^2+1$ where "x" denotes one bit delay and "$x^i$" denotes an i bit delay. This particular code is chosen for its ease of implementation and for its ability to adapt to rapid changes on the channel. The constraint length, m, of a convolutional code is the number of positions in its shift register. In general, longer constraint length codes are more powerful. However, longer constraint length codes have greater decoder memory and cannot adapt as quickly to rapid changes. More powerful codes may be preferable for some applications, especially slowly fading channels. An alternative convolutional encoder of constraint length 7 uses polynomials $g_1(x)=x^6+x^5+x^4+x^3+1$ and $g_2(x)=x^6+x^4+x^3+x+1$. However, any non-catastrophic rate 1/2 convolutional code can be used in the preferred embodiment. (A catastrophic code does not necessarily recover automatically from an error event and is therefore not desirable.) The convolutional code of the preferred embodiment is a finite state machine and can be described by the state diagram of FIG. 11b. The state diagram can be also be represented by a trellis structure as shown in FIG. 12a (1). The one or two uncoded bits for 8-ary and 16-ary modulation, respectively, do not increase the number of trellis states and therefore manifest themselves in the trellis as parallel state transitions (or branches) as shown in FIG. 12a (2) and 12a (3).

Mapper 214. Mapper 214 is preferably an EPROM and in the preferred embodiment of FIG. 6, mapper 214 maps the six-bit address ($A_0$ through $A_5$) into a four bit binary word ($D_0$ through $D_3$). The correct mapping is determined by the type of 16-ary modulator used. An exemplary mapping is shown in Table 4 for 16-ary PSK, DPSK, and PPM modulation and in Table 5 for 16-ary QAM modulation.

Figure 10A:
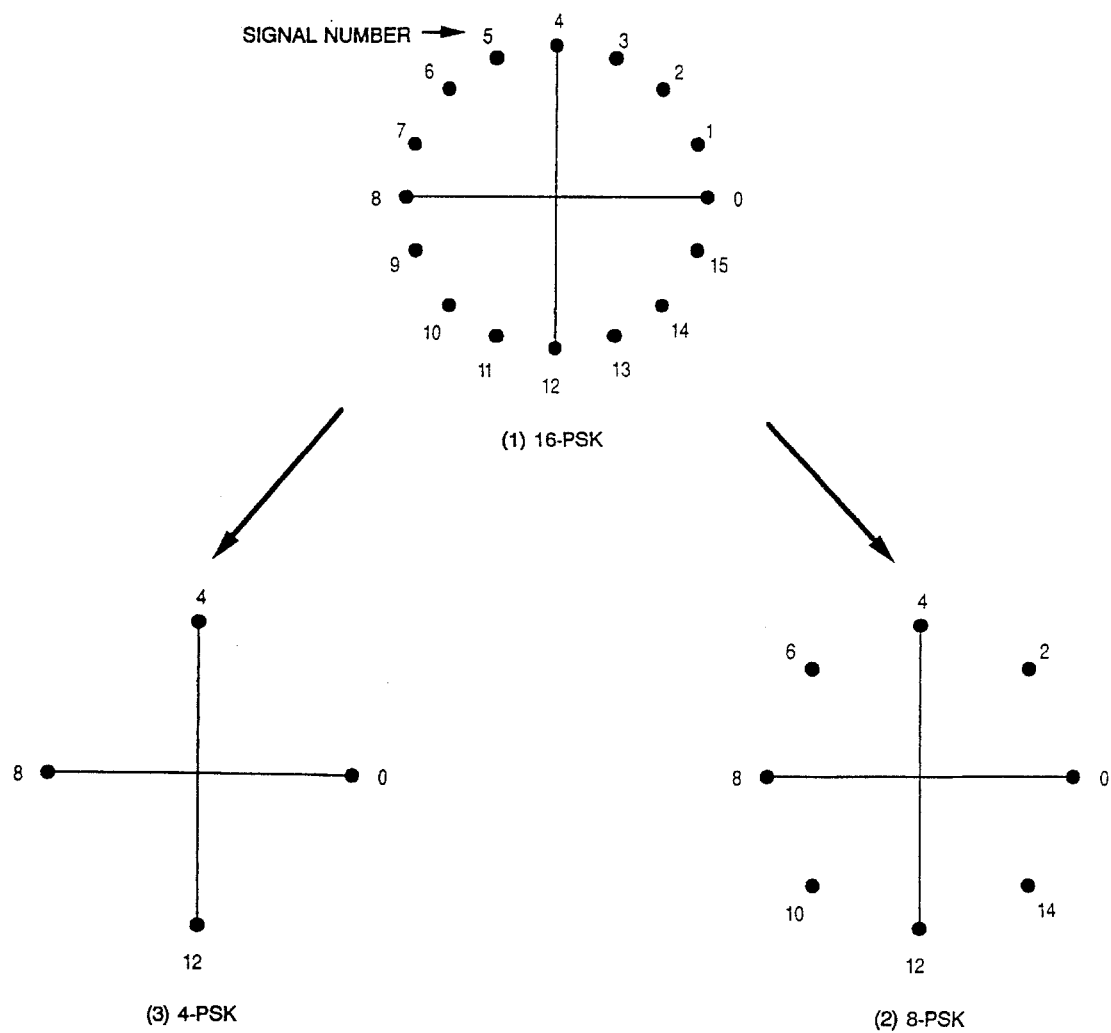
FIG. 10a is a 16-ary phase shift keyed (PSK) signal constellation for use by modem 102.
Figure 10C:
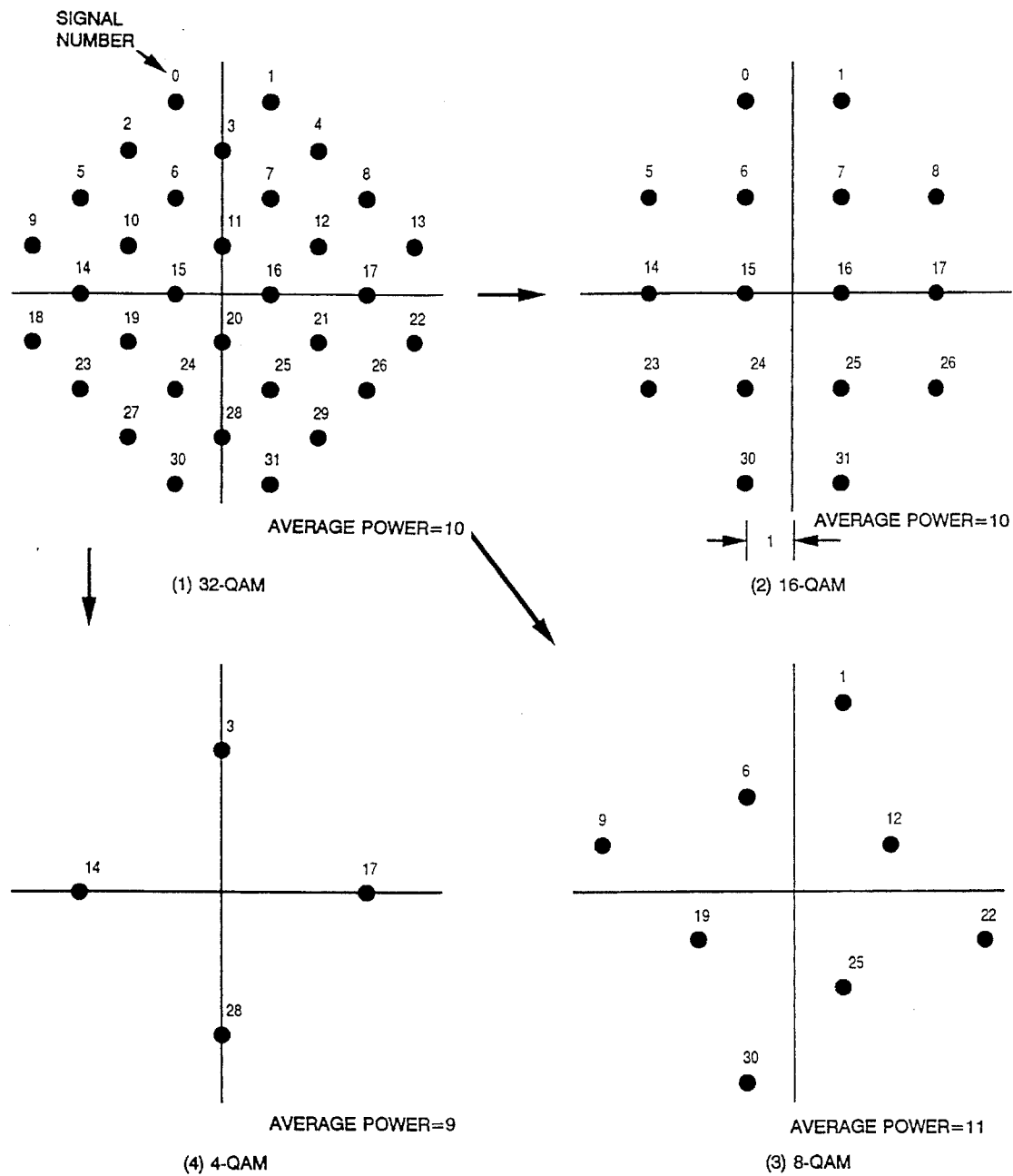
FIG. 10c is another alternative constellation using 32-QAM.

The corresponding signal constellations are shown in FIGS. 10a and 10b, respectively. On channels with relatively high average signal-to-noise ratios, higher order constellations are desirable. For example, a 32-QAM constellation capable of data rates up to 4 bits per symbol is shown in FIG. 10c. Subsets of this constellation for 16-QAM, 8-QAM, and 4-QAM are also shown in FIG. 10c. The 32-QAM constellation of FIG. 10c is identical to that used in the CCITT V.32 modem and an adaptive system can be constructed with this constellation that is backward compatible with the V.32 standard by employing the V.32 trellis code and the sub constellations shown in FIG. 10c. In table 6, an exemplary mapping for this 32-QAM constellation is shown for the convolutional encoder of FIG. 11 (which is not the same as the V.32 trellis encoder).

TABLE 4

Bit to Symbol Mapping for 16-ary PSK, 16-ary DPSK, and 16-ary PPM (FIGS. 10a and 10d) (X = Don't Care)

| Signal No. | Bits/Symbol | Code Rate | Coded Bits | $A_5A_4A_3A_2A_1A_0$ | $D_3D_2D_1D_0$ |
|---|---|---|---|---|---|
| 0 | 3 | ¾ | 0000 | 000000 | 0000 |
| 1 | 3 | ¾ | 0001 | 000001 | 0001 |
| 2 | 3 | ¾ | 0011 | 000011 | 0010 |
| 3 | 3 | ¾ | 0010 | 000010 | 0011 |

TABLE 4-continued

Bit to Symbol Mapping for 16-ary PSK, 16-ary DPSK, and 16-ary PPM
(FIGS. 10a and 10d) (X = Don't Care)

| Signal No. | Bits/Symbol | Code Rate | Coded Bits | $A_5A_4A_3A_2A_1A_0$ | $D_3D_2D_1D_0$ |
|---|---|---|---|---|---|
| 4 | 3 | ¾ | 0100 | 000100 | 0100 |
| 5 | 3 | ¾ | 0101 | 000101 | 0101 |
| 6 | 3 | ¾ | 0111 | 000111 | 0110 |
| 7 | 3 | ¾ | 0110 | 000110 | 0111 |
| 8 | 3 | ¾ | 1000 | 001000 | 1000 |
| 9 | 3 | ¾ | 1001 | 001001 | 1001 |
| 10 | 3 | ¾ | 1011 | 001011 | 1010 |
| 11 | 3 | ¾ | 1010 | 001010 | 1011 |
| 12 | 3 | ¾ | 1100 | 001100 | 1100 |
| 13 | 3 | ¾ | 1101 | 001101 | 1101 |
| 14 | 3 | ¾ | 1111 | 001111 | 1110 |
| 15 | 3 | ¾ | 1110 | 001110 | 1111 |
| 0 | 2 | ⅔ | 000 | 01X000 | 0000 |
| 2 | 2 | ⅔ | 001 | 01X001 | 0010 |
| 4 | 2 | ⅔ | 011 | 01X011 | 0100 |
| 6 | 2 | ⅔ | 010 | 01X010 | 0110 |
| 8 | 2 | ⅔ | 100 | 01X100 | 1000 |
| 10 | 2 | ⅔ | 101 | 01X101 | 1010 |
| 12 | 2 | ⅔ | 111 | 01X111 | 1100 |
| 14 | 2 | ⅔ | 110 | 01X110 | 1110 |
| 0 | 1 | ½ | 00 | 10XX00 | 0000 |
| 4 | 1 | ½ | 01 | 10XX01 | 0100 |
| 8 | 1 | ½ | 11 | 10XX11 | 1000 |
| 12 | 1 | ½ | 10 | 10XX10 | 1100 |

In the preferred embodiment, an increasing phase shift is mapped to an increasing 4-bit binary word (see Table 4). Thus, the 4-bit input $D_0$ through $D_3$ to the D/A converter is an increasing linear function of phase shift. The precise mapping function is determined by the inputs required by the particular M-ary modulator selected. If the output of mapper 214 is input directly to a quadrature modulator such as the one shown in FIG. 14a, then nine amplitudes in the horizontal direction and nine amplitudes in the vertical direction must be represented (see FIG. 10a). This approach would require an output from the mapper of two 4-bit (or larger) words to represent the in-phase and quadrature components of the M-ary signal.

Because the input alphabet has 64 elements and output alphabet has 16 elements, the mapping performed by mapper 214 is not one-to-one. As shown in the signal constellation diagram of FIG. 10a, eight of the output PSK symbols are used for both 16 and 8-PSK modes and four of the output symbols are used for 16, 8 and 4-PSK modes. The signal numbers of Table 4 correspond to the signal numbers diagrammed in FIG. 10a (PSK).

This signal structure presents a significant implementation advantage because only a single signal set of size 16 is needed and the 16-ary modulator requires no modification over that used for prior art systems.

When 16-ary QAM modulation is used, the mapping of Table 5 is preferred. The signal numbers of Table 5 correspond to the signal numbers of FIG. 10b. The particular constellation of FIG. 10b was constructed because the average power is the same for all three signal sets (4-ary, 8-ary, and 16-ary), and because the 4-ary and 8-ary constellations are conveniently subsets of the 16-ary constellation. These properties are important for adaptive data rate QAM systems because (1) they allow the system designer to use a single prior art 16-ary constellation and modulator to support all data rates and (2) all data rates will be supported by the full available average power of the modulator.

A system with sub constellations of varying average power is not desirable because power adjustments would be necessary to realize the full performance of the system. By using constant average power, the processing burden is reduced and power stability problems are avoided. For example, the CCITT V.29 modem employs a 16-ary constellation for 9600 bps, an 8-ary sub-constellation for a 7200 bps fall back rate, and a 4-ary sub-constellation for a 4800 bps fall back rate. The normalized average powers for the 16, 8, and 4-ary constellations are 13.5, 5.5, and 9, respectively. The CCITT V.29 modem does not vary the data rate dynamically, but if it did, the power would have to be adjusted dynamically to maintain an average power of 13.5. For example, a data rate change from 9600 bps to 7200 bps would require a power increase of 13.5/5.5 or 3.9 dB.

In general, any M-ary signal set (M is a power of 2) can support subsets of size M/2, M/4, . . . etc. by selecting the subsets so the average power is substantially the same as the average power of the original set of size M. The subsets should also be chosen to maximize the free Euclidean distance (the free Euclidean distance is the minimum Euclidean distance between two trellis paths that leave a state and merge into the same state at some later point in the trellis. See for example, B. Sklar, *Digital Communications Fundamentals and Applications*, Prentice-Hall, Englewood Cliffs, N.J., 1988, incorporated herein by reference). The present invention employs a method for constructing trellis coded M-ary signal sets with substantially equal average power and maximal free Euclidean distance. The method works as follows:

Step 1: Arrange a set of M points in complex space of one or more dimensions, where M is a power of 2.

Step 2: Arrange a first subset of size M/2 points such that the average power of the first subset is substantially equal to the average power of the original set and the distance between nearest points in the first subset is maximized.

Step 3: Arrange a second subset of size M/4 points such that the average power of the second subset is substantially equal to the average power of the original set and that the distance between nearest points in the second subset is maximized.

Step 4: Repeat step 3 for subsets of size $M/2^i$, i=3, 4, . . ., until the smallest desired subset is achieved.

Step 5: Assign parallel branches (when they occur) to signal points separated by the maximum Euclidean distance.

Step 6: Assign the branches originating from and merging into any trellis state to signal points with the maximum possible Euclidean distance.

Referring now to FIG. 10b and FIG. 12b, it is shown that this method was used to construct three constellations each with an average power of 10.

A third signal constellation is shown with its subsets in FIG. 10c where the highest order constellation is 32-QAM. Note that the 8-QAM and 4-QAM sub-constellations have average powers of 11 and 9, respectively. Subsets with average power of 10 and good distance properties did not exist, so the constellations shown in FIGS. 10c(3) and 10c(4) were selected as best meeting the criteria of the construction method.

If maintaining the same average power is not a primary concern, other QAM constellations may be desirable.

In practice, the term QAM is sometimes used to denote only square signal sets. Note that we define the term quadrature amplitude modulation to include all quadrature modulated signals, including PSK.

For DPSK, the same mapping can be used as for PSK with the exception that the channel symbol now represents a change in phase, rather than a point in the complex plane. The mapping of bits to a change in phase is accomplished by a differential encoder of known design.

An M-ary CPFSK modem can maintain a constant bandwidth for many values of M by overlapping symbols in the frequency domain. This overlapping introduces a controlled form of intersymbol interference that can be partially resolved by a sequence estimator such as the Viterbi decoder. Because higher values of M introduce greater intersymbol interference, the signal is more susceptible to noise and a higher signal-to-noise ratio is required to maintain an acceptable bit-error rate. When used with M-ary CPFSK, the present invention varies the number of data bits per CPFSK symbol as a function of signal-to-noise ratio. The particular mapping of encoder output bits to CPFSK channel symbol must be determined by the system designer based on the particular CPFSK signal set chosen.

Figure 10D:
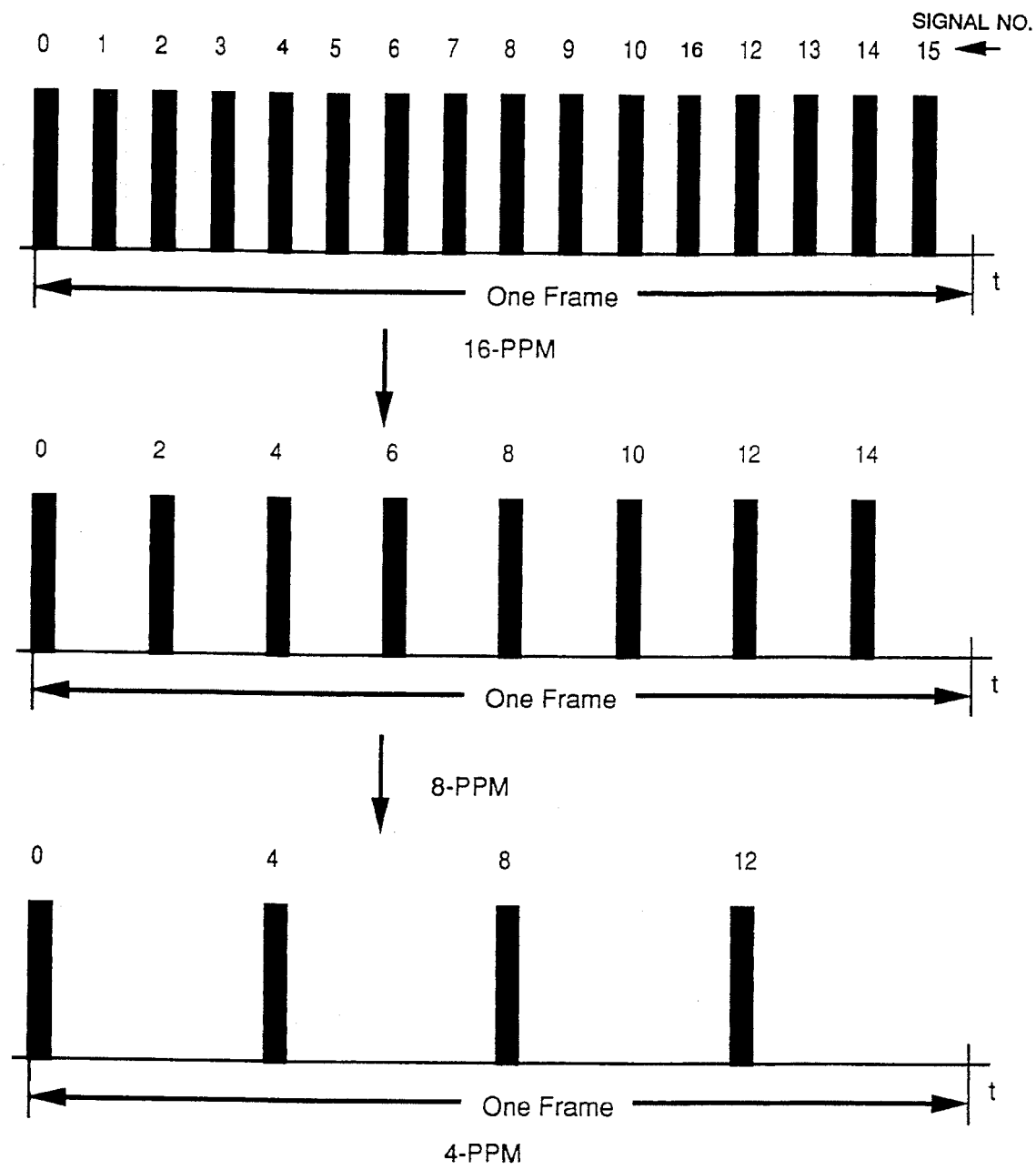
FIG. 10d is a diagram showing the signal structure for the optional M-ary pulse position modulator (PPM)

For M-ary PPM, one of the main causes of symbol errors is poor synchronization and timing jitter. Therefore, a mapping that separates adjacent slots (see explanation of M-ary PPM below) as far as possible in the trellis is preferred. The labeling of signal numbers for M-ary PPM is shown in FIG. 10d. The preferred mapping of bits to symbols is identical to that used for M-ary PSK and is shown in Table 4.

TABLE 6

Bit to Symbol Mapping for 32-ary QAM (FIG. 10c)

| Signal No. | Bits/Symbol | Code Rate | Coded Bits |
|---|---|---|---|
| 0 | 4 | ⅘ | 00000 |
| 1 | 4 | ⅘ | 00011 |
| 2 | 4 | ⅘ | 00010 |
| 3 | 4 | ⅘ | 00001 |

TABLE 5

Bit to Symbol Mapping for 16-ary QAM, (FIG. 10b) (X = Don't Care)

| Signal No. | Bits/Symbol | Code Rate | Coded Bits | $A_5A_4A_3A_2A_1A_0$ | $D_3D_2D_1D_0$ |
|---|---|---|---|---|---|
| 0 | 3 | ¾ | 0000 | 000000 | 0000 |
| 1 | 3 | ¾ | 0010 | 000010 | 0001 |
| 2 | 3 | ¾ | 0100 | 000011 | 0010 |
| 3 | 3 | ¾ | 0110 | 000110 | 0011 |
| 4 | 3 | ¾ | 0001 | 000001 | 0100 |
| 5 | 3 | ¾ | 0011 | 000011 | 0101 |
| 6 | 3 | ¾ | 0101 | 000101 | 0110 |
| 7 | 3 | ¾ | 0111 | 000111 | 0111 |
| 8 | 3 | ¾ | 1000 | 001000 | 1000 |
| 9 | 3 | ¾ | 1010 | 001010 | 1001 |
| 10 | 3 | ¾ | 1100 | 001100 | 1010 |
| 11 | 3 | ¾ | 1110 | 001110 | 1011 |
| 12 | 3 | ¾ | 1001 | 001001 | 1100 |
| 13 | 3 | ¾ | 1011 | 001011 | 1101 |
| 14 | 3 | ¾ | 1101 | 001101 | 1110 |
| 15 | 3 | ¾ | 1111 | 001111 | 1111 |
| 1 | 2 | ⅔ | 000 | 01X000 | 0001 |
| 3 | 2 | ⅔ | 011 | 01X011 | 0011 |
| 4 | 2 | ⅔ | 001 | 01X011 | 0100 |
| 6 | 2 | ⅔ | 010 | 01X010 | 0110 |
| 9 | 2 | ⅔ | 111 | 01X111 | 1001 |
| 11 | 2 | ⅔ | 100 | 01X100 | 1011 |
| 12 | 2 | ⅔ | 110 | 01X110 | 1100 |
| 14 | 2 | ⅔ | 101 | 01X101 | 1110 |
| 2 | 1 | ½ | 00 | 10XX00 | 0000 |
| 4 | 1 | ½ | 01 | 10XX01 | 0100 |
| 11 | 1 | ½ | 10 | 10XX10 | 1100 |
| 13 | 1 | ½ | 11 | 10XX11 | 1000 |

TABLE 6-continued

Bit to Symbol Mapping for 32-ary QAM (FIG. 10c)

| Signal No. | Bits/Symbol | Code Rate | Coded Bits |
|---|---|---|---|
| 4 | 4 | ⅘ | 00110 |
| 5 | 4 | ⅘ | 00100 |
| 6 | 4 | ⅘ | 00111 |
| 7 | 4 | ⅘ | 01000 |
| 8 | 4 | ⅘ | 01011 |

TABLE 6-continued

Bit to Symbol Mapping for 32-ary QAM (FIG. 10c)

| Signal No. | Bits/Symbol | Code Rate | Coded Bits |
|---|---|---|---|
| 9 | 4 | 4/5 | 01010 |
| 10 | 4 | 4/5 | 00101 |
| 11 | 4 | 4/5 | 01110 |
| 12 | 4 | 4/5 | 01001 |
| 13 | 4 | 4/5 | 10010 |
| 14 | 4 | 4/5 | 01111 |
| 15 | 4 | 4/5 | 01100 |
| 16 | 4 | 4/5 | 10011 |
| 17 | 4 | 4/5 | 10000 |
| 18 | 4 | 4/5 | 01101 |
| 19 | 4 | 4/5 | 10110 |
| 20 | 4 | 4/5 | 10001 |
| 21 | 4 | 4/5 | 11010 |
| 22 | 4 | 4/5 | 10101 |
| 23 | 4 | 4/5 | 10100 |
| 24 | 4 | 4/5 | 10111 |
| 25 | 4 | 4/5 | 11000 |
| 26 | 4 | 4/5 | 11011 |
| 27 | 4 | 4/5 | 11001 |
| 28 | 4 | 4/5 | 11110 |
| 29 | 4 | 4/5 | 11101 |
| 30 | 4 | 4/5 | 11100 |
| 31 | 4 | 4/5 | 11111 |
| 0 | 3 | 3/4 | 0011 |
| 1 | 3 | 3/4 | 0001 |
| 5 | 3 | 3/4 | 0000 |
| 6 | 3 | 3/4 | 0010 |
| 7 | 3 | 3/4 | 0100 |
| 8 | 3 | 3/4 | 0110 |
| 14 | 3 | 3/4 | 0101 |
| 15 | 3 | 3/4 | 0111 |
| 16 | 3 | 3/4 | 1001 |
| 17 | 3 | 3/4 | 1011 |
| 23 | 3 | 3/4 | 1000 |
| 24 | 3 | 3/4 | 1010 |
| 25 | 3 | 3/4 | 1100 |
| 26 | 3 | 3/4 | 1110 |
| 30 | 3 | 3/4 | 1111 |
| 31 | 3 | 3/4 | 1001 |
| 1 | 2 | 2/3 | 000 |
| 6 | 2 | 2/3 | 010 |
| 9 | 2 | 2/3 | 001 |
| 12 | 2 | 2/3 | 011 |
| 19 | 2 | 2/3 | 100 |
| 22 | 2 | 2/3 | 110 |
| 25 | 2 | 2/3 | 101 |
| 30 | 2 | 2/3 | 111 |
| 3 | 1 | 1/2 | 00 |
| 14 | 1 | 1/2 | 01 |
| 17 | 1 | 1/2 | 10 |
| 28 | 1 | 1/2 | 11 |

Although one embodiment of adaptive encoder 104 has been disclosed herein, there are alternative embodiments that may be desirable for certain applications.

For instance, the convolutional encoder may take the form of a generalized controlled redundancy encoder that maps inputs of j bits to outputs of l bits for a code rate of j/l (l>j). For example, the CCITT Standard V.32 (CCITT Blue Book, *Data Communications over the Telephone Channel*, Melbourne, 14–25 Nov. 1988) modem employs a nonlinear rate 2/3 encoder with 2 additional uncoded bits. The overall code rate is 4/5 and the 5 output bits are mapped onto a 32-QAM constellation. The present invention would operate with this scheme at a symbol rate of 2400 symbols per second and at data rates of 4800, 7200, and 9600 bits per second. The corresponding signal constellations would be 8-ary, 16-ary, and 32-ary and would preferably be subsets of the 32-QAM constellation such as those shown in FIG. 10c.

Furthermore, the code rate of the convolutional encoder does not have to take the form of rate K/K+1. One could map from a 4-ary to a 16-ary constellation, skipping the 8-ary constellation, for example.

In the preferred embodiment, the highest order signal set has 16 elements and the highest data rate is 3 bits per symbol. This system is preferred when the mean signal-to-noise ratio is about 10 dB and the fading is Rayleigh distributed. However, on channels with higher mean signal-to-noise ratios, data rates of 4 bits per symbol and higher can be supported for substantial amounts of time and in in these cases, higher order signal sets should be used.

Also, signal sets in greater than two dimensions can be used according to prior art implementations to increase coding gain.

Furthermore, for a given trellis encoder, alternative mappings to those presented herein may be preferred depending on the particular trellis code, the signal set, and the signal impairments on the channel.

In addition, the parallel to serial conversion, serial to parallel conversion, and variable bit shifting functions performed by first counter 208, second counter 210, first shift register 204, second shift register 206, and NAND gates 218, 302, and 304 could alternatively be performed by other logic circuits, in memory, or in software. In general, these components comprise first adaptive data transfer circuit 56 (see FIG. 1) that has several possible implementations.

Mapper 214 can also take several forms such as ROM, PROM, EPROM, $E^2$PROM, RAM, logic circuits, or software, and may output other than k+1 bits if the form of the M-ary modulator 112 requires it.

In a full duplex communications system, each frame may include rate change information as overhead. This overhead degrades throughput and consequently, large frame sizes are desirable to reduce the overhead burden. However, since the data rate cannot normally change during a frame transmission, large frames hamper the modem's ability to adapt to rapid channel variations. An alternative embodiment employs a variable frame size that adapts to channel conditions. One method for dynamically adjusting frame size is to monitor the frame error rate with an error detection code of known design. The frame error rate is defined as the ratio of number of frames with one or more errors to the total number of frames observed in a predetermined observation time. When the frame error rate exceeds a predetermined threshold, FERMAX, the frame size is lowered to the next smaller size. When the frame error rate is less than a second predetermined threshold, FERMIN, the frame size is raised to the next larger size. Thus, the frame size is dynamically adjusted to maximize throughput.

Also, adaptive equalizers and echo cancellers of known design may be integrated in the present invention by one skilled in the art when these components are required for wireline or other channels that require equalization or echo cancellation.

And for channels with rapid fluctuations that cannot be tracked effectively, a short interleaver of known design (see B. Sklar, 1988) can be used to help the adaptive decoder correct the resulting burst errors.

M-ary Modulator 112 (FIGS. 13–17)

The present invention is designed to interface with a variety of bandwidth efficient modulators of known design. We shall describe the interface between adaptive encoder 104 and M-ary modulator 112 to facilitate the efficient construction of the invention by one skilled in the art. Of the many bandwidth efficient modulators known, five are most common: M-ary Phase Shift Keyed (PSK), M-ary quadrature amplitude modulation (QAM), M-ary Differential Phase Shift Keyed DPSK, M-ary Continuous Phase Frequency Shift Keyed (CPFSK), and optical M-ary Pulse Position Modulation (PPM).

The selection of the optimal modulator for a particular application depends in a large part on the phase coherency of the channel. M-ary PSK and M-ary QAM are two of the best performing modulation techniques in terms of power and bandwidth efficiency, but both techniques require a coherent phase reference. M-ary QAM also requires an accurate amplitude reference. M-ary DPSK, on the other hand, requires only an accurate estimate of the difference in phase between adjacent symbols in time. If the fading channel has a time-varying phase that precludes an absolute phase reference but the phase varies only a small amount in a single symbol period, then DPSK is a logical choice.

When spectral occupancy must be minimized and an accurate phase reference is not possible, M-ary CPFSK is an option. CPFSK is a bandwidth efficient form of frequency shift keying that can be demodulated noncoherently. To squeeze multiple frequencies in a narrow bandwidth, the CPFSK modulator purposely introduces a controlled form of intersymbol interference that is removed at the demodulator, usually through a Viterbi decoder.

On optical channels, a popular choice of modulation is M-ary PPM. This technique divides each signaling period, called a frame, into M slots. The M-ary PPM receiver searches each slot for the signal and determines the correct $\log_2 M$-bit word by the particular time slot that is occupied in each frame. In each case, higher values of M mean more bits can be sent per frame, thus increasing the data rate. However, the higher the value of M, the higher the signal-to-noise ratio that is required to send information reliably. On a time-varying channel, the present invention matches M to the time-varying signal-to-noise ratio and consequently raises the average data rate or throughput.

Figure 13A:
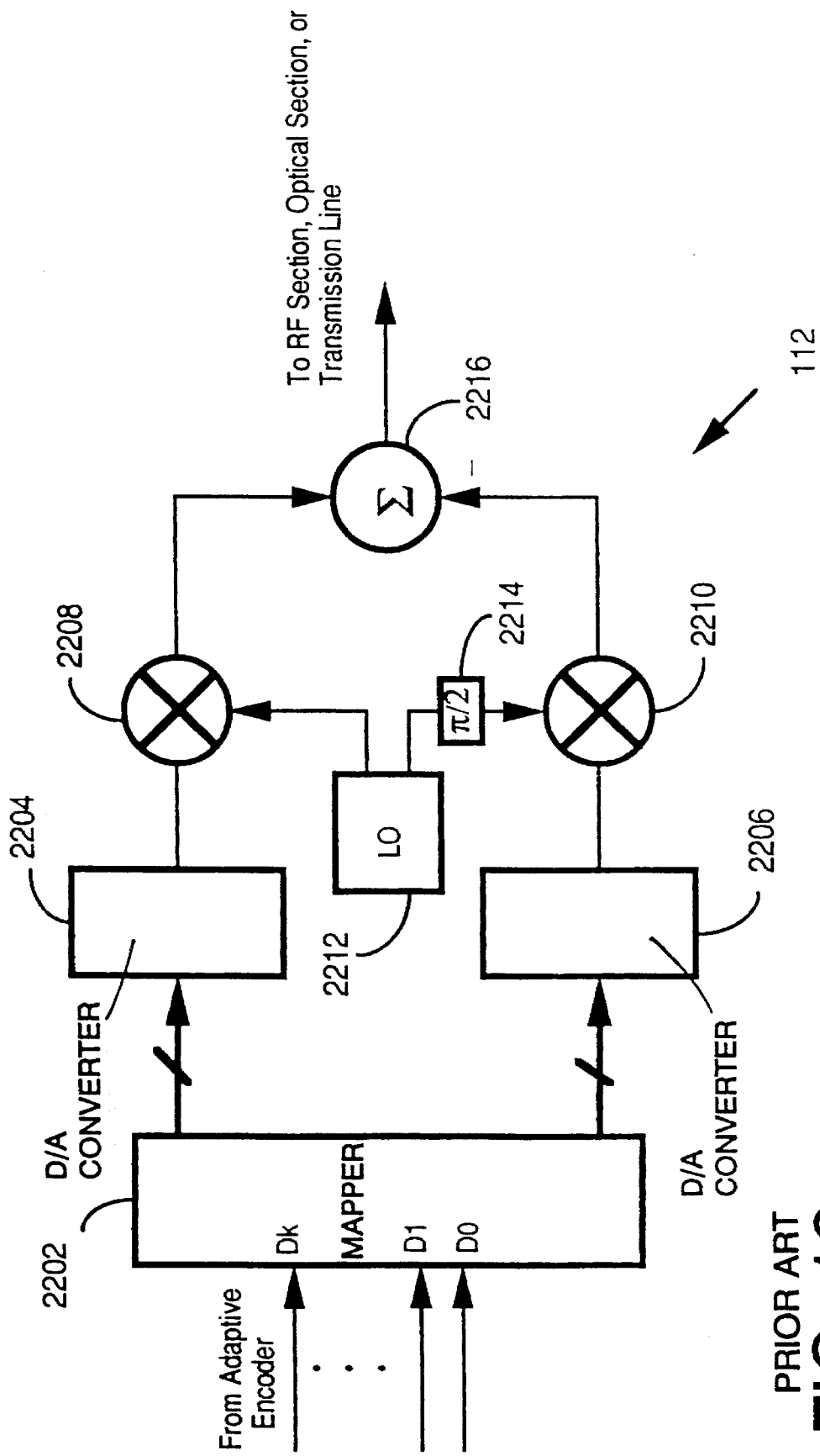
FIG. 13a is a diagram showing the basic configuration of an optional M-PSK modulator 112 as used in the present invention.
Figure 14A:
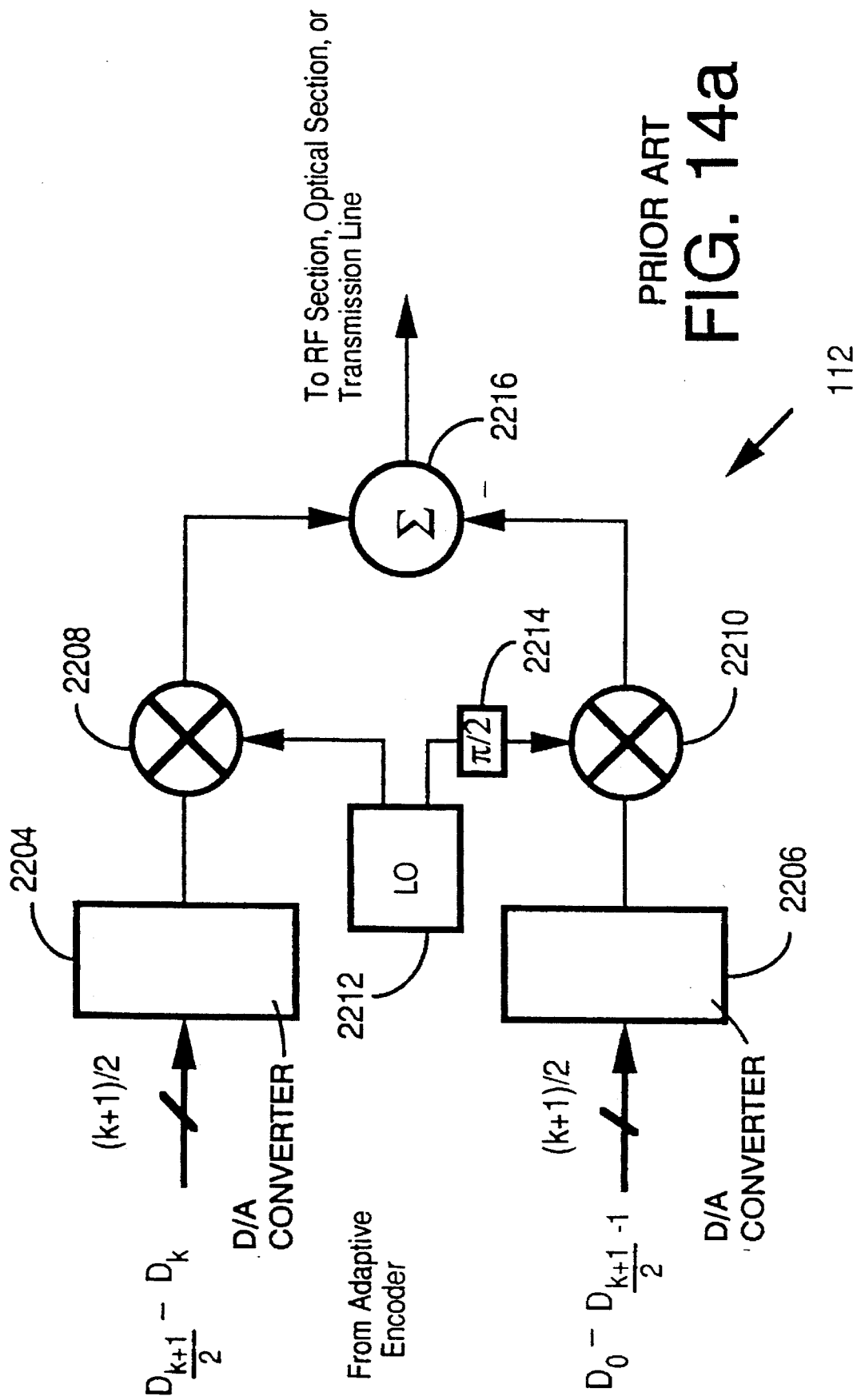
FIG. 14a is a diagram showing the basic configuration of an optional M-QAM modulator 112 as used in the present invention
Figure 15A:
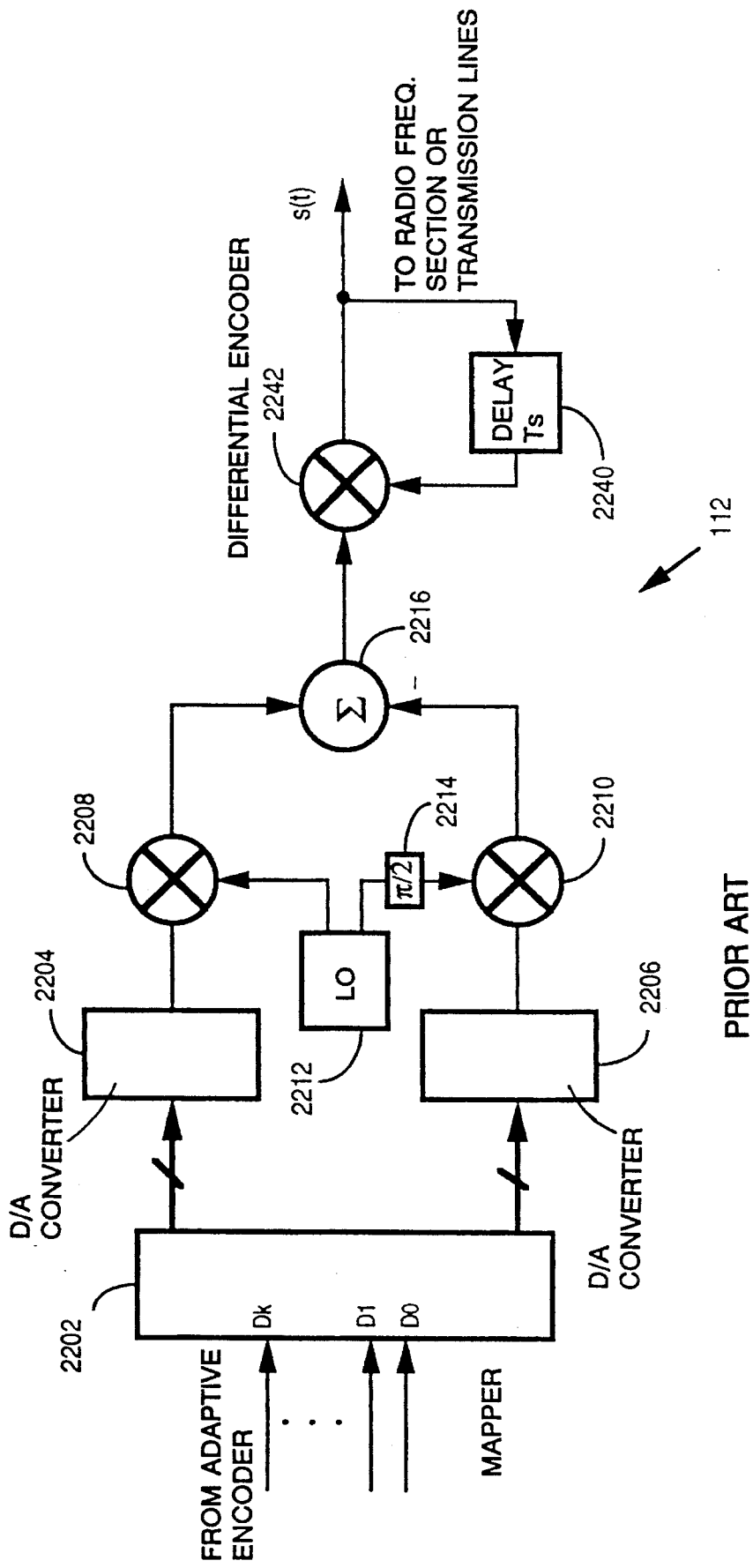
FIG. 15a is a diagram showing the basic configuration of an optional M-DPSK modulator 112 as used in the present invention.
Figure 16A:
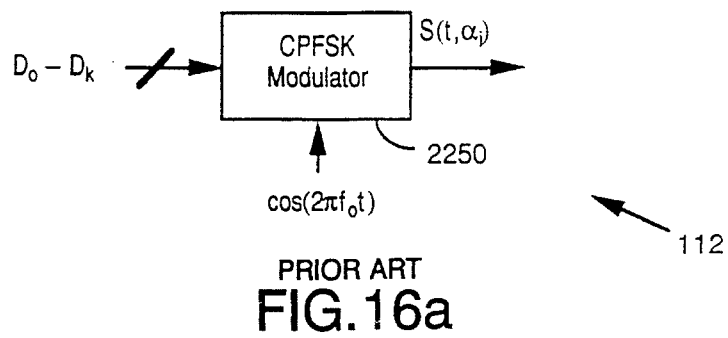
FIG. 16a is a diagram showing the basic configuration of an optional M-Continuous Phase Frequency Shift Keyed (CPFSK) modulator 112 as used in the present invention.
Figure 17A:
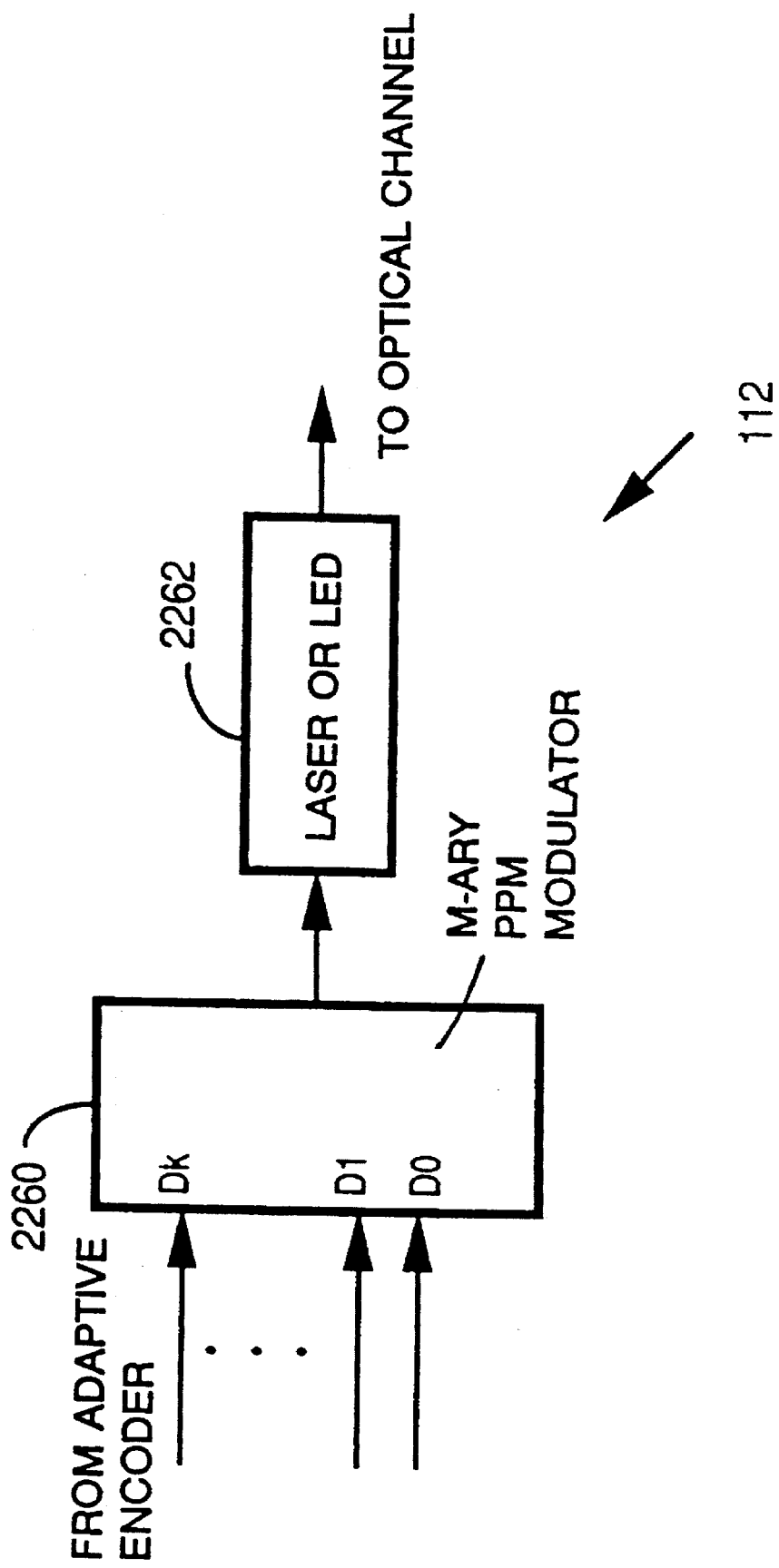
FIG. 17a is a diagram showing the basic configuration of an optional M-PPM modulator 112 as used in the present invention.

FIG. 13a shows a representative M-ary PSK modulator of known design that can be used in the present invention. In FIG. 14a, an M-ary QAM modulator of known design is shown that could also be used in the present invention. FIG. 15a shows an M-ary DPSK modulator that can used in the present invention when an absolute phase reference is not possible or practical. An M-ary CPFSK modulator is shown in FIG. 16a and an M-ary PPM modulator is shown in FIG. 17a.

Referring now to FIG. 13a, the output of the adaptive encoder is mapped onto one of M signals at the M-ary modulator. Prior art M-ary modulator 112 comprises a mapper 2202, an in-phase channel digital-to-analog (D/A) converter 2204, a quadrature channel D/A converter 2206, a local oscillator 2212, a 90 degree phase shifter 2214, multipliers 2208 and 2210, and a summer 2216.

Mapper 2202 is necessary when only k+1 bits are input to the modulator from the adaptive encoder. To represent all M signals in complex space, more than k+1 bits are required. For example, 16-PSK has nine amplitudes on the real axis and nine amplitudes on the imaginary axis for a total of 18 amplitudes. At least 5 bits would normally be required to represent this number of amplitudes. The remaining elements illustrated in FIG. 13a perform M-ary PSK modulation according to the prior art.

Referring now to FIG. 14a, the M-ary QAM version of modulator 112 comprises the same components as in FIG. 13a, but mapper 2202 of FIG. 13a is not required.

Referring now to FIG. 15a, a prior art implementation of an M-ary DPSK modulator comprises an M-ary PSK modulator with a differential encoder included to map each signal in complex space onto a phase difference. The differential encoder comprises a multiplier 2242 and a one symbol delay element 2240.

Referring now to FIG. 16a, the k+1-bit word from the adaptive encoder is fed to a CPFSK modulator 2250 of known design. The CPFSK modulator maps the input word to one of M frequencies. The resulting signal is transmitted over the forward channel.

Referring now to FIG. 17a, the M-ary PPM version of modulator 112 comprises an M-ary PPM modulator 2260 of known design connected to a laser or LED light source 2262. The M-ary PPM modulator maps each k+1 bit word from the adaptive encoder onto one of M pulses per frame. The arrangement of pulses is shown in FIG. 10d.

Although five particular modulation schemes have been presented here, the present invention can also be used with other modulation techniques. For example, in a code division multiple access (CDMA) system, the signal-to-interference ratio is proportional to the number of users that are currently accessing the system. As new users enter the system, the signal-to-interference ratio degrades until the system reaches the operating threshold and further users are blocked. The present invention can temporarily lower the data rate for data users to allow new voice users to access the system when they would normally be blocked. This approach would keep the CDMA system near capacity, thus utilizing the system resources more efficiently.

M-ary Demodulator 114 (FIGS. 13–17)

The corresponding M-ary demodulators for M-ary PSK, M-ary QAM, M-ary DPSK, M-ary CPFSK, and M-ary PPM are shown in FIGS. 13b, 14b, 15b, 16b, and 17b, respectively.

Figure 13B:
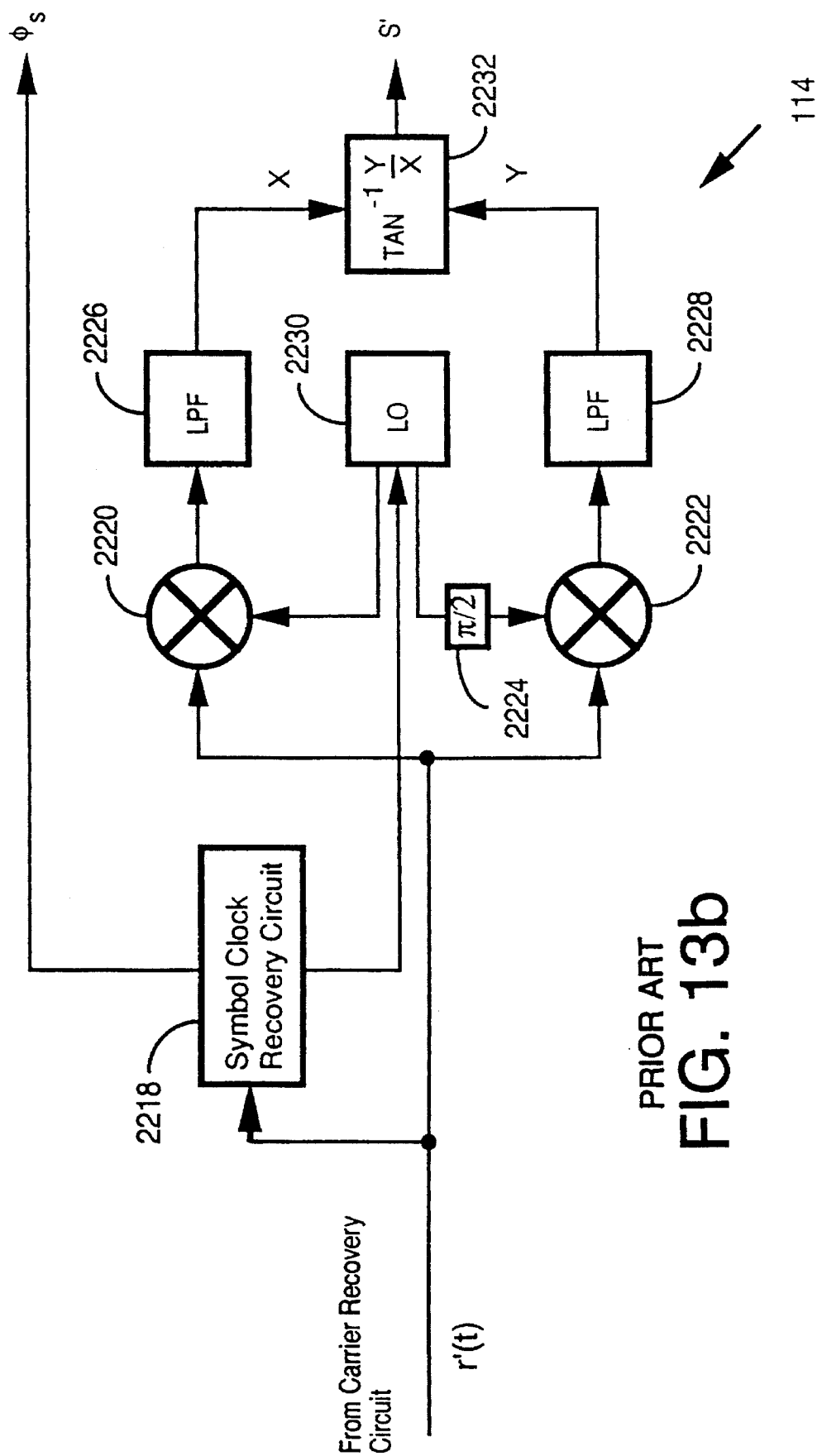
FIG. 13b is a diagram showing the basic configuration of an optional M-PSK demodulator 114 according to the present invention.

Referring now to FIG. 13b, the M-ary PSK version of demodulator 114 comprises a prior art symbol clock recovery circuit 2218, multipliers 2220 and 2222, a 90 degree phase shifter 2224, low pass filters 2226 and 2228, a local oscillator 2230, and a phase computer 2232. This version of demodulator 114 performs quadrature demodulation and phase computation according to a well-known prior art technique. The modulator outputs an replica of the phase, S'.

Figure 14B:
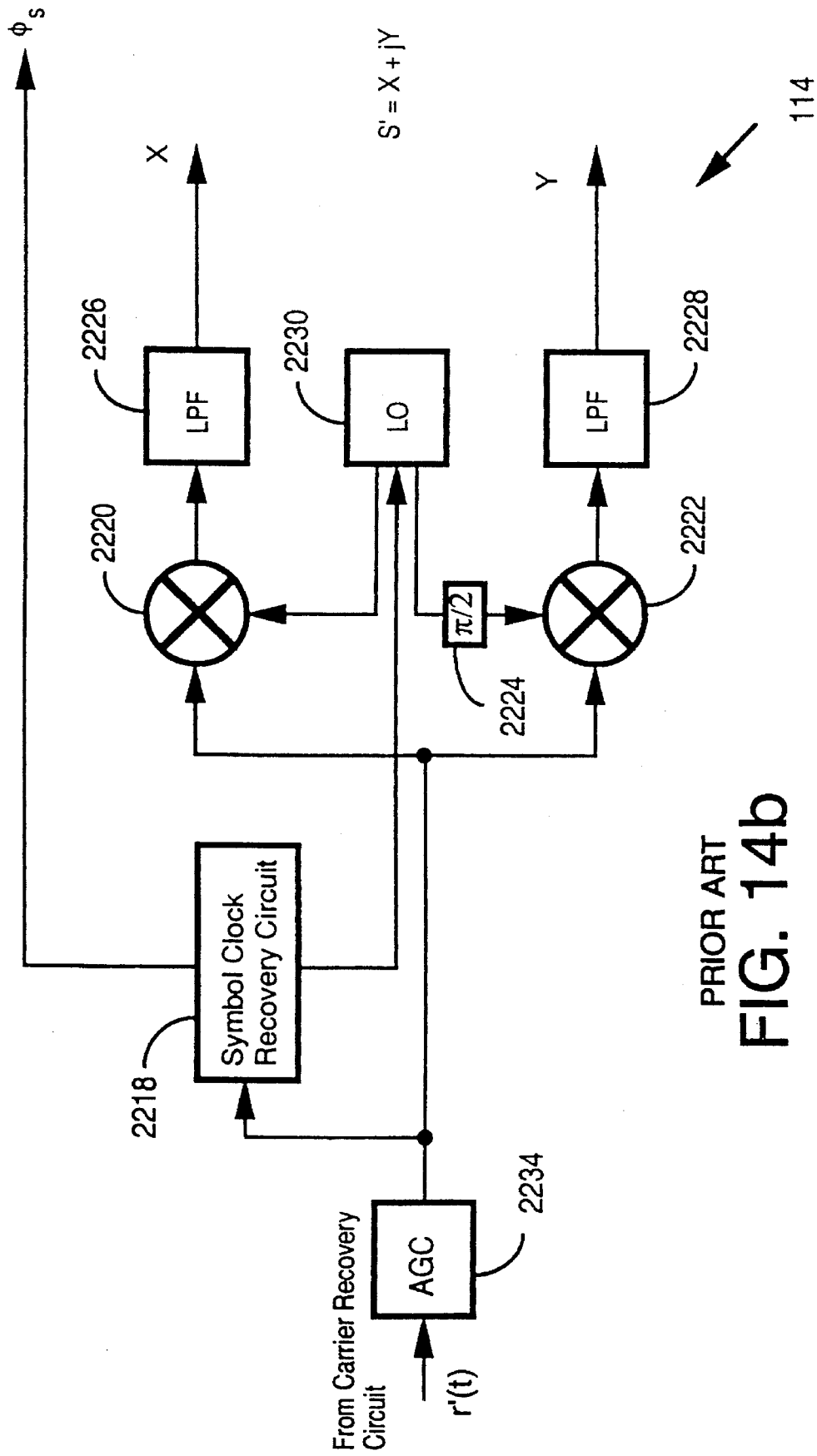
FIG. 14b is a diagram showing the basic configuration of an optional M-QAM demodulator 114 according to the present invention.

Referring now to FIG. 14b, the M-ary QAM version of demodulator 114 comprises a circuit similar to FIG. 13b, with the exception that the phase computer 2232 is not required and an automatic gain control (AGC) circuit 2234 is included to provide an accurate amplitude reference.

Figure 15B:
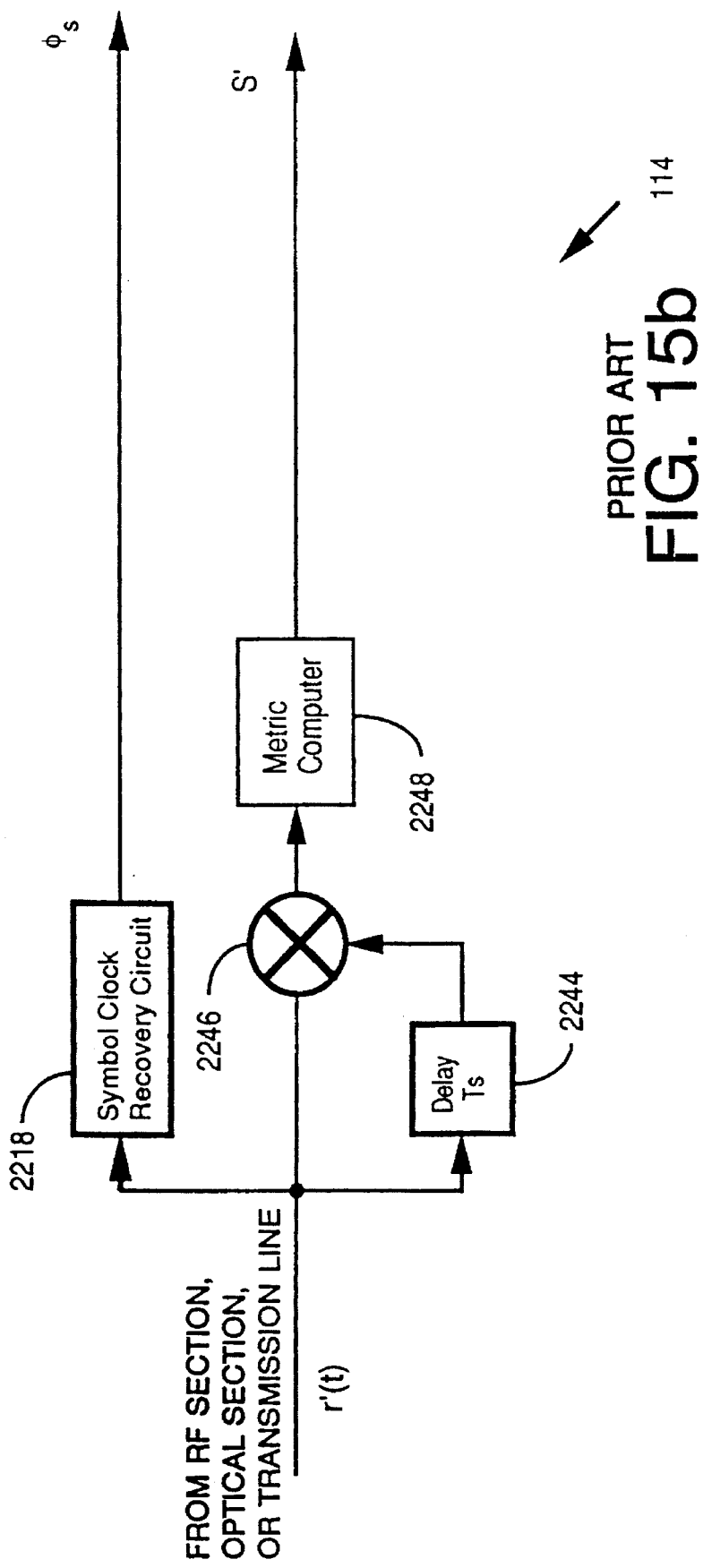
FIG. 15b is a diagram showing the basic configuration of an optional M-DPSK demodulator 114 according to the present invention.

Referring now to FIG. 15b, the M-ary DPSK version of demodulator 114 comprises symbol clock recovery circuit 2218, a multiplier 2246, a delay element 2244, and a metric computer 2248. The multiplier and delay element form a differential decoder and the metric computer maps the resulting signal onto a representative phase difference, S'.

Figure 16B:
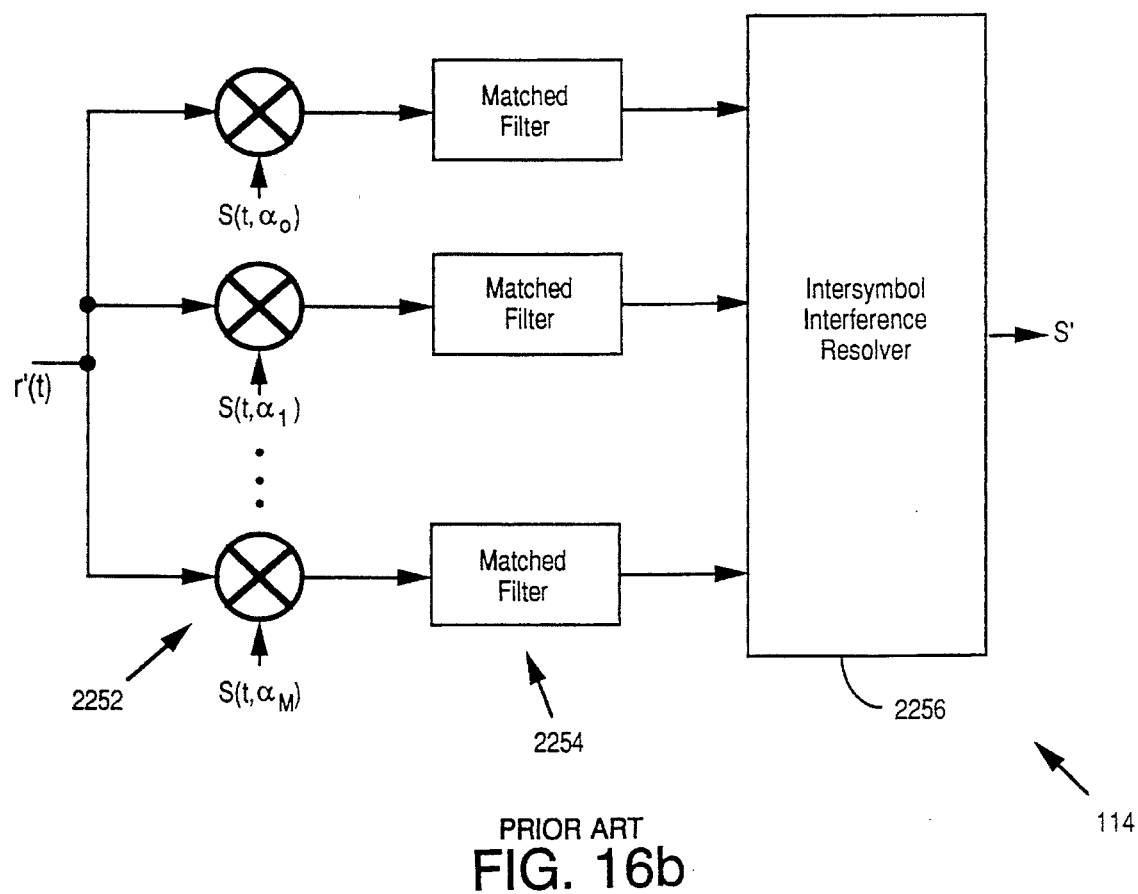
FIG. 16b is a diagram showing the basic configuration of an optional M-CPFSK demodulator 114 according to the present invention.

Referring now to FIG. 16b, the received signal r'(t) is fed to a bank of correlators 2252 and a bank of matched filters 2254 of known design before entering an intersymbol interference resolving circuit 2256. The resulting signal, S' is output to the adaptive decoder.

Figure 17B:
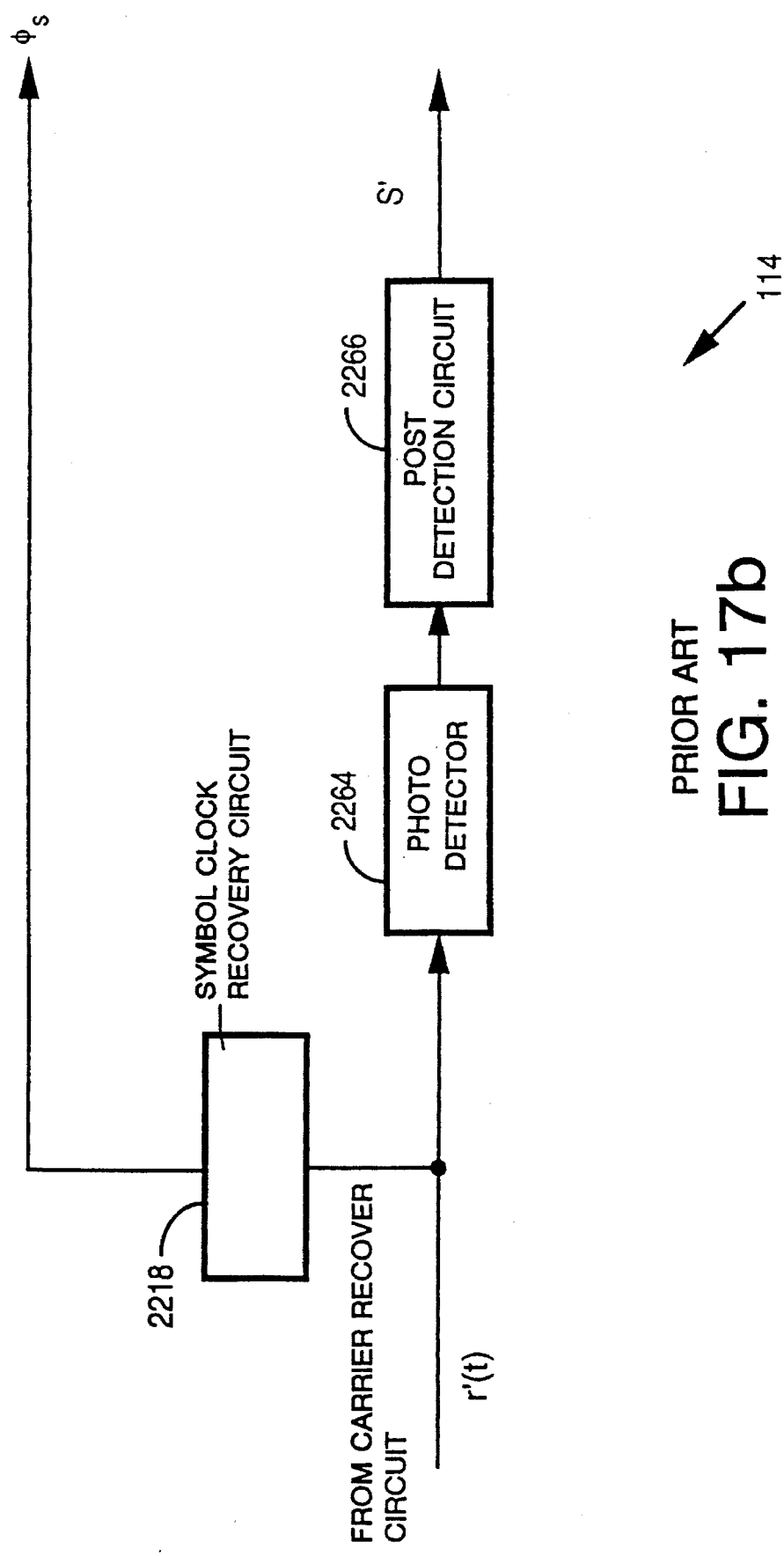
FIG. 17b is a diagram showing the basic configuration of an optional M-PPM demodulator 114 according to the present invention.

Referring now to FIG. 17b, the M-ary PPM version of demodulator 114 comprises a prior art symbol clock recovery circuit 2218, a photo detector 2264, and a post detector circuit 2266. The demodulator outputs a signal S' representative of the particular time slot of the transmitted signal.

Figure 18:
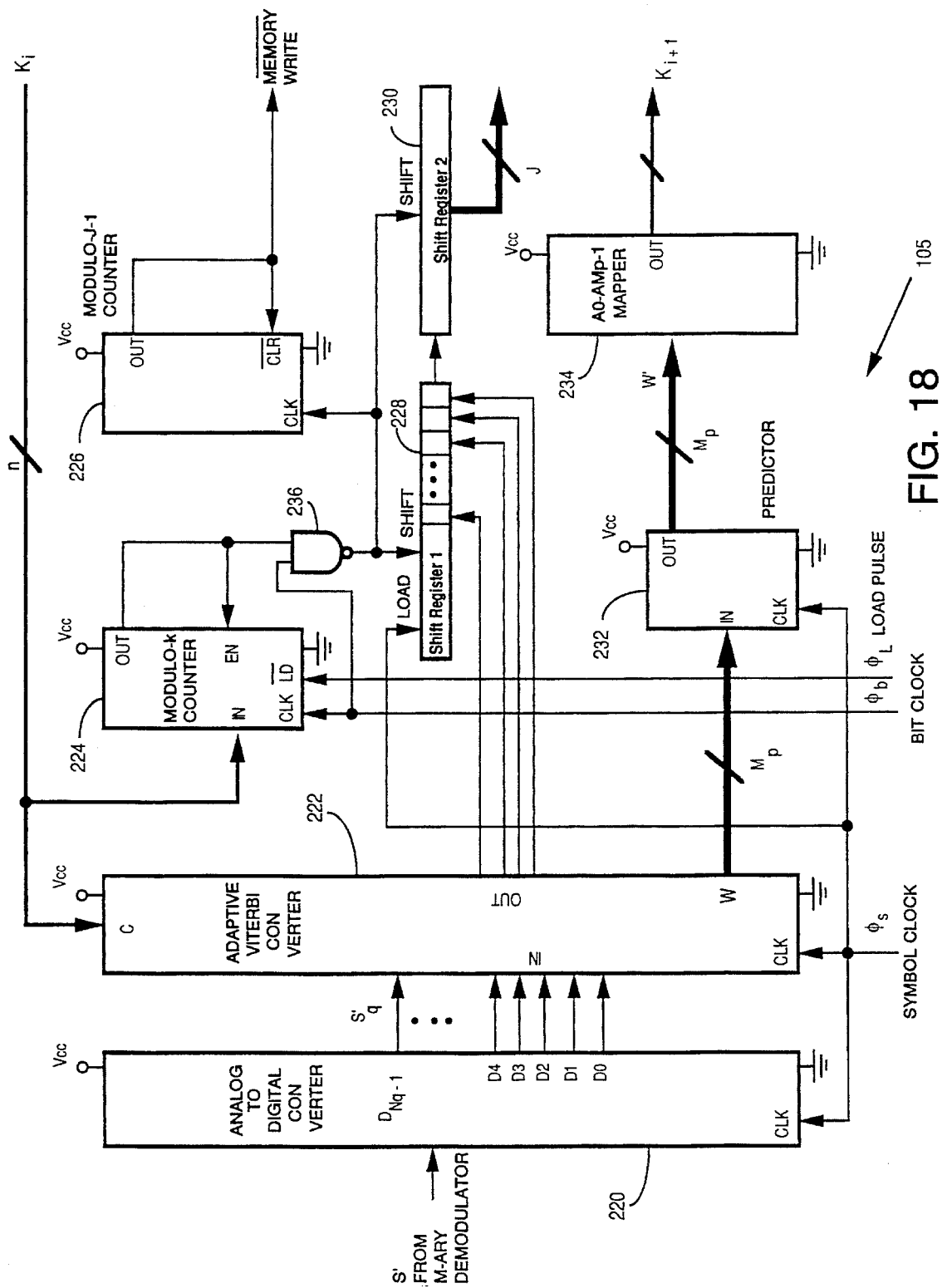
FIG. 18 is a schematic of a generalized adaptive data rate decoder 105.

Generalized Adaptive Decoder 105 (FIG. 18)

Referring now to FIG. 18, the generalized adaptive decoder comprises the following: an analog to digital (A/D) converter 220 ($\log_2 M+1$ bits or larger); an adaptive Viterbi decoder 222; a variable start, modulo-k up counter 224; a modulo-J-1 up counter 226; a NAND gate 236; a k-bit (or larger), parallel in, serial out, shift register 228; a J-bit, serial in, parallel out shift register 230; a signal-to-noise ratio predictor 232; and a mapper 234.

The functions of the adaptive decoder are analog to digital conversion, adaptive soft decision error correction decoding, rate changing, signal-to-noise estimation, signal-to-noise prediction, bit mapping, serial to parallel conversion, and bit manipulation.

The inputs to the adaptive decoder are the following: analog signal from M-ary demodulator 114 (shown in FIG. 2), S', current data rate information, $K_i$, symbol clock, $\phi_s$, bit clock, $\phi_b$ (at a multiple of the symbol clock rate), and load pulse, $\phi_L$.

The outputs from adaptive decoder 105 are the following: decoded bit sequence in parallel, J-bit wide frames, future rate information, $K_{i+1}$, and memory write line.

A/D converter 220 receives the output S' from M-ary demodulator 114 (shown in FIG. 2). The A/D converter quantizes the signal S' and provides an output $S'_q$ comprising bits $D_0$ through $D_{N_q-1}$ to adaptive Viterbi decoder 222. The data rate information $K_i$ is an input to adaptive Viterbi decoder 222 and first counter 224. Adaptive Viterbi decoder 222 transfers a group of decoded bits in parallel to the low-order bits of first shift register 228, which then shifts this data serially to second shift register 230. Second shift register 230 provides a parallel output to RAM 108 (shown in FIG. 2) of J bits. The loading of first shift register 228 with the decoded bits occurs in response to the symbol clock, $\phi_s$, which is connected to the load terminal of first shift register 228.

Modulo-k counter 224 is clocked by bit clock $\phi_b$ and loads the rate data $K_i$ in response to the load signal $\phi_L$ which is connected to the load terminal of first counter 224. The output of first counter 224 is connected to one input of NAND gate 236. The other input of NAND gate 236 is connected to the bit clock $\phi_b$. The output of NAND gate 236 is connected to control the shifting of both first and second shift registers 228 and 230, and is also connected to provide the clock signal for second counter 226. The output of second counter 226 is connected to the memory write line and to the clearing input of second counter 226, so that second counter 226 produces a self-resetting memory write signal when J decoded bits have been shifted to second shift register 230.

Another output of adaptive Viterbi decoder 222 is the estimate of the decoded signal-to-noise ratio, W, which is transferred as $M_p$ bits to predictor 232. Predictor 232 produces an estimate W' of future signal-to-noise ratio which is transferred as $M_p$ bits to mapper 234. Mapper 234 maps the predicted future signal-to-noise ratio W' to the next value for $K_i$, denoted $K_{i+1}$.

Adaptive Viterbi decoder 222 is a means for producing minimum distance decoding of incoming signals. The construction and operating characteristics of adaptive Viterbi decoder 222 and predictor 232 will be described later in more detail.

Figure 19:
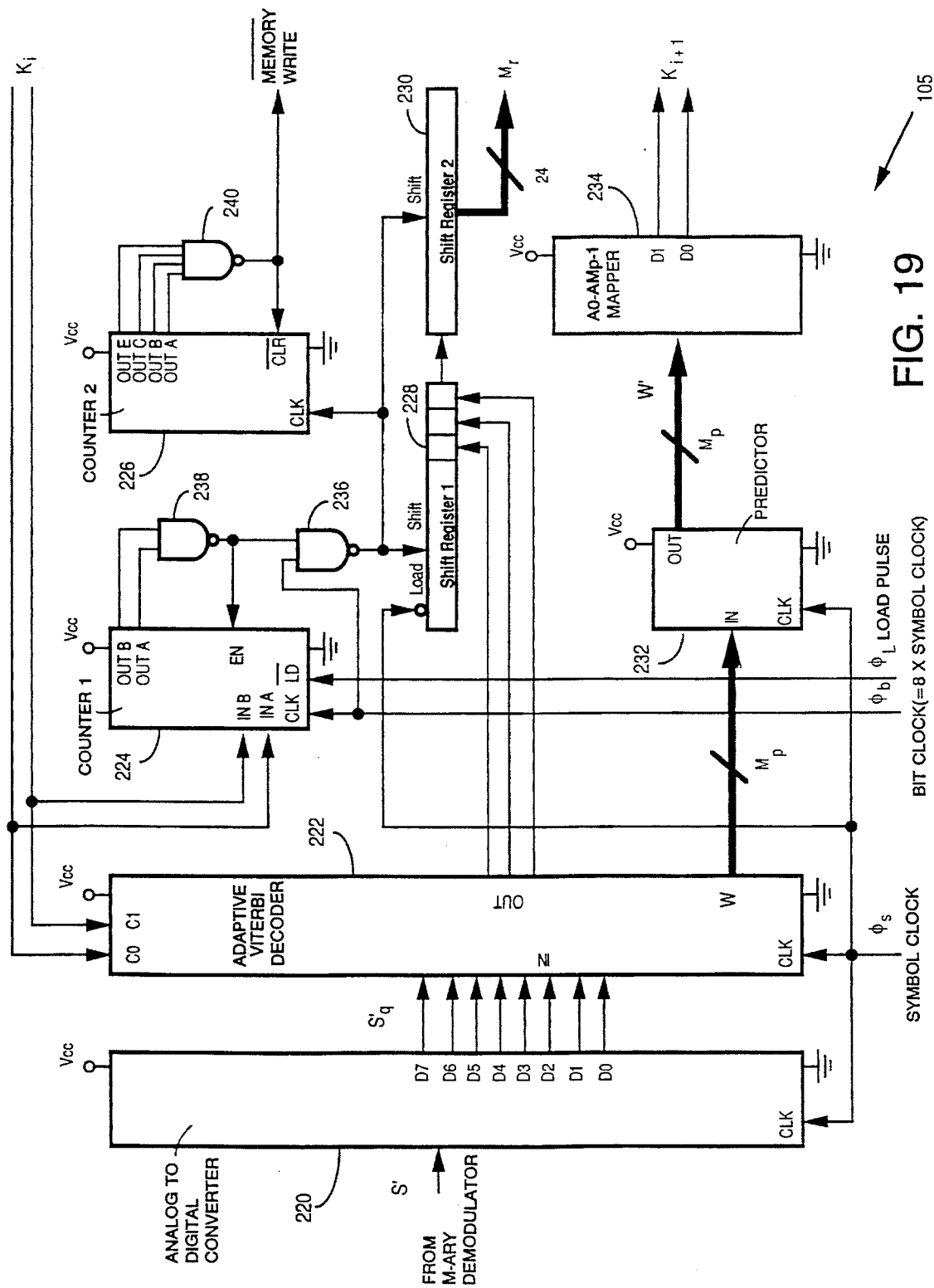
FIG. 19 is a schematic diagram of a preferred embodiment of adaptive data rate decoder 105.

Preferred Embodiment Adaptive Decoder 105 (FIG. 19)

A preferred embodiment of the adaptive decoder is shown in FIG. 19. For purposes of clarity in FIG. 19, only those connections required for explanation of the system operation are shown. Those skilled in the art will appreciate that connections must be made to power supplies, clock signals, and commonly used control signals depending upon the configuration of the components selected. In the preferred embodiment, variables of FIG. 18 take on the values listed in Table 7.

TABLE 7

| Selected Parameters for Preferred Embodiment Additive Decoder 105 | |
|---|---|
| Description | Value(s) |
| Maximum number of data rates, k | 3 |
| Data rates, $K_i$ | 1, 2, 3 bits/symbol |
| Size of data rate word, n | 2 bits |
| Maximum number of channel symbols, M | 16 |
| Frame Size, J | 24 bits |
| Size of quantized received signal, $N_q$ | 8 bits (or larger) |
| Size of signal-to-noise estimate word, $M_p$ | 8 bits (or larger) |
| No. of output lines from adaptive Viterbi decoder 222 | 3 |
| First shift register 228 size | 3 bits (or larger) |
| Second shift register 230 size | 24 |
| Symbol clock rate, $\phi_s$ | Determined by transmitter |
| Bit clock rate, $\phi_b$ | 8 times symbol clock |
| Minimum memory size of mapper 234 | 256 2-bit words |
| Counter 1 224 | Variable start, modulo-3 |
| Counter 2 226 | Modulo-23 |

Referring now to FIG. 19, the preferred embodiment of adaptive decoder 105 comprises A/D converter 220, adaptive Viterbi decoder 222, first, modulo-3 counter 224, second, modulo 23 counter 226, first shift register 228, second shift register 230, predictor 232, mapper 234, and NAND gates 236, 238, and 240.

A/D converter 220 has a preferred output of 8 or more bits. Adaptive Viterbi decoder 222 performs adaptive parallel branch decoding, rate changing, and signal quality estimation. First counter 224 is a variable start, modulo-3 up-counter, and second counter 226 is a modulo-23 up-counter. First shift register 228 is a parallel in, serial out shift register, while second shift register 230 is a serial-in, parallel-out shift register. Predictor 232 predicts future signal-to-noise ratios, and mapper 234 maps the predicted signal onto the proper rate word, $K_{i+1}$, according to a predetermined mapping function.

In operation of adaptive decoder 105, the received analog signal S' from the M-ary demodulator 114 is quantized by analog to digital (A/D) converter 220 and fed to adaptive Viterbi decoder 222.

Adaptive Viterbi decoder 222 attempts to duplicate the path taken through the trellis by adaptive encoder 104 at the sending station, using an improved Viterbi algorithm. The adaptive decoder must perform parallel branch decoding as required to accommodate the 8-ary and 16-ary modulations. The adaptive Viterbi decoder provides two outputs: a decoded three bit word for each channel symbol, and an estimate of the signal quality, W.

Counter 224 and counter 226 perform essentially the same functions as their counterparts in the adaptive encoder. Shift registers 228 and 230 control parallel-to-serial conversion and memory write control.

Predictor 232 uses the current and previous estimates, W, of signal-to-noise ratio to predict the future signal-to-noise ratio corresponding to the next allowable rate changing window. The prediction, W', is used as an address input to mapper 234, which may be implemented as a look up table.

Mapper 234 maps the predicted signal-to-noise ratio to the proper data rate, $K_{i+1}$. This value of $K_{i+1}$ is sent to the transmitter via the feedback channel and is used by microcontroller 106 (shown in FIG. 2) to determine the next data rate.

Although the adaptive decoder estimates the next data rate, in the preferred embodiment, it does not change data rate until it receives a command from microcontroller 106 via the transmitter. In other words, adaptive decoder 105 is a slave to the transmitter. If the channel is fading rapidly, an alternative approach is to have the adaptive decoder change data rate at a set number of symbols after sending the data rate information $K_{i+1}$ to the transmitter. The disadvantage of this second approach is that the transmitter is forced to comply with the receiver's request regardless of conditions at the transmitter to the contrary.

The three timing signals $\phi_s$, $\phi_b$, and $\phi_L$, are identical to the signals used for adaptive encoder 104 except that the symbol clock, $\phi_s$, for adaptive decoder 105 is recovered from the received symbol sequence by timing and control unit 110 which is connected to M-ary demodulator 114 as shown in FIG. 2.

Referring to FIG. 19, each element of the preferred embodiment adaptive decoder is now described in greater detail.

A/D Converter 220. A/D converter 220 preferably uses eight or more bits (256 or more levels) but at least 5 bits (32 levels) are required to allow soft decision decoding with 16-ary signal sets. More levels result in greater coding gain at the expense of decoder complexity.

Adaptive Viterbi Decoder 222. The adaptive Viterbi decoder performs error correction, rate changing, and signal quality estimation. The inputs to the adaptive Viterbi decoder are the quantized receive signal, $S_q'$, from A/D converter 220; data rate information, $K_i$; and symbol clock, $\phi_s$. (see FIG. 19). The outputs are the k-bit output word, and the signal quality estimate, W. The preferred embodiment of these three functions and the employed algorithms are described as follows:

a. Error correction decoding. The adaptive Viterbi decoder is a soft-decision Viterbi decoder improved to perform parallel branch decoding and to change data rates automatically and dynamically without interrupting the decoding process. By soft-decision, it is meant that the decoder operates on metrics quantized to values greater than the M levels of the transmitted alphabet. In the adaptive Viterbi decoder, the structure of the trellis is the indicator of the data rate. The basic trellis is determined by the rate 1/2 code and does not change. The higher data rates (2 bits/symbol and 3 bits/symbol) manifest themselves in the trellis as parallel branches. The parallel branches double the number of available trellis paths for each data rate increase and halve the number of available trellis paths for each data rate decrease. In other words, for 4-ary, there are no parallel branches, for 8-ary, there are 2 sets of 2 parallel branches into each state, and for 16-ary there are 2 sets of 4 parallel branches into each state. This structure is shown in FIG. 12a.

The basic Viterbi algorithm is described in detail in the following documents, incorporated herein by reference: B. Sklar, *Digital Communications Fundamentals and Applications*, Prentice-Hall, Englewood Cliffs, N.J., 1988; G. D. Forney, Jr., "The Viterbi Algorithm," *Proceedings of the IEEE*, Vol. 61, pp. 268–278, March 1973; S. Lin and D. J. Costello, *Error Control Coding: Fundamentals and Applications*, Prentice-Hall, Englewood Cliffs, N.J., 1983; R. E. Blahut, *Theory and Practice of Error Control Codes*, Addison-Wesley, Reading, Mass., 1983. Therefore, the theory of the algorithm will not be repeated in full herein. However, a description of the improved Viterbi algorithm sufficient to enable those skilled in the art to construct the adaptive Viterbi decoder of the present invention is provided below.

Stated concisely, the Viterbi algorithm is in efficient method for selecting the trellis path with the minimum distance from the received symbol sequence. In most applications, it is assumed that the minimum distance path is also the path that minimizes the probability of decoding error. The Viterbi algorithm is efficient because it does not compare all possible trellis paths to the received symbol sequence. Instead, it uses a shortest path algorithm and eliminates paths that could not possibly be the minimum distance path. At each decoding step, some paths are eliminated and others are retained. The retained paths are called survivors. The number of survivors and the number of trellis states are always the same. For example, for the constraint length m=3 code of FIG. 11, there are always $2^{m-1}=4$ survivors.

Strictly speaking, the Viterbi decoder does not correct errors. It selects the allowed sequence of symbols that most closely resembles the received symbol sequence. However, since the decoder reduces the bit-error rate over hard-decision demodulation, it is often called a forward error correction decoder.

The Viterbi algorithm must employ a distance metric to make decoding decisions. In the preferred embodiment, the metric for the adaptive Viterbi decoder is the distance between the received symbol sequence and the time coincident trellis branch for each surviving path. The units of this distance depend on the particular modulation technique employed. For PSK modulation, the distance is a phase angle or Euclidean distance in two dimensional space, for QAM, the distance is Euclidean distance in two dimensional space, for DPSK, the distance is a phase change between the current symbol and the previous symbol or Euclidean distance, and so on. The distance metric at each trellis branch is squared and accumulated to calculate the accumulated distance for each survivor. Mathematically, the accumulated distance for the $r^{th}$ survivor is given by the following equation:

$$W_r = \sum_{i=1}^{n} |S_i' - S_{ij}|^2 \quad r = 1, 2, \ldots 2^{m-1} \qquad \text{(Eq. 3)}$$

where $S_i'$ is the received signal at time increment i, $S_{ji}$ is the allowable signal measure for the $j^{th}$ trellis branch at time increment i, m is the constraint length of the code, and n is the number of symbols transmitted in a complete path before decoding the oldest symbol. Typically, n is four or five times the constraint length of the convolutional code. For example, for the constraint length 3 code of FIG. 11, n equals 12 or 15. In practice, the sum W is usually accumulated until numeric overflow is imminent in the largest of the $2^{m-1}$ sums at which time a constant is subtracted from all survivor sums $W_r$, r=1, 2, ..., $2^{m-1}$. Also, in practice, only the sum $W_r$ is retained in memory, not the intermediate squared differences, $|S_i'-S_{ji}|^2$.

In the preferred embodiment, we take a different approach. Instead of letting the sum $W_r$ accumulate, we subtract the oldest value of $|S_i'-S_{ji}|^2$ from the sum $W_r$. This preferred approach has two disadvantages: (1) it requires more memory to retain the intermediate results $|S_i'-S_{ji}|^2$, and (2) it requires one additional arithmetic operation for each survivor at each symbol period. The reasons for using this approach will become apparent in the discussion of the estimator below.

Figure 20:
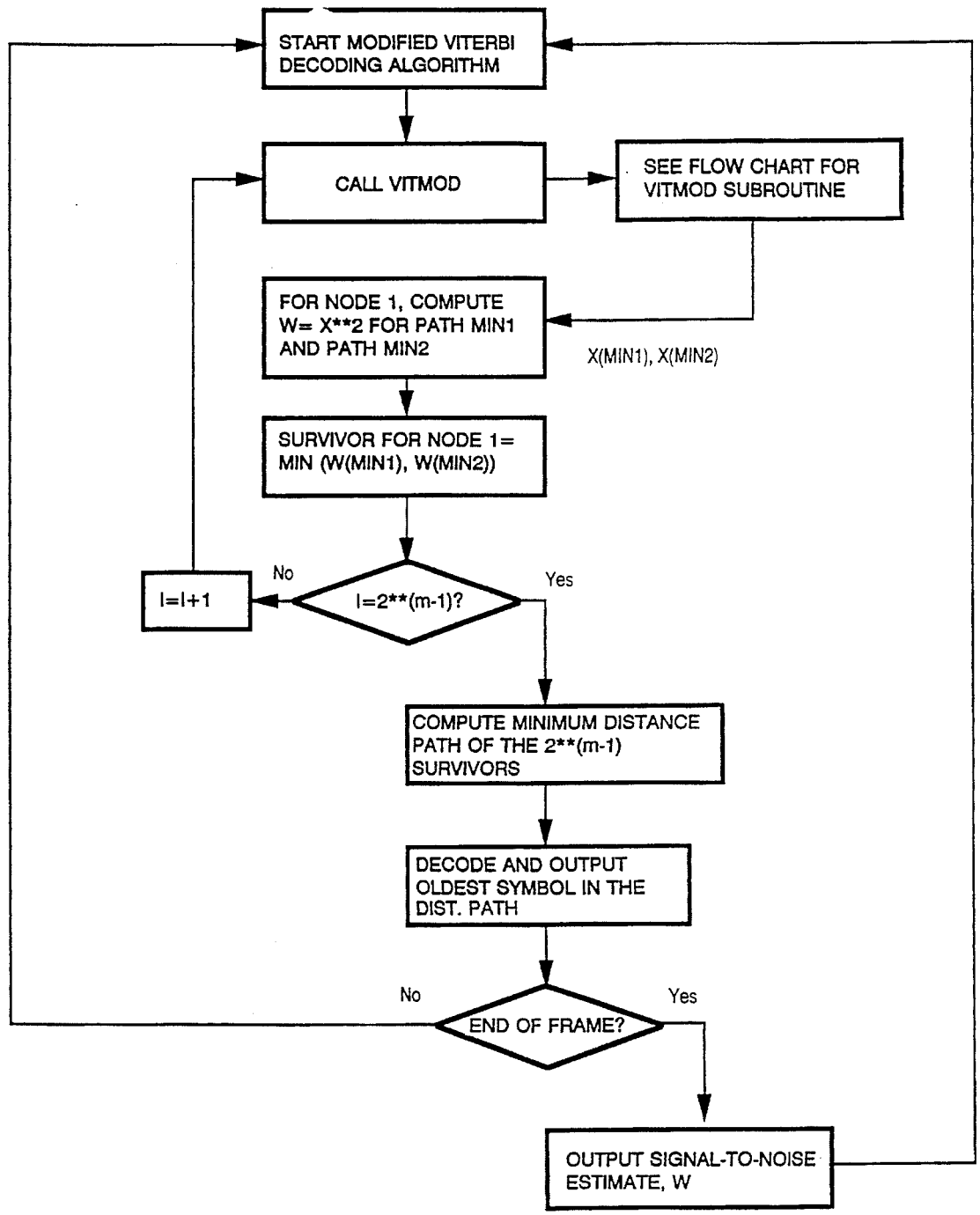
FIG. 20 is a flowchart showing the operation of adaptive Viterbi decoder 222 of the present invention.

In the preferred embodiment, an improved Viterbi algorithm is employed to decode the 4-ary (1 bit/symbol) trellis. A modified Viterbi algorithm is used to decode the higher order trellises. The difference between the conventional soft decision Viterbi algorithm and the modified algorithm is that additional difference equations must be computed for the higher order trellises. The algorithm for the basic 4-ary circuit will be described first, followed by a description of modifications to accommodate higher order trellises. FIG. 20 shows a flow chart detailing the operation of the adaptive Viterbi decoder.

For the 4-ary trellis, the Viterbi algorithm examines the two branches entering each state, computes the accumulated distance given by Equation (3) above for each path, and eliminates the path with the largest accumulated distance. This same calculation is performed for each state, and the remaining paths are called the survivors. Note that there are two branches entering each state for a rate 1/2 convolutional code. However for other code rates, there may be more than two branches entering each state. For example, the rate 2/3 convolutional encoder used in the CCITT V.32 modem has three branches entering and leaving each trellis state. The approach is the same, there are simply two paths that must be eliminated instead of one. Thus, at each state, the decoder calculates the distance between the received symbol and the allowed symbol represented by each trellis branch, squares the result, adds it to the survivor at the previous connected state, compare, and selects the minimum distance path at each new state.

Figure 11B:
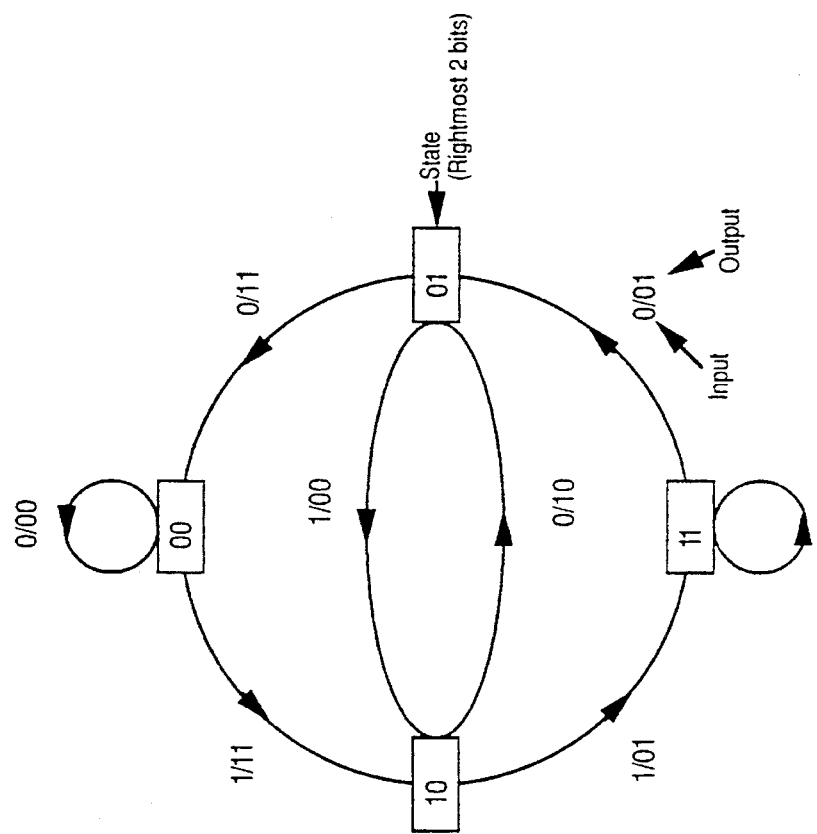
FIG. 11 is a schematic diagram and state diagram of an exemplary convolutional encoder 212.
Figure 11A:
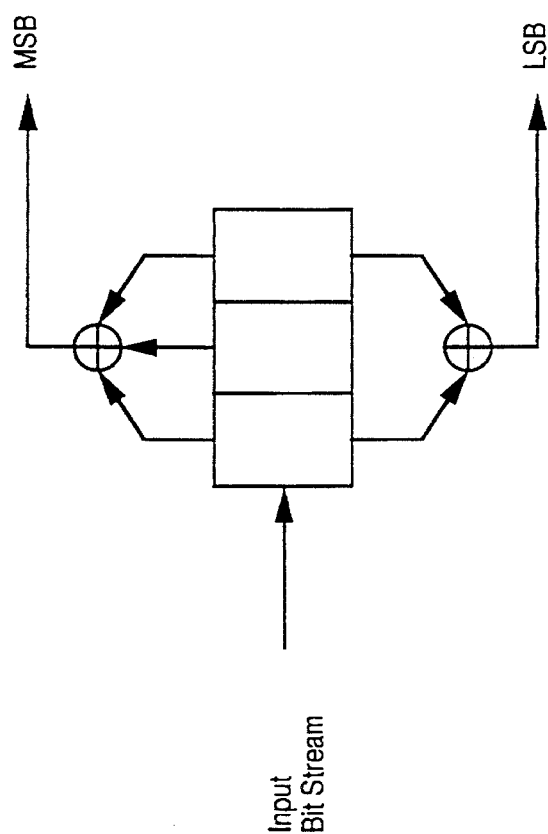
Figure 21:
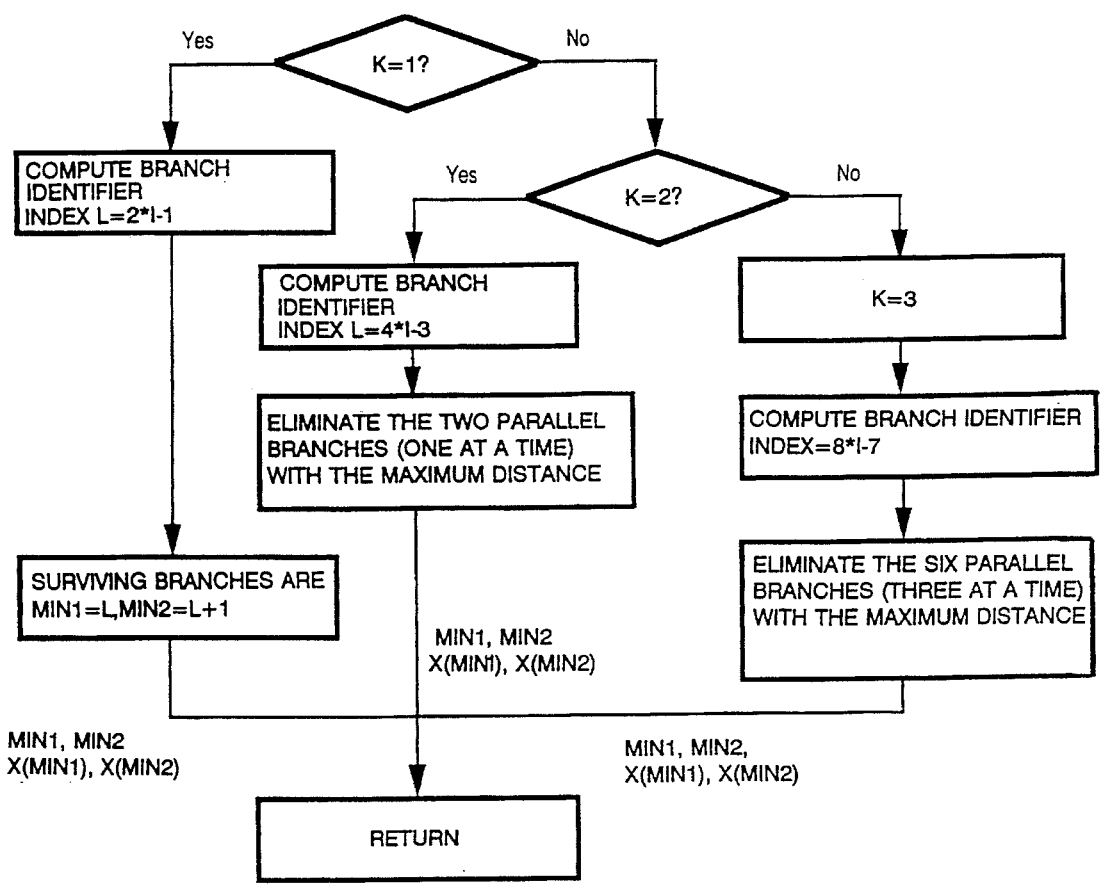
FIG. 21 is a flowchart showing the operation of the VITMOD subroutine of the flowchart of FIG. 20.

The basic approach to parallel branch decoding, as implemented in the preferred embodiment, is to eliminate parallel branches until the trellis resembles the basic 4-ary trellis and then perform conventional soft-decision Viterbi decoding. At this point, the only remaining difference between conventional Viterbi decoding and our modified decoding algorithm is that the decoder must keep track of whether a decoded trellis branch represents a 1 bit, 2 bit, or 3 bit symbol and the decoder must know precisely which symbol is decoded. Since the decoder always knows the current data rate and the decoded branch, this can be done with a simple look-up table. Since the parallel branches originated from same state and enter the same state, the one (8-ary) or three (16-ary) parallel branches with the larger distance(s) can be eliminated immediately, leaving only two branches (one each from different previous states) entering the state. In other words, these branches can be eliminated by simple difference equations, without the squaring and summing which is required in the basic Viterbi algorithm. Thus, the number of additional computations to accommodate the higher order signal sets is minimal. Furthermore, since the number of states does not change, the path memory requirements do not change from the basic 4-ary trellis. As an example, the parallel branch elimination algorithm for the constraint length 3 convolutional code of FIG. 11 is implemented in the Fortran 77 subroutine of Appendix A. A flow chart for this subroutine is shown in FIG. 21 (subroutine VITMOD).

The parallel branch decoding structure of the invention provides a simplified decoding algorithm that minimizes processing requirements and allows a continuous, uninterrupted path through the trellis, regardless of the number or type of data rate changes. Although the improved Viterbi algorithm disclosed herein is preferred, other sequence decoding algorithms may be used. It is preferable that whatever algorithm that is used, that a continuous path is created through the trellis to enable uninterrupted rate changing.

b. Rate Changing. The current data rate can be determined by inspection of the decoder trellis. Each increase in data rate increases the number of branches entering a state by a factor of two. For example, in the preferred embodiment, the basic trellis (1 bit/symbol) has two branches entering each state. The next higher rate (2 bits/symbol) has four branches entering each state. The highest rate (3 bits/symbol) has eight branches entering each state. The decoder will continue to decode uninterrupted through a rate change because there is always a continuous path through the trellis. As long as the decoder is working properly according to the algorithm disclosed in section (a) above, the data rate changes will occur automatically because the number of bits per symbol output from the decoder will determine the data rate. In the preferred embodiment, the number of bits per symbol or equivalently, bits per decoded branch, is 1 for the trellis of FIG. 12a (1), 2 for FIG. 12a (2), and 3 for FIG. 12a (3). The actual data rate in bits/second is simply the number of bits per symbol multiplied by the symbol rate in symbols/second.

c. Signal quality estimation. The objective of the estimator is to use the soft decision metrics of the decoding algorithm to estimate signal quality. Actually, the estimator outputs a number, W, that is roughly the multiplicative inverse of the signal-to-noise ratio, but the precise relationship between W and the new data rate $K_{i+1}$ is resolved by mapper 234. In the following discussion, we shall refer to W as the estimate of the signal quality with the understanding that W is inversely related to the signal-to-noise ratio. In other words, a large W indicates a low signal-to-noise ratio and a small W indicates a high signal-to-noise ratio. However, since the estimation algorithm is tied to the incoming symbol sequence and not the channel signal-to-noise ratio, any impairment that tends to cause errors will be detected.

A significant advantage of the present invention is that the signal-to-noise estimate, W, is already computed by the adaptive Viterbi decoder as described in section (a) above. In other words, the estimate is simply the accumulated distance for the minimum distance survivor, i.e.

$$W = \min_r \sum_{i=1}^{n} |S_i' - S_{ji}|^2 \quad r = 1, 2, \ldots 2^{m-1} \quad \text{(Eq. 4)}$$

Thus, the signal quality estimate W is automatically computed by the adaptive Viterbi decoder and no additional processing is required to compute the estimate. Another advantage of the estimator is that the estimator recovers automatically from deep fades or loss of rate synchronization.

This advantage results from an inherent property of the Viterbi decoder that when the received symbol sequence is very noisy, all survivor accumulated distances will be high, including the minimum distance survivor. Thus, when modem 102 encounters a deep fade or is operating incorrectly at too high a data rate, all survivors will have high accumulated distances and the estimator will direct a lowering of data rate. In very deep fades or very high noise levels, modem 102 will cease sending information bits and will instead send a training sequence of known values. The estimator does not care what sequence is sent, it will continue to estimate and when the signal-to-noise ratio is again above threshold, it will recover automatically.

Several enhancements to the estimator are possible:

First, as the channel enters a deep fade there are 5m (e.g. 15 for constraint length m=3) symbols still in the decoder and these must be flushed before a probing sequence can be sent. Unless a predictor is used, these 5m symbols will have a high probability of error. One enhancement is to repeat the last s, (s≦5m) symbols transmitted before entering the probing mode. Throughput suffers slightly, but the system avoids the high probability of symbol error that will occur when symbols are transmitted during a fade.

Second, the estimator's sample size, n, may be shortened to provide a more rapid response time at the expense of some accuracy. A smaller sample size also saves memory.

Third, the samples chosen do not necessarily have to be the most recent n metrics. Samples taken closer to the decision point in the symbol sequence may be more accurate.

Fourth, the return channel does not necessarily include a Viterbi decoder. A Viterbi decoder in the return channel delays the system's response.

The system designer must determine appropriate tradeoffs for the particular application. A convenient sample size is the decoding depth, and this sample size has been selected for use in the preferred embodiment.

While a preferred method for estimation is presented here, many variations of this approach are possible, and variations of the preferred method may be desirable in specific applications. For example, signal quality can be estimated based on the distance between the minimum distance path and the closest survivor, rather than the distance between the minimum distance path and the received symbol sequence. The reason for using a pair of survivors is that if the minimum distance path and one other survivor become too close, a decoding error may be imminent, and a reduction in data rate is justified. On the other hand, if one path is very distant from the other survivors, the signal-to-noise ratio is probably high and an increase in data rate is justified. The advantage of this approach is that fewer calculations are required. The accumulated distance is already computed for each survivor by the error correction decoding algorithm and the survivors are already compared to find the minimum distance path.

Also, the modem can estimate the signal quality in many different ways. Three alternatively preferred methods will be discussed. In the first alternative method, the input is compared to $S_q'$, the decoded output, knowing that the decoded output corresponds to a point in the signal space. The difference between the two can be used as a signal-to-noise ratio estimate. The advantage of this method is that it is inherently faster than using the adaptive Viterbi decoder because of the processing delay in the Viterbi decoder. This method could also be used with a least squares algorithm as described below. In the second method, an external error-detecting code such as a cyclic redundancy check (CRC) is used to estimate the error performance and in turn the signal-to-noise ratio. The second method is less preferred since it offers no way of estimating how good the channel is, only how bad. A third method also avoids the Viterbi decoder and uses the automatic gain control circuitry (AGC) in forward channel receiver 66 (shown in FIG. 1) to estimate the signal-to-noise ratio.

Figure 22:
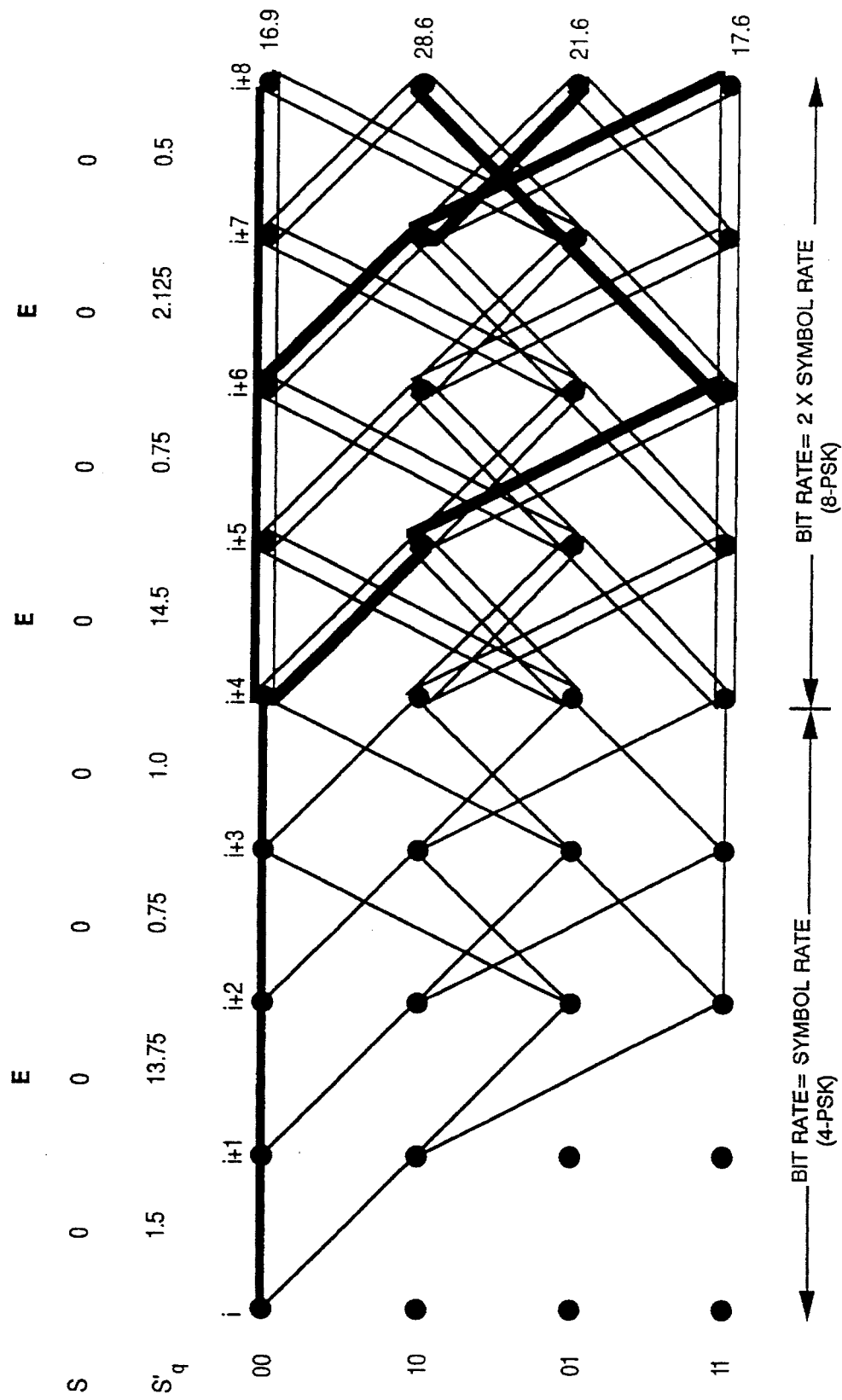
FIG. 22 demonstrates decoding of a sample symbol sequence where the data rate changes from one bit per channel symbol (4-PSK) to two bits per channel symbol (8-PSK)

FIG. 11 shows a constraint length 3 convolutional encoder for use with the present invention. The trellis diagrams for this convolutional encoder are shown in FIG. 12, and a sample decoding sequence is shown in FIG. 22. In FIG. 22, S is the symbol transmitted, $S_q'$ is the quantized received signal from A/D converter 220, and the notation "E" shows which branches would be demodulated in error if Viterbi decoding were not used. The surviving paths at branch i+8 are shown in bold. The numbers shown to the right of the i+8 branch nodes are the sums of the squares of distance for each path. These numbers are used to compute W. The value of W for the minimum distance path (i.e. the decoded path) will be used to estimate the signal quality once the appropriate decision depth is reached. In FIG. 22, the data rate changes from one bit per channel symbol (4-PSK) to two bits per channel symbol (8-PSK). The estimate W is 2.76 for the first four branches, and 2.53 for the last four branches (n=4). Therefore, the estimated signal-to-noise ratio is increasing in the example of FIG. 22, consistent with the rate change from K=1 to K=2. In practice, a larger decoding depth would be used before making rate changing decisions to ensure a more accurate decision.

The use of the decoding hardware to estimate signal to noise ratios, as disclosed herein, provides several unobvious advantages. No additional hardware is needed, additional computations can be eliminated, and design complexity is reduced. Furthermore, channel impairments other than low signal-to-noise ratio can be detected or corrected with this approach.

Shift Registers and Counters 224, 226, 228, 230. Referring again to FIG. 19, counter 226 of adaptive decoder 105 performs substantially the same function as counter 210 in adaptive encoder 104. However, instead of activating a memory read line, the counter activates a memory write line when shift register 230 is full. The relative timing of the signals produced is shown in FIG. 9.

Shift register 228 is a parallel in, serial out, shift register. The three data bits from the adaptive Viterbi decoder are loaded into shift register 228 by the rising edge of the symbol clock $\phi_s$ pulse. Bits are shifted out serially under control of counter 224. If the data rate, $K_i$, is 2 or 1 rather than 3, the most significant bit(s) will be automatically ignored since they will never be shifted into shift register 230. The timing diagrams for counter 224 are shown in FIG. 8.

Shift register 230 is a 24-bit serial in, parallel out shift register. When shift register 230 is full, the MEMORY WRITE line from counter 226 initiates a write from shift register 230 to memory.

Predictor 232. An optional but useful component of adaptive decoder 105 is signal-to-noise ratio predictor 232. Because of propagation and processing delays, the signal quality estimate, W, from adaptive Viterbi decoder 222 may be out-of-date by the time adaptive encoder 104 can adjust the data rate. The predictor helps overcome this problem by predicting the signal quality, W', at the time of the next allowable rate change. The need for the predictor depends on the range of amplitudes encountered at M-ary demodulator 114 and the fading rate. On slowly fading channels, the predictor is not necessary and the estimate W can be mapped directly to the new data rate $K_{i+1}$. On rapidly fading channels, however, the predictor will improve the accuracy of data rate changes.

Predictor 232 predicts the signal-to-noise ratio for future channel symbols for the purpose of estimating the correct data rate, $K_{i+1}$. Specifically, predictor 232 predicts the future signal-to-noise ratio at time t+j, (j is an integer), the time of the next allowable rate change. Mapper 234 then maps this signal-to-noise ratio to the correct data rate. In the following discussion, the terms signal-to-noise ratio and estimate W will be used interchangeably. The estimate, W, from the adaptive Viterbi decoder is related to signal-to-noise ratio in that it is roughly a multiplicative inverse of the signal-to-noise ratio and can therefore be used as an indicator of channel quality.

Figure 23:
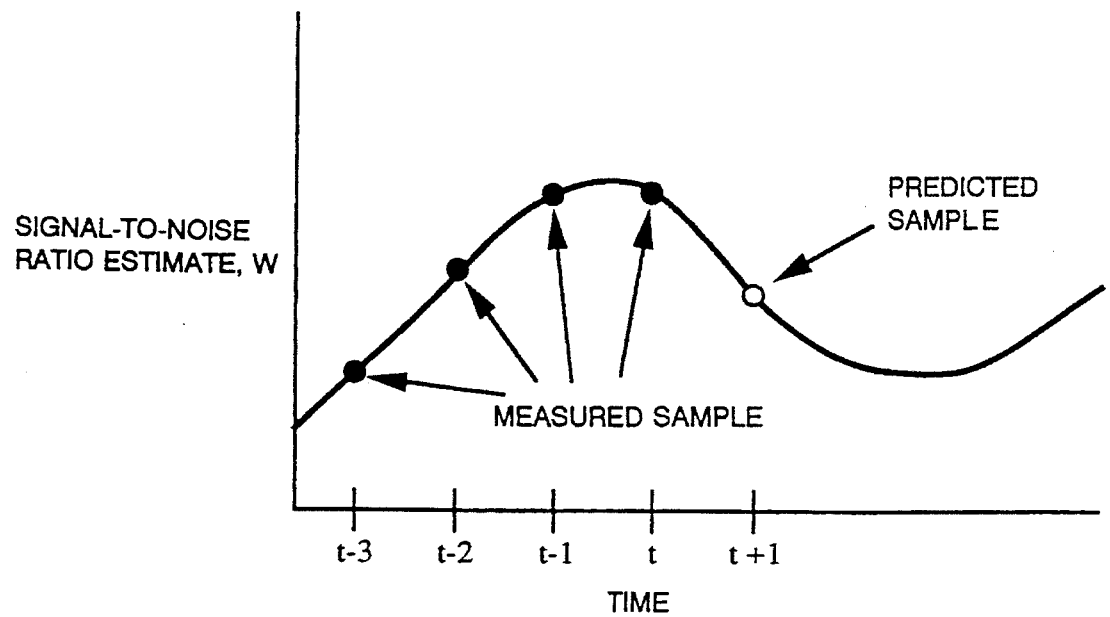
FIG. 23 is a graph illustrating prediction of signal-to-noise ratio according to the present invention.

FIG. 23 shows the conceptual operation of the predictor according to the present invention. Predictor 232 uses a curve fitting routine to compute the next data rate. A number of algorithms can be used for this purpose. The preferred embodiment employs a third order linear prediction algorithm that attempts to fit the data to a straight line. This algorithm computes the next sample according to the following formula:

$$w'(t+1)=4\ w(t)-6\ w(t-1)+4\ w\ (t-2)-w(t-3) \qquad (Eq.\ 5)$$

where w' is the predicted sample.

Figure 24:
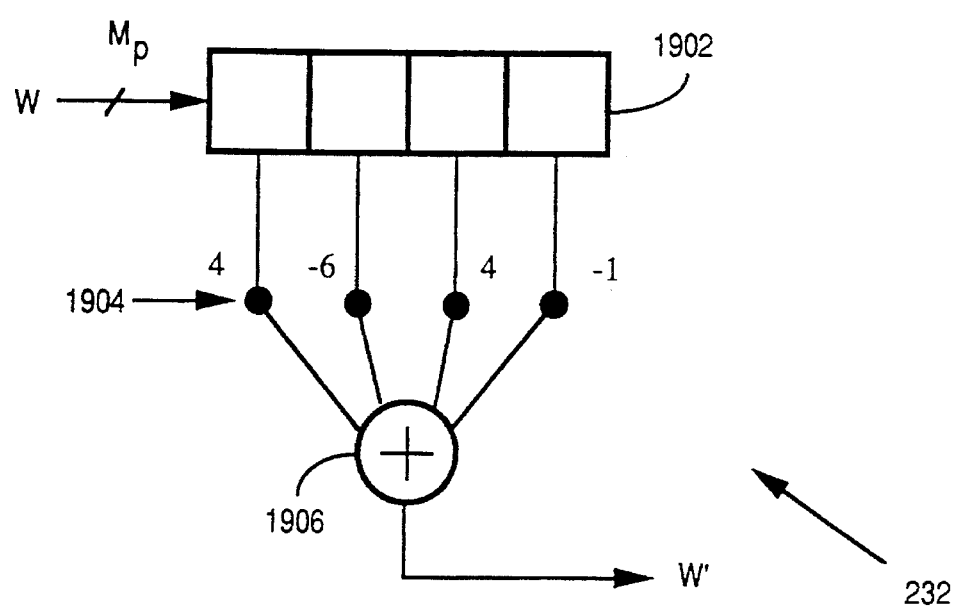
FIG. 24 is a schematic diagram of 3rd order linear predictor circuit 232 of the present invention.

A circuit implementing this 3rd order linear predictor is diagramed in FIG. 24. This circuit comprises a shift register 1902, four multipliers 1904, and an adder 1906. The shift register shifts the signal-to-noise ratio estimate, W, in $M_p$ bit words (i.e. each cell in the register is $M_p$ bits wide). Multipliers 1904 multiply the delayed values of W by the correct constant shown in FIG. 24 and adder 1906 adds the four resulting numbers together and outputs the predicted value, W'. The circuit of FIG. 24 can also be implemented in software. An exemplary Fortran 77 program is illustrated in Appendix B.

The linear predictor of FIG. 24 is relatively easy to implement and is the preferred embodiment for this reason. However, because the linear predictor attempts to fit the previous samples to a straight line, it does not perform well on rapidly changing channels. For example, a linear predictor would not anticipate the downward change in the function of FIG. 23 at times t and t+1. In this case, a polynomial predictor that attempts to fit the data to a polynomial curve is preferred.

It is preferable to perform a curve fit such that an error metric is minimized. For time-varying channels where the precise statistics of the channel are not known, the preferred method is a prior art technique called least squares curve fitting (see R. Embree and B. Kimble, *C Language Algorithms for Digital Signal Processing*, Englewood Cliffs, N.J.: Prentice Hall, 1991, incorporated herein by reference.) Given a set of $(x_i, y_i)$ data points which form a function, a polynomial of order L can be fit to these data points by minimizing the following mean square error expression:

$$E = \sum_{i=0}^{N-1} T_i^2 [b_0 + b_1 x_i + b_2 x_i^2 + \ldots + b_L x_i^L - y_i]^2 \qquad (Eq.\ 6)$$

where $T_i$=the weight associated with the $(x_i, y_i)$ data point (see Embree and Kimble).

N=the number of data points.

L=the order of the polynomial fit.

$b_k$=the desired polynomial coefficients.

E=the total mean squared error.

The main drawback of least squares curve fitting is the large number of matrix calculations that must be performed. In contrast, the expression of Equation (5) can be implemented as an elementary finite impulse response (FIR) filter. When the processing power is available and the channel is fluctuating rapidly, the least squares curve fit is preferred.

Many other prediction algorithms are feasible and depending on the application, one of these algorithms may be suitable. One example is the problem inherent in satellite cross links. The relative motion of two satellites may be predictable, but not controllable, because of hardware constraints. If the motion is predictable, then the received signal-to-noise ratio due to this motion is also predictable. The system designer can use satellite ephemeris data, antenna beamwidth data and other information to develop a prediction algorithm for this application.

The system designer must determine at what time in the future the prediction is needed, given processing delays and propagation delays. The relevant prediction may not be at time t+1, but more preferably at t+3 or t+4, since several symbols must be decoded at the receiver and at the transmitter before the rate changing information is available. There are several ways to accomplish this task. One method is to increase the sample size to more than one symbol so that the next allowable rate change is at t+1. A second method is to first predict the sample at t+1, then use this and past samples to predict the sample at t+2, and so on until the desired estimate is computed.

The prediction algorithm must have past samples to perform prediction properly. Some prediction algorithms are unstable until sufficient past samples have been accumulated. Depending on the algorithm, the predictor may have to be turned off, or bypassed, during the first several frame transmissions after start-up.

The predictor can be implemented in hardware or software. Complex algorithms such as the least squares algorithm discussed above, are preferably implemented in software. However, the system designer may wish to implement less complex algorithms such as the one shown in Equation (5), in hardware to boost speed and reduce processing requirements.

As noted above, the predictor can be eliminated for applications on slowly fading channels. On these channels, the signal-to-noise ratio estimate, W, can be analyzed directly and the value mapped to the proper data rate with little or no degradation.

Mapper 234. Mapper 234 maps the input prediction, W', to the correct value of data rate, $K_{i+1}$. The mapping of Table 8 is used where the thresholds $TH_i$, i=1, 2, 3 are determined through analysis, simulation, or field tests. The larger the value of W', the lower the allowable data rate. Therefore, $TH_1 > TH_2 > TH_3$.

TABLE 8

Look Up Table Rate Mapping for Adaptive Decoder 105

|  | Bits/Symbol | Code Rate | $K_{i+1}$ |
| --- | --- | --- | --- |
| W' ≧ TH₁ (STOP) | — | — | 11 |
| TH₂ ≦ W' < TH₁ | 1 | ½ | 10 |
| TH₃ ≦ W' < TH₂ | 2 | ⅔ | 01 |
| W' < TH₃ | 3 | ¾ | 00 |

Although one embodiment of adaptive decoder 105 has been disclosed herein, there are alternative embodiments that may be desirable for certain applications.

First, predictor 232 is optional and may not be needed for channels with slow time variations.

Second, analog to digital converter 220 may be included in M-ary demodulator 114 rather than in the adaptive decoder. Also, the level of quantization of A/D converter 220 is variable from $\log_2 M+1$ bits up to 32 bits or more, depending on the desired fidelity.

Third, the parallel to serial conversion, serial to parallel conversion, and variable bit shifting functions performed by first counter 224, second counter 226, first shift register 228, second shift register 230, and NAND gates 236, 238, and 240 could alternatively be performed by other logic circuits, in memory, or in software. In general, these components comprise second adaptive data transfer circuit 72 (shown in FIG. 1) that has several possible implementations.

Fourth, mapper 234 can also take several forms such as ROM, PROM, EPROM, E²PROM, RAM, logic circuits, or software.

And adaptive Viterbi decoder 222 may be implemented in software on a computer of known design as disclosed in the preferred embodiment, or in an application specific integrated circuit (ASIC) for small size and high speed applications.

Figure 25:
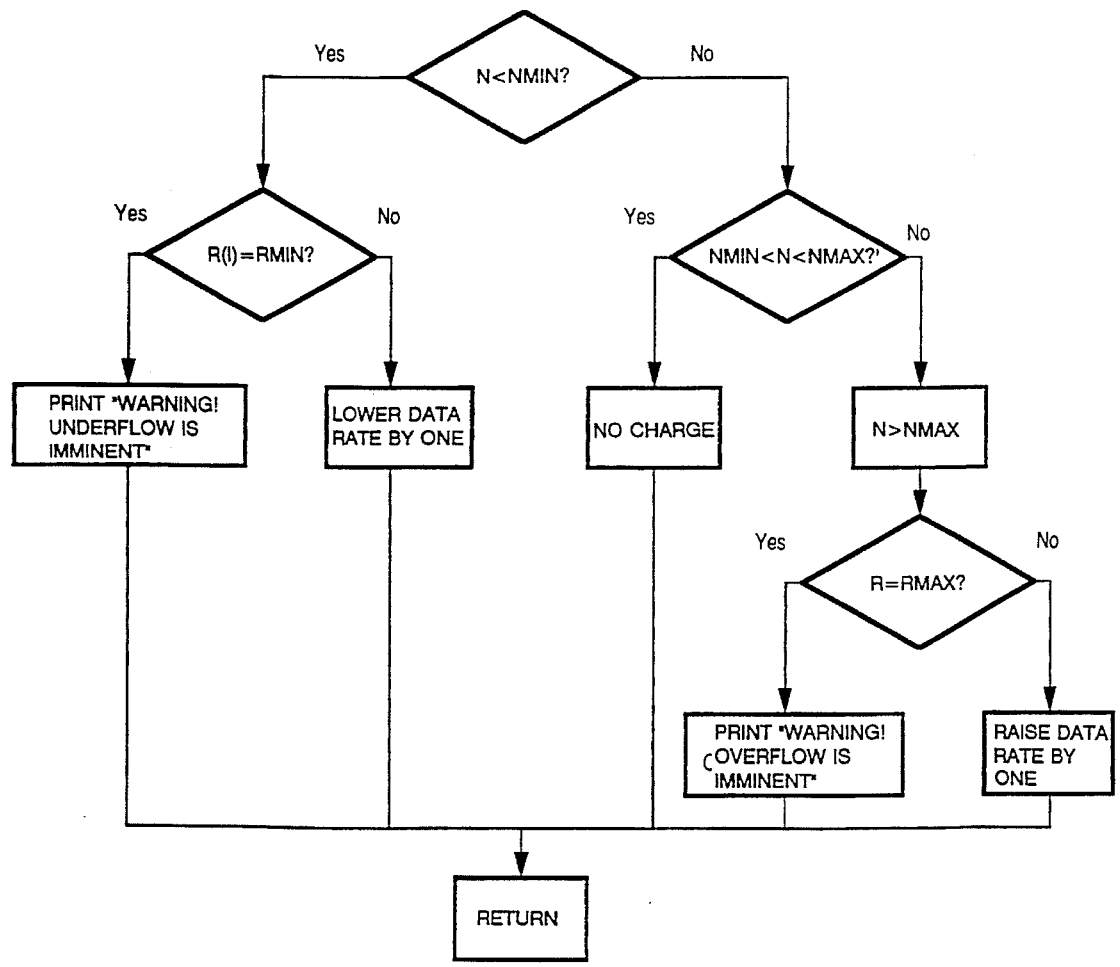
FIG. 25 is a flowchart showing the operation of memory controller 109 of the present invention.

Memory Controller 109 (FIG. 25)

Most applications will require interfacing constant data rate I/O device 120 (shown in FIG. 2) to adaptive encoder 104 and adaptive decoder 105. Since the two data rates may differ, RAM 108 of FIG. 2 is required as a buffer between the I/O device and the adaptive encoder or adaptive decoder. In addition to RAM 108, memory controller 109 may be required for certain applications to control the data rate to prevent memory overflow or underflow. The memory controller raises the data rate when memory overflow is imminent and lowers the data rate when underflow is imminent. Unfortunately, raising the data rate for memory control purposes increases the bit-error rate and lowering the data rate for memory control purposes lowers throughput. Therefore, an efficient memory control algorithm is needed to ensure that data rate changes and their effects are minimized. The memory controller should anticipate overflow and underflow conditions and adjust the data rate early to avoid abrupt swings in bit-error rate and throughput. Conversely, the memory controller should estimate overflow and underflow conditions accurately to prevent unnecessary data rate changes. The preferred embodiment of modem 102 uses the following algorithm, detailed in the flowchart of FIG. 25. This algorithm is most efficiently realized in software operating on a computer of known design (e.g. microprocessor) although hardware realizations are possible and may be preferred in some applications.

At the beginning of each frame or packet, the buffer is checked to see if the number of packets in the memory, N, exceeds a predetermined threshold, NMAX, or is lower than a second predetermined threshold, NMIN. NMAX is always greater than NMIN. To make the memory control algorithm feasible, NMAX must be substantially less than the memory capacity and NMIN must be substantially greater than 0. If N>NMAX, the data rate is increased to the next higher rate. If N<NMIN, the data rate is decreased to the next lower rate. If N>NMAX and the data rate is already at the maximum, an overflow warning is sent to the I/O device. If N<NMIN and the data rate is already at the minimum, an underflow warning is sent to the I/O device. If NMIN<N<NMAX, then the data rate remains unchanged. This memory control algorithm is implemented in the Fortran 77 computer subroutine of Appendix C.

Persons skilled in the art will recognize that this basic algorithm can be enhanced in numerous ways at the possible cost of increased complexity. For example, the system can adjust the rate changing thresholds, $TH_i$, upward (i.e. lower the threshold signal-to-noise ratios) as a function of buffer size to increase throughput or adjust the thresholds downward to decrease throughput and reduce the probability of overflow or underflow. This threshold adjusting technique will reduce the number of abrupt data rate changes and increase overall performance. The technique can be used in conjunction with the basic buffer control algorithm disclosed above to preclude overflows and underflows. Second, in addition to the static condition of the buffer, the rate at which the buffer is filling or emptying will also affect the necessary data rate. If the buffer is filling rapidly, then the threshold for raising the data rate, NMAX, must be lower than for a buffer that is filling slowly. The converse is true for a buffer that is emptying. Therefore, an enhancement to the basic algorithm is to make the thresholds NMAX and NMIN functions of the fill/empty rate instead of constants. A third enhancement is to allow the data rate to increase or decrease by two or more increments at a time. A fourth enhancement is to use a least squares algorithm such as the optional algorithm presented for the predictor 232. In this case, the prediction algorithm would use past samples of the buffer size, N, to predict the future buffer size to anticipate overflow or underflow. A fifth enhancement that is practical if the I/O device 120 has its own memory is for memory controller 109 to request that the I/O device stop transmitting data until the threat of overflow has diminished. Obviously, there are tradeoffs in system design since a more powerful algorithm can only be implemented at the expense of greater complexity and processing burden. The optimal memory control algorithm will be a function of the particular application.

If it is desired to construct modem 102 without the memory controller disclosed, the system designer may simply provide a large RAM 108 so that the likelihood of overflow is negligibly small. Memory is relatively inexpensive, and for intermittent traffic or modest throughput applications such as packetized cellular radio, this will usually be the preferred solution. On the other hand, a high speed microwave radio could fill even a large memory rapidly and an efficient memory control algorithm is essential for this application.

Figure 26:
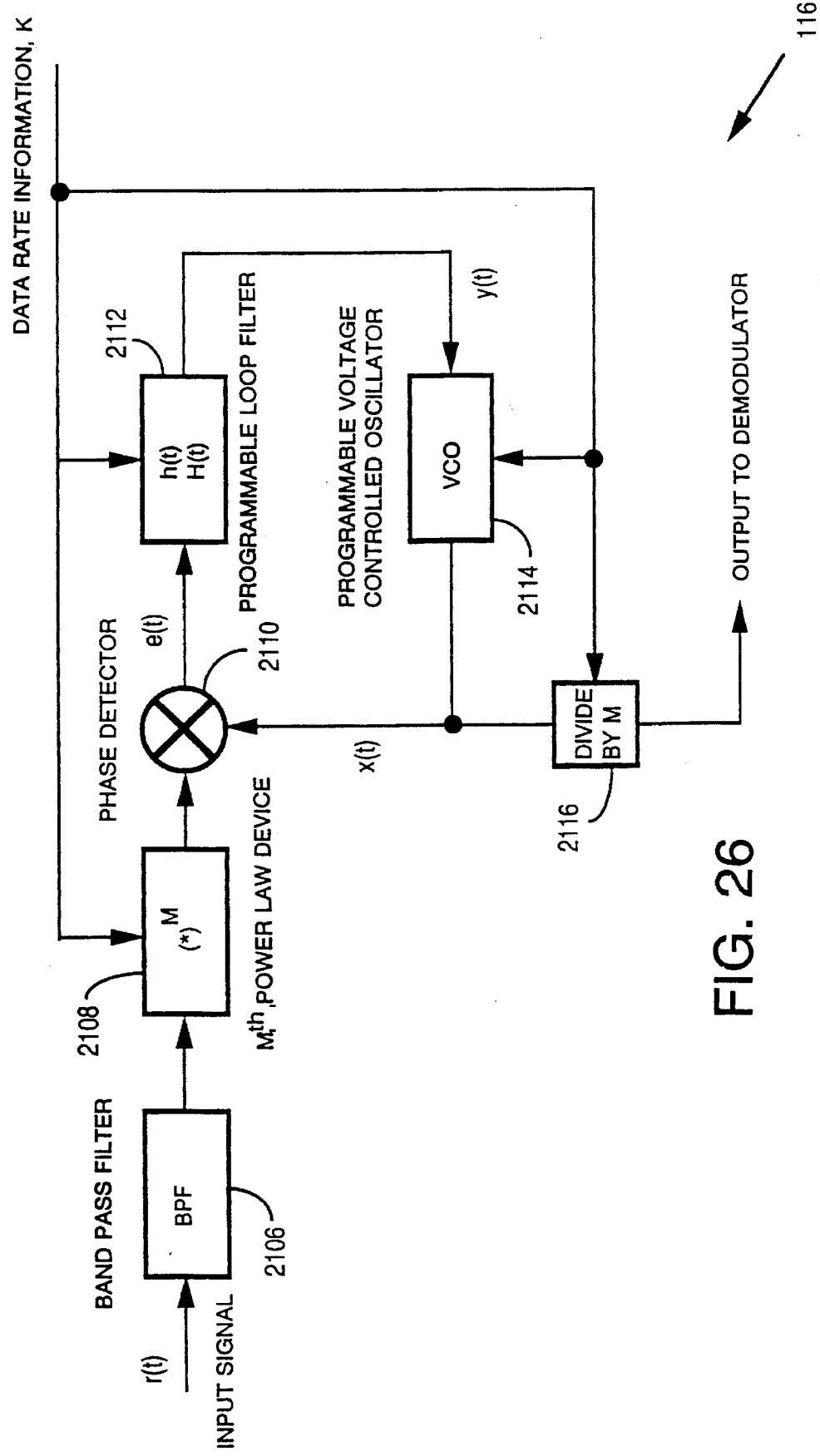
FIG. 26 is a block diagram showing adaptive phase-locked loop 116 of the present invention.

Carrier Recovery Circuit 116 (FIG. 26)

In addition to memory and memory management, modem 102 requires synchronization to incoming signals at the receiver. A coherent system (e.g. PSK or QAM) requires three main levels of synchronization: phase lock, symbol lock, and frame synchronization. A noncoherent system (e.g. DPSK or CPFSK) does not require phase lock, but frequency synchronization is desirable.

The present invention employs symbol lock, frame synchronization, and frequency synchronization techniques of known design. A person skilled in the art can integrate the invention with these necessary synchronization components to realize an operable system. However, the present invention makes use of an optional technique for achieving phase lock, which will now be described in detail.

A practical approach to achieving phase lock for conventional suppressed carrier M-ary PSK or QAM signals is a suppressed carrier phase locked loop. A basic suppressed carrier phase locked loop comprises a $M^{th}$ power law device, a phase detector, a loop filter, a voltage controlled oscillator, and a divider circuit. The $M^{th}$ power law device is required to extract a signal proportional to the carrier frequency. For 2-PSK, the $M^{th}$ power law device squares the signal; for 4-PSK, the $M^{th}$ power law device raises the signal to the fourth power; for 8-PSK, the $M^{th}$ power law device raises the signal to the eighth power; for 16-PSK, the $M^{th}$ power law device raises the signal to the sixteenth power; and so on. An important property of suppressed carrier loops is an increase in the noise level caused by raising the received signal to the $M^{th}$ power. This increased noise is called the squaring loss. Squaring loss is an increasing function of the PSK symbol set, which is a significant disadvantage in an adaptive system. Because of the squaring loss, a single 16-phase loop may not be able to acquire and lock to the weak signals that the lowest data rate (4-PSK) can effectively use. Therefore, the preferred embodiment employs an adaptive phase-locked loop that adapts the parameters of the loop to the current signal set, or equivalently, to the current data rate.

The adaptive digital phase locked loop (DPLL) of the present invention is shown in FIG. 26. Adaptive phase-locked loop 116 comprises a bandpass filter 2106, a programmable $M^{th}$ power law device 2108, a phase detector 2110, a programmable low pass loop filter 2112, a programmable voltage controlled oscillator (VCO) 2114, and a programmable divide-by-M circuit 2116. The received signal, r(t), is first filtered by bandpass filter 2106 to minimize the noise bandwidth and the squaring loss. Then the signal is raised to the $M^{th}$ power by $M^{th}$ power law device 2108 and is multiplied by the signal from the output of VCO 2114, x(t), by phase detector 2110. The resulting signal, e(t), is filtered by programmable low pass loop filter 2112 to pass only the desired frequency components. The transfer function of loop filter 2112 determines the order of the circuit. The preferred embodiment uses a second order device for loop filter 2112 because a second order phase locked loop is unconditionally stable. To be second order, the transfer function of programmable loop filter 2112 must have the following form:

$$H(f) = 1 + \frac{a}{jf} \quad \text{(Eq. 7)}$$

where a is a constant, f is the frequency, and j is the square root of −1.

The output signal of filter 2112, y(t), then enters VCO 2114 which outputs an oscillating signal that is a linear function of the input voltage. The output of VCO 2114 is divided by M by divide-by-M circuit 2116 and the resultant signal is passed to M-ary demodulator 114 (shown in FIG. 2). Table 9 shows the mapping of data rate to power, M.

TABLE 9

Mapping of Data Rate to Adaptive Phase Locked Loop Power, M

| Data Rate | Code Rate | $K_i$ | M |
|---|---|---|---|
| STOP | ½ | 11 | 4 (Probing condition) |
| 1 bit/symbol | ½ | 10 | 4 |
| 2 bits/symbol | ⅔ | 01 | 8 |
| 3 bits symbol | ¾ | 00 | 16 |

Adaptive phase-locked loop 116 remains in synchronization through rate changes so that demodulation and decoding are not interrupted. For extremely deep fades, the system may lose synchronization. In this case, modem 102 ceases information transmission and reverts to a probing mode using rate 1/2 coded 4-ary modulation until the channel is again available for traffic. The adaptive phase-locked loop of FIG. 26 can also be realized in a Costas Loop configuration, but this configuration is less preferred because of the complexity required therein for 8-PSK and 16-PSK operation. Other possible embodiments include 1st order, third order, and higher order loops. Furthermore, the adaptive phase-locked loop can be realized in an analog implementation as well as the preferred digital implementation.

Another alternative embodiment to the adaptive phase-locked loop can be constructed using three separate phase locked loops (one each for 4-PSK, 8-PSK, and 16-PSK) and a single pole, three-way switch activated by the data rate information, K. Another alternative is to achieve phase lock at the beginning of a transmission and bypass the adaptive phase-locked loop for the remainder of the transmission to avoid squaring loss. If the transmission is short, such as in meteor burst communications, and if the clocks at each end of the link are of high quality, the phase drift should be negligible.

The $M^{th}$ power law device introduces a phase ambiguity such that adaptive phase locked loop 116 can lock successfully in one of M phases. Unfortunately, only one of the phases is correct. For non-trellis coded systems, this problem is resolved by differentially encoding the data bits at the transmitter using circuits of known design. The resulting system is rotationally invariant. However, for trellis coded systems such as the one disclosed in the present invention, differential encoding only resolves M/2 of the phases. The remaining M/2 phases must be resolved by some other means. One technique to resolve this phase ambiguity is disclosed by QUALCOMM® in an application note entitled "Q1875 Pragmatic Trellis Decoder Technical Data Sheet," May 1992, available from QUALCOMM Incorporated, 10555 Sorrento Valley Road, San Diego, Calif. 92121-1617. This document is incorporated herein by reference.

In some applications, especially slowly fading channels, it will be possible to achieve phase lock on the 16-ary constellation without degrading performance of the 8-ary and 4-ary constellations. One technique to accomplish phase lock on slowly fading channels is disclosed by Viterbi in "Nonlinear estimation of PSK modulated carrier phase with application to burst digital transmission," *IEEE Transactions on Information Theory*, vol. IT-32, pp. 543–551, July 1983. Enhancements to Viterbi's approach are disclosed in a paper by Fitz, "Equivocation in nonlinear digital carrier synchronizers," *IEEE Transactions on Communications*, vol. 39, pp. 1672–1682, November 1991. These two documents are incorporated herein by reference. In many applications, the preferred solution will be to resort to a noncoherent modulation scheme such as M-ary DPSK.

SUMMARY, RAMIFICATIONS AND SCOPE

Thus, it will be seen that the invention will substantially increase throughput on time-varying channels while minimizing circuit and processing complexity. The invention employs a novel trellis coding technique that adapts the data rate to the time-varying signal-to-noise ratio at the communications receiver. The novel encoder and trellis decoder perform error-correction, rate changing, and signal quality estimation in a single device. The optional memory controller adjusts data rate in an efficient way to preclude memory overflow or underflow. For coherent demodulators such as PSK and QAM, the optional adaptive phase-locked loop achieves carrier synchronization efficiently for all signal constellations.

While the above description contains many specific implementations, these should not be construed as limitations on the scope of the invention, but rather as an exemplification of one preferred embodiment thereof. Many other variations are possible. For example, the present invention is applicable to any two-way communications or feedback control system where system parameters are time-varying and must be tracked. One example is a spread spectrum multiple access communications network. The present invention could be used to estimate power or interference levels and adjust communications parameters such as power or data rate, accordingly. Or, if a new user accessed the system and reduced the signal-to-interference ratio, the present invention would reduce the data rate accordingly, thus providing a graceful degradation. A second example is a digitized voice system where the present invention would adjust speech encoding parameters as a function of the current channel conditions. A third example is a video encoding and compression system where higher data rates are used when objects are moving and low data rates are used when objects are stationary.

Accordingly, the scope of the invention should be determined not by the embodiments illustrated, but by the appended claims and their legal equivalents.

APPENDIX A

Copyright © 1992 Pericle Communications Company, All Rights Reserved
FORTRAN 77 PROGRAM TO ELIMINATE PARALLEL BRANCHES

```
      SUBROUTINE VITMOD(YS, Y4, Y8, Y16, 1, K, X, MINI, MIN2)
C
C     Subroutine to eliminate parallel brarr-hes based on distance metric. This subroutine assumes a
C     constraint length 3 convolutional code and three data rates. The program can easily be
C     generalized to more complex codes. The program returns the branch numbers of the the two
C     remaining branches for that node.
C
C     Description of constants and vadables: K = the current data rate in bds/symbol, YS = symbol
C     metric, Y4(J) = metric for branch urider 4-ary, Y8(J) = metric for each branch under 8-ary, Y16(J)
C     = metric for each branch under 16-ary, I = node of interest. The following numbers are returned:
C     MINI, MIN2 = the branch numbers of the surviving branches, and the corresponding metrics,
C     X(MINl) and X(MIN2), where X = Y(J) - YS. For 16-ary, branches are assigned to each node in the
C     following way: branches 1–8 enter node 1, branches 9–16 enter node 2, branches 17–24 enter
C     node 3, and branches 25–32 enter node 4. 8-ary works similarly: branches 1–4 enter node 1, 5–8
C     enter node 2, 9–12 enter node 3, and 13–16 enter node 4. For 4-ary, branches 1–2 enter node 1,
C     3–4 enter node 2, 5–6 enter node 3, and 7–8 enter node 4
C
C     SORT is a standard sorting routine that sorts inputs according to minimum absolute value and
C     returns MIN1 or MIN2, which are the integers representing the minimum branch.
C
      REAL*4 YS, Y4(8), Y8(16), Y 1 6(32), X(32)
      INTEGER 1, K, L, MINI, MIN2
C
      IF (K.EQ.1) THEN
         L = 2*1 - I
         MINI = L
         MIN2 = L + 1
         X(MIN 1) = Y4(MIN 1) - YS
         X(MIN2) = Y4(MIN2) - YS
C
      ELSEIF (K.EQ.2) THEN
         L = 4*1 - 3
         DO 14 JJ = L, L + 3
         X(JJ) = Y8(JJ) - YS
  14     CONTINUE
         CALL SORT(X(L), X(L + 1), MIN1)
         CALL SORT(X(L + 2), X(L + 3), MIN2)
C
      ELSE (K.EQ.3) THEN
         L = 8*1-7
         DO 16 JJ=L, L + 7
         X(JJ) = Y1 6(Ji) - YS
  16     CONTINUE
         CALL SORT(X(L), X(L + 1), X(L + 2), X(L + 3), MIN1)
         CALL SORT(X(L + 4), X(L + 5), X(L + 6), X(L + 7), MIN2)
      ENDIF
  12  RETURN
      END
```

APPENDIX B

Copyright © 1992 Pericle Communications Company, All Rights Reserved
FORTRAN 77 PROGRAM TO PREDICT FUTURE SIGNAL-TO-NOISE

```
      SUBROUTINE PREDICT(X, XPRED)
C     This program implements a 3rd order linear predictor. The previous samples are denoted X(l), X(2)
C     X(3), and X(4) with X(l) the oldest sample and X(4) the newest sample. XPRED is the prediction.
C
      REAL*4 X(4), XPRED
      READ(9,*) X(4)
         XPRED = 4*X(4) - 6X(3) + 4*X(2) -X(l)
      DO15 1 = 1,3
         X(l) = X(i + 1)
  15  CONTINUE
      RETURN
      END
```

APPENDIX C

Copyright © 1992 Pericle Communications Company, All Rights Reserved
FORTRAN 77 PROGRAM TO CONTROL BUFFER

```
      SUBROUTINE BUFFER(L, R, RMAX, RMIN, N, NMAX, NMIN)
C
C     Subroutine to control memory (buffer) space in an adaptive data rate communications system
C     At the beginning of each frame, the buffer is checked to see if the number of packets in the buffer, N,
C     exceeds a predetermined threshold, NMAX, or is lower than a second predetermined threshold, NMIN.
C     If N>NMAX, the data rate is increased to the next higher rate. If N <NMIN, the data rate is decreased to
C     the next lower rate. If N >NMAX and the data rate is already at the maximum, an overflow wamirig is serit
C     to the 1/0 device. If N<NMIN and the data rate is already at the minimum, an underflow warning is serd
C     to the 1/0 device. If NMIN <N <NMAX, then the data rate remains unchanged.
C
C     Description of constants and vadables: A(l) = the currerd data rate, N = number of packets currently in
C     buffer, NMAX = maximum number of packets that the buffer will hold before the data rate is increased,
C     NMIN = minimum number of packets that the buff er will hold before the data rate is decreased,
C     RMAX = maximum data rate, AMIN = minimum data rate, The index, 1, is incremented, decremented, or
C     not changed, depending on the value of R(l) and N. The new data rate is returned as R(I).
C
      REAL*4 R(10), RMAX, RMIN
      INTEGER 1, N, NMAX, NMIN
      IF(N.LT.NMIN) THEN
         IF(R(I).EQ.RMIN) THEN
            PRINT(9,*)*WARNING!UNDERFLOW IS IMMINENT!*
         ELSE
            I = I-1
         ENDIF
      ELSE IF (N.GE.NMIN.AND. N.LE.NMAX) THEN
         GO TO 10
      ELSE
         IF (R(l).EQ. RMAX) THEN
            PRINT(9,*)*WARNING!OVERFLOW IS IMMINENT!*
         ELSE
            I = I + 1
         ENDIF
      ENDIF
C
10    RETURN
      END
```

What is claimed is:

1. A modem operating at one of a plurality of data rates for use with a forward channel transmitter, a forward channel receiver, a return channel transmitter, and a return channel receiver, comprising:

a. encoding means for generating l output bits as a function of j input bits, where l is greater than j;

b. mapping means connected to said encoding means for mapping the l-bit output of said encoding means to an element of a predetermined symbol set for transmission by said forward channel transmitter over a forward channel to said forward channel receiver; and c. trellis decoder means connected to said forward channel receiver for searching a trellis, for selecting a trellis path which most closely resembles the received symbol sequence in terms of a cumulative path metric, for providing a decoded bit sequence as an output in response to the selected trellis path and the number of data bits per symbol in each branch of the selected trellis path, for estimating a reliable data rate as a function of a cumulative path metric of at least one survivor path, for dynamically and without interruption searching a dynamically changing trellis, and wherein the number of bits per symbol is dynamically changing; and d. said trellis decoder means connected to said return channel transmitter for transmitting data rate information to said return channel receiver for use, in real time, by at least one of said encoding means and said mapping means.

2. The modem of claim 1 wherein the symbols are transmitted at a constant rate.

3. The modem of claim 1, wherein said encoding means comprises an encoder with i coded input bits, where i is less than or equal to j, and j minus i uncoded bits connected directly to said mapper, whereby a trellis structure is constructed with parallel branches between trellis states.

4. The modem of claim 1 wherein said trellis decoder means adjusts the data rate dynamically and without interruption.

5. The modem of claim 1, further comprising predictor means connected to said trellis decoding means and connected to a return channel for predicting future reliable data rates.

6. The modem of claim 1 further comprising adaptive data transfer means for transferring data between a memory and said encoding means at a dynamically selected one of a plurality of data rates.

7. The modem of claim 6 wherein said adaptive data transfer means comprises:

a. a first shift register of size J bits where J is a common multiple of the data rates in bits per symbol;

b. a second shift register of size k bits where k is the highest data rate in bits per symbol;

c. a first counter, modulo-k with a variable start, for counting from k minus $K_i$ to k bits where $K_i$ is one of a plurality of data rates, and where $K_i$ is less than or equal to k;

d. a second counter, modulo J-1, for counting from 0 to J-1;

e. said first shift register connected to said second shift register through a serial data line, to said first counter through a shift control line, to said second counter through a load line and said shift control line, and to an external memory through a data bus of size J bits;

f. said second shift register being connected to said shift control line and further having k output bits from said second shift register connected to an output;

g. said first counter being connected to a NAND gate through said first counter's output line, to an external load pulse signal, an external bit clock, and an external data rate word; and h. said second counter being connected to said shift control line at said second counter's clock input and to an external memory read line through said second counter's output line.

8. The modem of claim 1, further comprising a memory controller, having:

a. storage means having limited storage capacity for storing an amount of incoming digital information for delivery to the encoding means;

b. monitoring means connected to said storage means for monitoring the amount of information stored in said storage means and producing control signals based on said amount;

c. control means for controlling the amount of information stored in said storage means by raising the system data rate in response to said control signals when said control signals indicate that overflow of said storage means is imminent and by lowering the system data rate in response to said control signals when said control signals indicate that underflow of said storage means is imminent.

9. The modem of claim 8 wherein said control means controls the occurrence of data rate changes by adjusting rate changing thresholds of the modem as a function of said amount of information stored, whereby the throughput is increased or decreased thereby reducing the need for rate changes to preclude overflow or underflow of the storage means.

10. The modem of claim 8 where said control means raises the system data rate when said amount of information stored exceeds a threshold, NMAX, and lowers the system data rate when said amount of information stored is less than a second threshold, NMIN.

11. The modem of claim 10 wherein said control means further controls the occurrence of data rate changes by adjusting rate changing thresholds of the modem as a function of said amount of information stored, whereby the throughput is increased or decreased thereby reducing the need for rate changes to preclude overflow or underflow of the storage means.

12. The modem of claim 1 further comprising an adaptive phase locked loop receiving data from said forward channel receiver for achieving synchronization at any of a set of predefined data rates.

13. The modem of claim 12 wherein said adaptive phase locked loop comprises:

a. a bandpass filter having an input connected to receive data from said forward channel receiver and having an output;

b. a programmable $M^{th}$ power law device having an input connected to receive the output of said bandpass filter and producing an output therefrom corresponding to the input raised to the $M^{th}$ power;

c. phase detecting means having a first input connected to the output of said $M^{th}$ power law device and also having an output representing the phase error of the input;

d. a programmable loop filter having an input connected to the output of said phase detecting means and also having an output representing a filtered version of the input;

e. a programmable voltage controlled oscillator having an input connected to the output of said programmable loop filter and having an output connected as a second input to said phase detecting means;

f. a programmable divide-by-M circuit connected to the output of said programmable voltage controlled oscillator providing an output to a demodulator; and g. variation means for selecting the value of M and for modifying operating parameters of said programmable loop filter and said voltage controlled oscillator based on the value of said data rate of said received data.

14. A modem operating at one of a plurality of data rates for use with a forward channel transmitter, a forward channel receiver, a return channel transmitter, and a return channel receiver, comprising:

a. encoding means for generating l output bits as a function of j input bits, where l is greater than j;

b. mapping means connected to said encoding means for mapping the l-bit output of said encoding means to an element of a predetermined symbol set for transmission by said forward channel transmitter over a forward channel to said forward channel receiver; and c. trellis decoder means connected to said forward channel receiver for searching a trellis, for selecting a trellis path which most closely resembles the received symbol sequence in terms of a cumulative path metric, for providing a decoded bit sequence as an output in response to the selected trellis path and the number of data bits per symbol in each branch of the selected trellis paths, for dynamically and without interruption searching a dynamically changing trellis, and wherein the number of bits per symbol is dynamically changing; and d. estimation means connected to said trellis decoder means for estimating a reliable data rate based on channel conditions, said estimation means also connected to said return channel transmitter for transmission over a return channel, for reception by said return channel receiver, and for use, in real time, by said at least one of said encoding means and said mapping means for determining a reliable data rate.

15. The modem of claim 14 wherein the symbols are transmitted at a constant rate.

16. The modem of claim 14, wherein said encoding means comprises an encoder with i coded input bits, where i is less than or equal to j, and j minus i uncoded bits connected directly to said mapper, whereby a trellis structure is constructed with parallel branches between trellis states.

17. The modem of claim 14 wherein said trellis decoder means adjusts the data rate dynamically and without interruption.

18. The modem of claim 14 wherein said estimation means generates an estimate of said reliable data rate as a function of said cumulative path metric.

19. The modem of claim 14 wherein said estimation means compares a minimum distance path with the path with the next largest accumulated metric and when the difference between the two paths is greater than a predetermined number, directs an increase in data rate and when the difference between the said two paths is less than a predetermined number, directs one of a reduction in data rate and a cessation of data transmission.

20. The modem of claim 14, wherein said estimation means includes means for performing least mean square estimation of said reliable data rate.

21. The modem of claim 14, further comprising predictor means connected to said estimation means and connected to a return channel for predicting future reliable data rates.

22. The modem of claim 14 further comprising adaptive data transfer means for transferring data between a memory and said encoding means at a dynamically selected one of a plurality of data rates.

23. The modem of claim 22 wherein said adaptive data transfer means comprises:
   a. a first shift register of size J bits where J is a common multiple of the data rates in bits per symbol;
   b. a second shift register of size k bits where k is the highest data rate in bits per symbol;
   c. a first counter, modulo-k with a variable start, for counting from k minus $K_i$ to k bits where $K_i$ is one of a plurality of data rates, and where $K_i$ is less than or equal to k;
   d. a second counter, modulo J-1, for counting from 0 to J-1;
   e. said first shift register connected to said second shift register through a serial data line, to said first counter through a shift control line, to said second counter through a load line and said shift control line, and to an external memory through a data bus of size J bits;
   f. said second shift register being connected to said shift control line and further having k output bits from said second shift register connected to an output;
   g. said first counter being connected to a NAND gate through said first counter's output line, to an external load pulse signal, an external bit clock, and an external data rate word, and
   h. said second counter being connected to said shift control line at said second counter's clock input and to an external memory read line through said second counter's output line.

24. The modem of claim 14, further comprising a memory controller, having:
   a. storage means having limited storage capacity for storing an amount of incoming digital information for delivery to said encoding means;
   b. monitoring means connected to said storage means for monitoring the amount of information stored in said storage means and producing control signals based on said amount;
   c. control means for controlling the amount of information stored in said storage means by raising the system data rate in response to said control signals when said control signals indicate that overflow of said storage means is imminent and by lowering the system data rate in response to said control signals when said control signals indicate that underflow of said storage means is imminent.

25. The modem of claim 24 wherein said control means controls the occurrence of data rate changes by adjusting rate changing thresholds of the modem as a function of said amount of information stored, whereby the throughput is increased or decreased thereby reducing the need for rate changes to preclude overflow or underflow of said storage means.

26. The modem of claim 24 where said control means raises the system data rate when said amount of information stored exceeds a threshold, NMAX, and lowers the system data rate when said amount of information stored is less than a second threshold, NMIN.

27. The modem of claim 26 wherein said control means further controls the occurrence of data rate changes by adjusting rate changing thresholds of the modem as a function of said amount of information stored, whereby the throughput is increased or decreased thereby reducing the need for rate changes to preclude overflow or underflow of said storage means.

28. The modem of claim 14 further comprising an adaptive phase locked loop for receiving data from said forward channel receiver for achieving synchronization at any of a set of predefined data rates.

29. The modem of claim 28 wherein said adaptive phase locked loop comprises:
   a. a bandpass filter having an input connected to receive data from said forward channel receiver and having an output;
   b. a programmable $M^{th}$ power law device having an input connected to receive the output of said bandpass filter and producing an output therefrom corresponding to the input raised to the $M^{th}$ power;
   c. phase detecting means having a first input connected to the output of said $M^{th}$ power law device and also having an output representing the phase error of the input;
   d. a programmable loop filter having an input connected to the output of said phase detecting means and also having an output representing a filtered version of the input;
   e. a programmable voltage controlled oscillator having an input connected to the output of said programmable loop filter and having an output connected as a second input to said phase detecting means;
   f. a programmable divide-by-M circuit connected to the output of said programmable voltage controlled oscillator providing an output to a demodulator, and
   g. variation means for selecting the value of M and for modifying operating parameters of said programmable loop filter and said voltage controlled oscillator based on the value of said data rate of said received data.

30. An electrical circuit for transferring data at one of a plurality of data rates comprising:
   a. a first shift register of size J bits where J is a common multiple of the data rates in bits per symbol;
   b. a second shift register of size k bits where k is the highest data rate in bits per symbol;
   c. a first counter, modulo-k with a variable start, for counting from k minus $K_i$ to k bits where $K_i$ is one of a plurality of data rates, and where $K_i$ is less than or equal to k;
   d. a second counter, modulo J-1, for counting from 0 to J-1;
   e. said first shift register connected to said second shift register through a serial data line, to said first counter through a shift control line, to said second counter through a load line and said shift control line, and to an external memory through a data bus of size J bits;
   f. said second shift register being connected to said shift control line and further having k output bits from said second shift register connected to an output;
   g. said first counter being connected to a NAND gate through said first counter's output line, to an external load pulse signal, an external bit clock, and an external data rate word, and h. said second counter being connected to said shift control line at said second counter's clock input and to an external memory read line through said second counter's output line.

31. An adaptive phase-locked loop comprising:
   a. a bandpass filter having an input connected to receive data from said forward channel receiver and having an output;
   b. a programmable $M^{th}$ power law device having an input connected to receive the output of said bandpass filter and producing an output therefrom corresponding to the input raised to the $M^{th}$ power;
   c. phase detecting means having a first input connected to the output of said $M^{th}$ power law device and also having an output representing the phase error of the input;
   d. a programmable loop filter having an input connected to the output of said phase detecting means and also having an output representing a filtered version of the input;
   e. a programmable voltage controlled oscillator having an input connected to the output of said programmable loop filter and having an output connected as a second input to said phase detecting means;
   f. a programmable divide-by-M circuit connected to the output of said programmable voltage controlled oscillator providing an output to a demodulator; and
   g. variation means for selecting the value of M and for modifying operating parameters of said programmable loop filter and said voltage controlled oscillator based on the value of said data rate of said received data.

32. A method for transmitting and receiving data over a two-way communications channel at one of a plurality of data rates, comprising the steps of:
   a. encoding data by mapping J output bits to l output bits, where l is greater than j;
   b. mapping said l output bits to an element $S_{jk}'$, of a predetermined symbol set by dynamically and without interruption searching a dynamically changing trellis, wherein the number of bits per symbol is dynamically changing;
   c. transmitting said element over a forward channel;
   d. receiving said element and generating an estimate, $S_{jk}'$, i=1, 2, . . . , in terms of a predetermined metric;
   f. providing a decoded bit sequence as an output in response to selected trellis path and the number of data bits per symbol in the selected trellis path;
   g. estimating a reliable data rate based on channel conditions;
   h. transmitting data rate information over a return channel; and
   i. receiving said data rate information for use, in real time, by said encoding step for determining an operating data rate.

33. A system for transmitting and receiving data over a communications channel, comprising:
   a. encoding means for mapping data to elements of a predefined symbol alphabet having symbol alphabet elements by dynamically and without interruption searching a dynamically changing trellis, and wherein the number of bits per symbol is dynamically changing;
   b. transmitting means connected to the encoding means for transmitting signals representative of the symbol alphabet elements over the communications channel at one of a set of predefined data rates;
   c. receiving means for receiving signals representative of elements of the symbol alphabet over the communications channel and producing in accordance therewith signals representative of the received symbol alphabet elements;
   d. decoding means connected to the receiving means for receiving said representative signals and generating in response thereto received data signals representative of the signals received;
   e. predictor means connected to said decoding means for estimating and having an output predicting future reliable data rates based on channel conditions, and
   f. means for sending said predictor means output to the transmitting means to control the selection of said data rate thereof, in real time, in response to the predictor means output.

34. A method for transmitting and receiving data over a communications channel, comprising the steps of:
   a. encoding data to be transmitted by mapping said data to elements of a predefined symbol alphabet having symbol alphabet elements for dynamically and without interruption searching a dynamically changing trellis, and wherein the number of bits per symbol is dynamically changing;
   b. transmitting signals representative of said symbol alphabet elements over the communications channel at one of a set of predefined data transmission rates;
   c. receiving signals representative of elements of the symbol alphabet over the communications channel;
   d. decoding said signals and generating in response thereto received data signals representative of the signals received;
   e. predicting future reliable data rates based on channel conditions;
   f. controlling said data transmission rate during the transmission in real time in response to the prediction of future reliable data rates.

35. A modem operating at one of a plurality of data rates for use with a forward channel transmitter, a forward channel receiver, a return channel transmitter, and a return channel receiver, comprising:
   a. encoding means for generating l output bits as a function of j input bits, where l is greater than j;
   b. mapping means connected to said encoding means for mapping the l-bit output of said encoding means to an element of a predetermined symbol set for transmission by said forward channel transmitter over a forward channel to said forward channel receiver for dynamically and without interruption searching a dynamically changing trellis, and wherein the number of bits per symbol is dynamically changing; and
   c. trellis decoder means connected to said forward channel receiver for dynamically and without interruption searching a dynamically changing trellis, for selecting a trellis path which most closely resembles the received symbol sequence in terms of a cumulative path metric, for providing a decoded bit sequence as an output in response to the selected trellis path and the number of data bits per symbol in each branch of the selected trellis path, and for estimating a reliable data rate as a function of a cumulative path metric of at least one survivor path; and
   d. said trellis decoder means connected to said return channel transmitter for transmitting data rate information to said return channel receiver for use in real time with at least one of said encoding means and said mapping means.

36. The modem of claim 35 wherein the symbols are transmitted at a constant rate.

37. The modem of claim 35, wherein said encoding means comprises an encoder with i coded input bits, where i is less than or equal to j, and j minus i uncoded bits connected directly to said mapper, whereby a trellis structure is constructed with parallel branches between trellis states.

38. The modem of claim 35, further comprising predictor means connected to said trellis decoder means and connected to a return channel for predicting future reliable data rates.

39. The modem of claim 35 further comprising adaptive data transfer means for transferring data between a memory and said encoding means at a dynamically selected one of a plurality of data rates.

40. The modem of claim 39 wherein said adaptive data transfer means comprises:
 a. a first shift register of size J bits where J is a common multiple of the data rates in bits per symbol;
 b. a second shift register of size k bits where k is the highest data rate in bits per symbol;
 c. a first counter, modulo-k with a variable start, for counting from k minus $K_i$ to k bits where $K_i$ is one of a plurality of data rates, and where $K_i$ is less than or equal to k;
 d. a second counter, modulo J-1, for counting from 0 to J-1;
 e. said first shift register connected to said second shift register through a serial data line, to said first counter through a shift control line, to said second counter through a load line and said shift control line, and to an external memory through a data bus of size J bits;
 f. said second shift register being connected to said shift control line and further having k output bits from said second shift register connected to an output;
 g. said first counter being connected to a NAND gate through said first counter's output line, to an external load pulse signal, an external bit clock, and an external data rate word; and
 h. said second counter being connected to said shift control line at said second counter's clock input and to an external memory read line through said second counter's output line.

41. The modem of claim 35, further comprising a memory controller, having:
 a. storage means having limited storage capacity for storing an amount of incoming digital information for delivery to the forward channel transmitter;
 b. monitoring means connected to said storage means for monitoring the amount of information stored in said storage means and producing control signals based on said amount;
 c. control means for controlling the amount of information stored in said storage means by raising the system data rate in response to said control signals when said control signals indicate that overflow of said storage means is imminent and by lowering the system data rate in response to said control signals when said control signals indicate that underflow of said storage means is imminent.

42. The modem of claim 41 wherein said control means controls the occurrence of data rate changes by adjusting rate changing thresholds of the modem as a function of said amount of information stored, whereby the throughput is increased or decreased thereby reducing the need for rate changes to preclude overflow or underflow of said storage means.

43. The modem of claim 41 where said control means raises the system data rate when said amount of information stored exceeds a threshold, NMAX, and lowers the system data rate when said amount of information stored is less than a second threshold, NMIN.

44. The modem of claim 43 wherein said control means further controls the occurrence of data rate changes by adjusting rate changing thresholds of the modem as a function of said amount of information stored, whereby the throughput is increased or decreased thereby reducing the need for rate changes to preclude overflow or underflow of said storage means.

45. The modem of claim 35 further comprising an adaptive phase locked loop for receiving data from said forward channel receiver for achieving synchronization at any of a set of predefined data rates.

46. The modem of claim 45 wherein said adaptive phase locked loop comprises:
 a. a bandpass filter having an input connected to receive data from said forward channel receiver and having an output;
 b. a programmable $M^{th}$ power law device having an input connected to receive the output of said bandpass filter and producing an output therefrom corresponding to the input raised to the $M^{th}$ power;
 c. phase detecting means having a first input connected to the output of said $M^{th}$ power law device and also having an output representing the phase error of the input;
 d. a programmable loop filter having an input connected to the output of said phase detecting means and also having an output representing a filtered version of the input;
 e. a programmable voltage controlled oscillator having an input connected to the output of said programmable loop filter and having an output connected as a second input to said phase detecting means;
 f. a programmable divide-by-M circuit connected to the output of said programmable voltage controlled oscillator providing an output to a demodulator; and
 g. variation means for selecting the value of M and for modifying operating parameters of said programmable loop filter and said voltage controlled oscillator based on the value of said data rate of the received data.

\* \* \* \* \*

UNITED STATES PATENT AND TRADEMARK OFFICE
CERTIFICATE OF CORRECTION

PATENT NO. : 5,541,955

DATED : July 30, 1996

INVENTOR(S) : Jay M. Jacobsmeyer

It is certified that error appears in the above-identified patent and that said Letters Patent is hereby corrected as shown below:

Column 16, line 32, please delete "1/2 ," and insert --1/2,--.

Column 19, line 6, Table 3, after "Preferred" delete "Leng h" and insert --length--.

Column 23, Table 5, Column 5, line 3, delete "000011" and insert --000100--; and Column 23, Table 5, Column 5, line 19, delete "01X011" and insert --01X001--.

Column 38, Table 8, please add an underline to "Bits/Symbol", "Code Rate" and "K".

Column 41, Equation 7, please delete the entire formula and insert therefor:

$$H(f) = 1 + \frac{a}{jf}$$

Column 43-44, Appendix A, line 11, please delete "MINI" and insert --MIN1--;
    line 1, please delete "1" and insert --I--;
    line 12, delete "X(M1N1)" and insert --X(MIN1)--;
    line 22, delete "MINI" and insert --MIN1--;
    Line 26, delete "MINI" and insert --MIN1--;
    Line 28, delete "X(MIN 1)=Y4(MIN 1)-YS" and insert --X(MIN1)=Y4(MIN1)-YS--;
    line 36, delete "CALL SORT (X(L),X(L+1), M1N1)" and insert --CALL SORT (X(L), X(L+1), MIN1);
    Line 42, delete "X(JJ)=Y1 6(J1)-YS" and insert --X(JJ)=Y16(JJ)-YS --;

UNITED STATES PATENT AND TRADEMARK OFFICE
CERTIFICATE OF CORRECTION

PATENT NO. : 5,541,955

DATED : July 30, 1996

INVENTOR(S) : Jay M. Jacobsmeyer

It is certified that error appears in the above-identified patent and that said Letters Patent is hereby corrected as shown below:

Line 44, delete "CALL SORT (X(L), X(L+1), X(L+2), X(L+3), MINI)" and insert --CALL SORT (X(L), X(L+1), X(L+2), X(L+3), MIN1)--.

Column 43-44, Appendix B, line 7, delete "XPRED = 4*X(4)-6X(3)+4*X(2)-X(1)" and insert --XPRED=4*X(4)-6*X(3)+4*X(2)-X(1).

Column 45-46, Appendix C, line 1, after "BUFFER" delete "(L" and insert --(I--.

line 7, after "overflow" delete "wamirig is serit" and insert --warning is sent--;
    line 8, after "underflow" delete "waming is serd" and insert --warning is sent--.
    line 9, after "NMIN" delete "<N <NMAX," and insert --≤N ≤NMAX,--;
    line 11, after "variables" delete "A(1)" and insert --R(I)--;
    line 13, after "the" delete "buff er" and insert --buffer--;
    line 14, after "rate," delete "AMIN" and insert --RMIN--;
    Line 21, change "*WARNING" to --'WARNING--.
    line 21, after "IS" delete "IMMINENT!*" and insert --IMMINENT!'--;
    line 29, change "*Warning" to --'WARNING--;
    line 29, after "IS" delete "IMMINENT!*" and insert --IMMINENT!'--;

UNITED STATES PATENT AND TRADEMARK OFFICE
CERTIFICATE OF CORRECTION

PATENT NO.  : 5,541,955

DATED       : July 30, 1996

INVENTOR(S) : Jay M. Jacobsmeyer

It is certified that error appears in the above-identified patent and that said Letters Patent is hereby corrected as shown below:

Column 43-44, Appendix A, lines 22, 25, 32, and 40, delete "1" and insert --I--;

Column 43-44, Appendix B, lines 8 and 9, delete "1" and insert --I--;
    line 9, delete "i" and insert --I--.

Column 45-46, Appendix C, lines 8 and 9, delete "1/0" and insert --I/O--;
    line 14, delete "1" and insert --I--.

Signed and Sealed this

Seventeenth Day of February, 1998

Attest:

BRUCE LEHMAN

*Attesting Officer*        *Commissioner of Patents and Trademarks*